(12) United States Patent
Yamamoto et al.

(10) Patent No.: US 10,902,969 B2
(45) Date of Patent: Jan. 26, 2021

(54) ORGANIC SEMICONDUCTOR COMPOSITION, ORGANIC SEMICONDUCTOR FILM, ORGANIC THIN FILM TRANSISTOR, AND METHOD OF MANUFACTURING ORGANIC THIN FILM TRANSISTOR

(71) Applicant: FUJIFILM Corporation, Tokyo (JP)

(72) Inventors: Yosuke Yamamoto, Kanagawa (JP); Fumiko Tamakuni, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/978,639

(22) Filed: May 14, 2018

(65) Prior Publication Data

US 2018/0261770 A1 Sep. 13, 2018

Related U.S. Application Data

(63) Continuation of application No. PCT/JP2016/083856, filed on Nov. 15, 2016.

(30) Foreign Application Priority Data

Nov. 20, 2015 (JP) ................................. 2015-227900

(51) Int. Cl.
*H01B 1/12* (2006.01)
*H01L 51/00* (2006.01)
(Continued)

(52) U.S. Cl.
CPC ............... *H01B 1/12* (2013.01); *C08G 61/12* (2013.01); *C08G 61/126* (2013.01); *C08K 5/45* (2013.01); *C08L 65/00* (2013.01); *C09D 165/00* (2013.01); *H01L 29/786* (2013.01); *H01L 51/0036* (2013.01); *H01L 51/0043* (2013.01); *H01L 51/05* (2013.01); *C08G 2261/124* (2013.01); *C08G 2261/148* (2013.01); *C08G 2261/1412* (2013.01); *C08G 2261/1424* (2013.01); *C08G 2261/18* (2013.01); *C08G 2261/228* (2013.01); *C08G 2261/314* (2013.01); *C08G 2261/3223* (2013.01); *C08G 2261/3225* (2013.01); *C08G 2261/3241* (2013.01); *C08G 2261/3243* (2013.01); *C08G 2261/3244* (2013.01); *C08G 2261/3246* (2013.01); *C08G 2261/334* (2013.01); *C08G 2261/344* (2013.01);
(Continued)

(58) Field of Classification Search
CPC .......... H01B 1/12; H01B 1/124; H01B 1/127; H01B 1/128; H01B 1/20; H01L 51/0032; H01L 51/0034; H01L 51/0035; H01L 51/0036; H01L 51/0037; H01L 51/0043; H01L 51/0071; H01L 51/0072; H01L 51/0073; H01L 51/0074; H01L 51/51; C08G 61/00; C08G 61/12; C08G 61/126; C08G 2661/124; C08G 2261/1412; C08G 2261/1424; C08G 2261/148; C08G 2261/18; C08G 2261/228; C08G 2261/314; C08G 2261/3221; C08G 2261/3666; C08G 2261/3223; C08G 2261/3225; C08G 2261/3241; C08G 2261/3242; C08G 2261/3243; C08G 2261/3244; C08G 2261/3246; C08G 2261/414; C08G 2261/92; C08K 5/45
See application file for complete search history.

(56) References Cited

U.S. PATENT DOCUMENTS 7,932,344 B2 * 4/2011 Li ........................... C08G 61/12
257/40
8,367,717 B2 * 2/2013 Kastler .................. C09K 11/06
514/443
(Continued)

FOREIGN PATENT DOCUMENTS

EP 2 251 342 A1 11/2010
EP 2 301 921 A1 3/2011
(Continued)

OTHER PUBLICATIONS

English language machine translation of Watanabe et al. (JP 2012-209329 A). (Year: 2012).*
International Search Report issued in PCT/JP2016/083856; dated Jan. 17, 2017.
Written Opinion issued in PCT/JP2016/083856; dated Jan. 17, 2017.
(Continued)

*Primary Examiner* — Matthew R Diaz
(74) *Attorney, Agent, or Firm* — Studebaker & Brackett PC

(57) ABSTRACT

An object of the present invention is to provide an organic semiconductor composition that may form an organic thin film transistor having excellent hysteresis characteristics while high carrier mobility is maintained. Another object of the present invention is to provide an organic semiconductor film, an organic thin film transistor, and a method of manufacturing an organic thin film transistor. An organic semiconductor composition according to the present invention includes: a compound X having a molecular weight of 2,000 or greater and having a repeating unit represented by Formula (1); and a low molecular weight compound Y represented by Formula (2).

8 Claims, 1 Drawing Sheet

(51) Int. Cl.
  *C08G 61/12* (2006.01)
  *C08K 5/45* (2006.01)
  *H01L 51/05* (2006.01)
  *C08L 65/00* (2006.01)
  *H01L 29/786* (2006.01)
  *C09D 165/00* (2006.01)

(52) U.S. Cl.
  CPC ... *C08G 2261/41* (2013.01); *C08G 2261/414* (2013.01); *C08G 2261/92* (2013.01); *H01L 51/0003* (2013.01)

(56) References Cited

U.S. PATENT DOCUMENTS

| | | | |
|---|---|---|---|
| 8,629,238 B2* | 1/2014 | Dueggeli | C08G 61/124 528/377 |
| 2007/0228359 A1 | 10/2007 | Heim et al. | |
| 2010/0099840 A1 | 4/2010 | Moon et al. | |
| 2010/0283047 A1 | 11/2010 | Facchetti et al. | |
| 2010/0297405 A1 | 11/2010 | Flores et al. | |
| 2011/0049485 A1 | 3/2011 | Kim et al. | |
| 2011/0108813 A1 | 5/2011 | Kohiro et al. | |
| 2011/0127512 A1 | 6/2011 | Goto et al. | |
| 2011/0155248 A1* | 6/2011 | Kastler | C07D 495/22 136/263 |
| 2011/0253944 A1 | 10/2011 | Han et al. | |
| 2013/0140548 A1 | 6/2013 | Kohiro et al. | |
| 2013/0256604 A1 | 10/2013 | Blouin et al. | |
| 2013/0284984 A1* | 10/2013 | Newsome | H01L 51/0005 252/500 |
| 2014/0001411 A1 | 1/2014 | Blouin et al. | |
| 2014/0299871 A1 | 10/2014 | Bujard et al. | |
| 2016/0104842 A1 | 4/2016 | Takeya et al. | |
| 2017/0025613 A1 | 1/2017 | Kanesaka et al. | |
| 2017/0110665 A1 | 4/2017 | Kanesaka et al. | |
| 2017/0229655 A1 | 8/2017 | Kitamura | |
| 2018/0006229 A1 | 1/2018 | Kitamura et al. | |

FOREIGN PATENT DOCUMENTS

| | | |
|---|---|---|
| EP | 2 301 926 A1 | 3/2011 |
| EP | 3208273 A1 | 8/2017 |
| JP | 2007-516315 A | 6/2007 |
| JP | 2009-267372 A | 11/2009 |
| JP | 2010-018790 A | 1/2010 |
| JP | 2010-527327 A | 8/2010 |
| JP | 2011-501451 A | 1/2011 |
| JP | 2011-046687 A | 3/2011 |
| JP | 2011-514399 A | 5/2011 |
| JP | 2011-514913 A | 5/2011 |
| JP | 2011-526588 A | 10/2011 |
| JP | 2012-039103 A | 2/2012 |
| JP | 2012-513459 A | 6/2012 |
| JP | 2012209329 A * | 10/2012 |
| JP | 2013-161828 A | 8/2013 |
| JP | 2013-207085 A | 10/2013 |
| JP | 2014-507488 A | 3/2014 |
| JP | 2014-515043 A | 6/2014 |
| JP | 2015-050231 A | 3/2015 |
| JP | 2015-507840 A | 3/2015 |
| KR | 10-2012-0120886 A | 11/2012 |
| WO | 2010/136353 A1 | 12/2010 |
| WO | WO-2010136353 A1 * | 12/2010 ............ C08G 61/124 |
| WO | 2012/174561 A2 | 12/2012 |
| WO | 2014/175351 A1 | 10/2014 |
| WO | 2015/163206 A1 | 10/2015 |
| WO | 2015/163207 A1 | 10/2015 |
| WO | 2016/076198 A1 | 5/2016 |
| WO | 2016/084730 A1 | 6/2016 |
| WO | 2016/148169 A1 | 9/2016 |

OTHER PUBLICATIONS

John S. Zambounis et al.; "Synthesis, Properties, and Metallic Cation Radical Salts of a New Class of Electron π-Donors: 2,7-Disubstituted Naphtho[1,8-de:5,4-d'e']bis[1,3]thiazines"; Journal of American Chemical Society; 1994; p. 925; vol. 116, No. 3.

J. S. Whitehurst; "Substitution Reactions of the Naphthylenediamines"; Journal of the Chemical Society; 1951; p. 221.

Zhengguo Zhu et al.; "Conjugated Polymers Containing 2,3-Dialkoxybenzene and Iptycene Building Blocks"; Organic Letters; 2001; p. 3471; vol. 3, No. 22.

Ralph Rieger et al.; "Tetrathiahexacene as Building Block for Solution-Processable Semiconducting Polymers: Exploring the Monomer Size Limit"; Macromolecules; 2010; pp. 6264-6267; vol. 43, No. 15.

K. Prasanna U. Perera et al.; "Synthesis and Thermal Cyclopolymerization of Heterocycle Containing bis-ortho-diynyl arenes"; Tetrahedron; 2002; p. 10197; vol. 58.

M. Akram Khan; "The Synthesis and Regioselectivity of Elimination of Some 1,3-Difunctional Sulphoxides"; Journal of Chemical Research: miniprint; Mar. 1991; pp. 601-635; Issue 3.

Muhammad Akram Khan; "The Claisen Rearrangement of 2-Phenylsulfinyl-2-propenyl Phenyl Ethers—A New Route to Functionalized Phenols and 2-Methylbenzofurans"; Bull. Chem. Soc. Japan; Dec. 1991; pp. 3682-3686; vol. 64, No. 12.

Jacob W. Ciszek et al.; "Synthesis of Ladder Polyaromatics as New Molecular Device Candidates"; Tetrahedron Letters; 2004; pp. 2801-2803; vol. 45.

Annamária Molnár et al.; "Ring Transformation of Unsaturated N-Bridgehead Fused Pyrimidin-4(3H)-ones: Role of Repulsive Electrostatic Nonbonded Interaction"; The Journal of Organic Chemistry; 2011; p. 696; vol. 76, No. 2.

Christian Ruzié et al.; "Synthesis of 1,6-, 2,7-, 3,8-, and 4,9-Isomers of Didodecyl[1]benzothieno[3,2-b][1]benzothiophenes"; The Journal of Organic Chemistry; 2013; p. 7741; vol. 78.

Peng-Yi Huang et al.; "Enhanced Performance of Benzothieno[3,2-b]thiophene (BTT)-Based Bottom-Contact Thin-Film Transistors"; Chemistry a European Journal; 2013; p. 3721; vol. 19.

Shoji Kajigaeshi et al.; "Halogenation Using Quaternary Ammonium Polyhalides. IV. Selective Bromination of Phenols by Use of Tetraalkylammonium Tribromides"; Bull. Chem. Soc. Japan; Nov. 1987; p. 4187; vol. 60, No. 11.

Shoji Shinamura et al.; "Linear- and Angular-Shaped Naphthodithiophenes: Selective Synthesis, Properties, and Application to Organic Field-Effect Transistors"; Journal of the American Chemical Society; Mar. 9, 2011; p. 5024; vol. 133.

Atefeh Y. Amin et al.; "Low-Voltage Organic Field Effect Transistors with a 2-Tridecyl[1]benzothieno[3,2-b][1]benzothiophene Semiconductor Layer"; Journal of the American Chemical Society; Sep. 25, 2012; pp. 16548-16550; vol. 134.

Qinghe Wu et al.; "Thieno[3,4-c]pyrrole-4,6-dione Containing Copolymers for High Performance Field-Effect Transistors"; Macromolecules; May 7, 2013; p. 3887; vol. 46.

Dae Won Cho et al.; "Studies Aimed at Elucidating Factors Involved in the Control of Chemoselectivity in Single Electron Transfer Promoted Photoreactions of Branched-polydonor Substituted Phthalimides"; Tetrahedron; Feb. 2010; p. 3173; vol. 66.

Zhonglian Wu et al.; "Low-band Gap Copolymers of Ethynylfluorene and 3,6-dithiophen-2-yl-2,5-dihydropyrrolo[3,4-c]pyrrole-1,4-dione Synthesized Under Microwave Irradiation for Polymer Photovoltaic Cells"; Organic Electronics; 2011; p. 993; vol. 12.

Extended European Search Report issued by the European Patent Office dated Oct. 30, 2018, which corresponds to EP16866321.9-1102 and is related to U.S. Appl. No. 15/978,639.

* cited by examiner

ORGANIC SEMICONDUCTOR COMPOSITION, ORGANIC SEMICONDUCTOR FILM, ORGANIC THIN FILM TRANSISTOR, AND METHOD OF MANUFACTURING ORGANIC THIN FILM TRANSISTOR

CROSS-REFERENCE TO RELATED APPLICATIONS

This application is a Continuation of PCT International Application No. PCT/JP2016/083856 filed on Nov. 15, 2016, which claims priority under 35 U.S.C. § 119(a) to Japanese Patent Application No. 2015-227900 filed on Nov. 20, 2015. The above application is hereby expressly incorporated by reference, in its entirety, into the present application.

BACKGROUND OF THE INVENTION

1. Field of the Invention

The present invention relates to an organic semiconductor composition, an organic semiconductor film, an organic thin film transistor, and a method of manufacturing an organic thin film transistor.

2. Description of the Related Art

Since light weight, low cost, and flexibility can be obtained, an organic thin film transistor (organic TFT) having an organic semiconductor film (organic semiconductor layer) is used in a device using a logic circuit such as a field effect transistor (FET), a radio frequency identifier (RFID: RF tag), and a memory used in a liquid crystal display or an organic electro luminescence (EL) display.

As the compound for forming such an organic semiconductor film, for example, JP2009-267372A and JP2012-39103A disclose an organic semiconductor composition containing a polymer compound having carrier transporting properties and a low molecular weight compound.

SUMMARY OF THE INVENTION

Recently, since further improvement of the performance of the organic thin film transistor is required, there is required an organic thin film transistor having excellent hysteresis characteristics (voltage controllability) while a decrease in carrier mobility is suppressed.

In these circumstances, the present inventors have manufactured an organic thin film transistor by using the organic semiconductor composition disclosed in JP2009-267372A and JP2012-39103A so as to find that particularly hysteresis characteristics decrease.

Here, an object of the present invention is to provide an organic semiconductor composition that may form an organic thin film transistor having excellent hysteresis characteristics while high carrier mobility is maintained. Another object of the present invention is to provide an organic semiconductor film, an organic thin film transistor, and a method of manufacturing an organic thin film transistor.

The present inventors diligently conducted research on the above objects and have found that a desired effect may be obtained by using an organic semiconductor composition in which a compound X having a predetermined structure and a compound Y having a predetermined structure are used together, so as to conceive the present invention.

That is, the present inventors have found that the aforementioned objects may be achieved with the following configurations.

[1] An organic semiconductor composition comprising: a compound X having a molecular weight of 2,000 or greater and having a repeating unit represented by Formula (1); and a compound Y represented by Formula (2), A in Formula (1) is a group having at least one structure selected from the group consisting of structures represented by Formulae (A-1) to (A-9), as a partial structure, and D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure, in Formulae (A-1) to (A-9), X's each independently represent an O atom, a S atom, a Se atom, or $NR^{A1}$, Y's each independently represent an O atom or a S atom, $Z_a$'s each independently represent $CR^{A2}$ or a N atom, W's each independently represent $C(R^{A2})_2$, $NR^{A1}$, a N atom, $CR^{A2}$, an O atom, a S atom, or a Se atom, $R^{A1}$'s each independently represent an alkyl group that may contain at least one of —O—, —S—, or —$NR^{A3}$—, a monovalent group represented by Formula (1-1), or a bonding site to another structure, $R^{A2}$'s each independently represent a hydrogen atom, a halogen atom, an alkyl group that may contain at least one of —O—, —S—, or —$NR^{A3}$—, or a bonding site to another structure, $R^{A3}$'s each independently represent a hydrogen atom or a substituent, and

*'s each independently represent a bonding site to another structure, in Formula (1-1), Ar represents an aromatic heterocyclic group or an aromatic hydrocarbon group having 5 to 18 carbon atoms, $L_a$ represents an alkylene group having 1 to 20 carbon atoms that may include at least one of —O—, —S—, or —$NR^{1S}$—, $L_b$ represents an alkyl group having 1 to 100 carbon atoms that may include at least one of —O—, —S—, or —$NR^{2S}$—, $R^{1S}$ and $R^{2S}$ each independently represent a hydrogen atom or a substituent, l represents an integer of 1 to 5, and in a case where l is 2 or greater, a plurality of $L_b$'s may be identical to as or different from each other, and

* represents a bonding site to another structure, in Formula (2), A, B, and C each independently represent a ring structure selected from a benzene ring, a 6-membered heterocyclic ring, a 5-membered heterocyclic ring, and a cyclopentadiene ring, and adjacent rings may be fused with each other, n represents an integer of 2 to 8, a plurality of A's may be identical to each other, and at least one of the plurality of A's represents a 5-membered heterocyclic ring, $R^1$ and $R^2$ each independently represent a monovalent group selected from the group consisting of a saturated hydrocarbon group that may include at least one of —O—, —S—, or —$NR^B$—, an unsaturated hydrocarbon group that may include at least one of —O—, —S—, or —$NR^C$—, an aryl group, a heteroaryl group, an alkoxy group, an amino group, a carbonyl group, an ester group, a nitro group, a hydroxy group, a cyano group, an aryl alkyl group, a heteroaryl alkyl group, an aryloxy group, a heteroaryloxy group, an alkylsilyl group, and a halogen atom, $R^B$'s each independently represent a hydrogen atom or a substituent, and $R^C$'s each independently represent a hydrogen atom or a substituent, and s and t each independently represent an integer of 0 to 4.

[2] The organic semiconductor composition according to [1], in which D in Formula (1) is a structure represented by Formula (D-1), in Formula (D-1), X"s each independently represent an O atom, a S atom, a Se atom, or $NR^{D1}$, and $R^{D1}$'s each independently represent a monovalent organic group that may be the monovalent group represented by Formula (1-1), $Z_d$'s each independently represent a N atom or $CR^{D2}$, and $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may include at least one of —O—, —S—, or —$NR^{D3}$— or the monovalent group represented by Formula (1-1), and $R^{D3}$'s each independently represent a hydrogen atom or a substituent, p and q each independently represent an integer of 0 to 4, and

*'s each independently represent a bonding site to another structure.

[3] The organic semiconductor composition according to [1] or [2], in which the repeating unit represented by Formula (1) is a repeating unit represented by any one of Formulae (3) to (5), in Formulae (3) to (5), X's each independently represent an O atom, a S atom, a Se atom, or $NR^{41}$, $R^{41}$'s each independently represent an alkyl group that may contain at least one of —O—, —S—, or —$NR^{43}$—, the monovalent group represented by Formula (1-1), or a bonding site to another structure, Y's each independently represent an O atom or a S atom, $Z_a$'s each independently represent $CR^{42}$ or a N atom, and $R^{42}$'s each independently represent a hydrogen atom, a halogen atom, an alkyl group that may contain at least one of —O—, —S—, or —$NR^{43}$—, or a bonding site to another structure, $R^{43}$'s each independently represent a hydrogen atom or a substituent, X"s each independently represent O, S, Se, or $NR^{D1}$, and $R^{D1}$'s each independently represent a monovalent organic group that may be the monovalent group represented by Formula (1-1), $Z_d$'s each independently represent N or $CR^{D2}$, and $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may include at least one of —O—, —S—, or —$NR^{D3}$— or the monovalent group represented by Formula (1-1), and $R^{D3}$'s each independently represent a hydrogen atom or a substituent, p and q each independently represent an integer of 0 to 4.

[4] The organic semiconductor composition according to any one of [1] to [3], in which the repeating unit represented by Formula (1) is a repeating unit represented by Formula (6), in Formula (6), $R^{41}$'s each independently represent an alkyl group that may contain at least one of —O—, —S—, or —$NR^{43}$—, the monovalent group represented by Formula (1-1), or a bonding site to another structure, and $R^{43}$'s each independently represent a hydrogen atom or a substituent, X"s each independently represent O, S, Se, or $NR^{D1}$, and $R^{D1}$'s each independently represent a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may include at least one of —O—, —S—, or —$NR^{D3}$— or the monovalent group represented by Formula (1-1), and $R^{D3}$'s each independently represent a hydrogen atom or a substituent, and p and q each independently represent an integer of 0 to 4.

[5] The organic semiconductor composition according to any one of [1] to [4], in which the compound Y has a structure represented by Formula (2A) as a partial structure, in Formula (2A), $R^{21}$ to $R^{26}$ each independently represent a hydrogen atom or a substituent, adjacent groups in $R^{21}$ to $R^{26}$ are bonded to each other to form an aromatic hydrocarbon ring or an aromatic heterocyclic ring, in this case, the aromatic hydrocarbon ring or the aromatic heterocyclic ring may be further fused with an aromatic hydrocarbon ring or an aromatic heterocyclic ring, and here, at least one set of adjacent groups in $R^{21}$ to $R^{24}$ may be bonded to each other, to form an aromatic hydrocarbon ring or an aromatic heterocyclic ring.

[6] The organic semiconductor composition according to any one of [1] to [4], in which the compound Y is a compound represented by Formula (2B), in Formula (2B), A1, A2, A3, B1, and C1 each independently represent a benzene ring or a thiophene ring, and adjacent rings are fused with each other, among A1, A2, A3, B1, and C1, 2 to 4 rings are thiophene rings, and a ring other than a thiophene ring is a benzene ring, here, at least one of A1, A2, or A3 is a thiophene ring, $R^1$ and $R^2$ each independently represent a monovalent group selected from the group consisting of a saturated hydrocarbon group that may include at least one of —O—, —S—, or —$NR^B$—, an unsaturated hydrocarbon group that may include at least one of —O—, —S—, or —$NR^C$—, an aryl group, a heteroaryl group, an alkoxy group, an amino group, a carbonyl group, an ester group, a nitro group, a hydroxy group, a cyano group, an aryl alkyl group, a heteroaryl alkyl group, an aryloxy group, a heteroaryloxy group, an alkylsilyl group, and a halogen atom, $R^B$'s each independently represent a hydrogen atom or a substituent, and $R^C$'s each independently represent a hydrogen atom or a substituent, and s and t each independently represent an integer of 0 to 4.

[7] The organic semiconductor composition according to [6], in which, in A1, A2, A3, B1, and C1 in Formula (2B), 3 to 4 rings are thiophene rings, and a linking number of thiophene rings is 2 or less.

[8] The organic semiconductor composition according to any one of [1] to [7], in which the content of the compound Y is 100 parts by mass or less with respect to 100 parts by mass of the compound X.

[9] An organic semiconductor film manufactured by using the organic semiconductor composition according to any one of [1] to [8].

[10] An organic thin film transistor comprising: the organic semiconductor film according to [9].

[11] A method of manufacturing an organic thin film transistor, comprising: a step of applying the organic semiconductor composition according to any one of [1] to [8] to form an organic semiconductor film.

According to the present invention, it is possible to provide an organic semiconductor composition that may form an organic thin film transistor having excellent hysteresis characteristics while high carrier mobility is maintained. According to the present invention, it is possible to provide an organic semiconductor film, an organic thin film transistor, and a method of manufacturing an organic thin film transistor.

DESCRIPTION OF THE PREFERRED EMBODIMENTS

Figure 1:
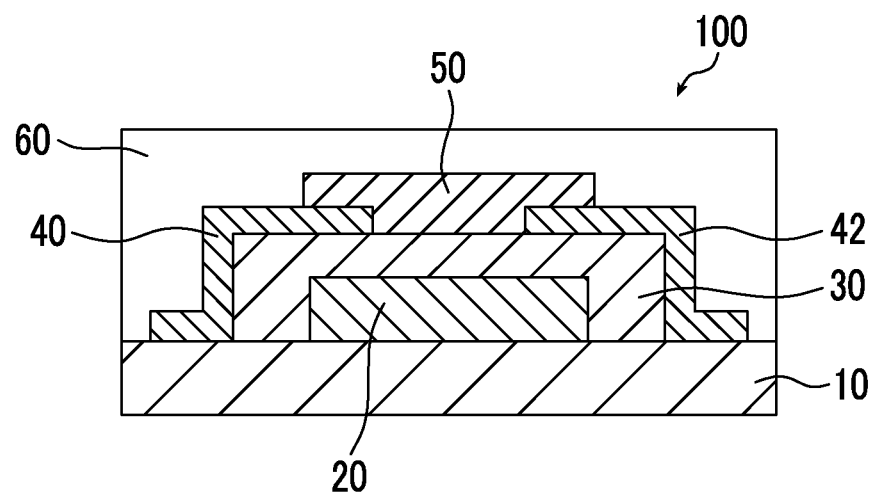
FIG. 1 is a schematic cross-sectional view of a bottom contact type organic thin film transistor according to an embodiment of the present invention.

Hereinafter, the present invention is described. The following description of components may be made based on a representative embodiment of the present invention, but the present invention is not limited to the embodiment.

In the present specification, the definition of the compound is used in the meaning of including salts thereof and ions thereof, in addition to the compound itself.

In the present specification, in a case where a plurality of substituents, linking groups, or the like (hereinafter, referred to as substituents or the like) represented by a specific reference numeral are present, or in a case where a plurality of substituents or the like are defined at the same time, this means that the respective substituents or the like may be identical to or different from each other. The same is also applied to the definition of the number of substituents or the like.

Unless described otherwise, in a case where a plurality of substituents or the like are near to each other (particularly, adjacent to each other), this means that the substituents or the like are linked to each other or fused to each other to form a ring.

In the present specification, substituents or the like in which substitution and unsubstitution are not defined mean the substituents or the like may further have a substituent without deteriorating the desired effect. The same is applied to a compound in which substitution or unsubstitution is not defined.

According to the present specification, the numerical range expressed by using "to" means a range including numerical values described before and after "to" as a lower limit value and an upper limit value.

[Organic Semiconductor Composition]

An organic semiconductor composition according to the present invention includes a compound X having a molecular weight of 2,000 or greater and having a repeating unit represented by Formula (1) and a compound Y represented by Formula (2).

In this manner, it is possible to manufacture an organic thin film transistor having excellent hysteresis characteristics while high carrier mobility is maintained, by using a compound X (hereinafter, referred to as a "specific polymer compound") having a molecular weight of 2,000 or greater and having a repeating unit represented by Formula (1) and a compound Y (hereinafter, referred to as a "specific low molecular weight compound") represented by Formula (2).

Details of the Reason have not been Still Clarified, the Following Reasons are Assumed.

The specific polymer compound has a main chain skeleton formed of an electron donor unit and an electron acceptor unit, that is, a kind of a so-called D-A-type polymer. It is considered that, in a case where this D-A-type polymer is crystallized, satisfactory alignment properties are exhibited, but alignment properties are further improved by using a specific low molecular weight compound together. That is, it is considered that, in a case where the specific polymer compound and the specific low molecular weight compound are used, the specific low molecular weight compound easily enters the gaps of the specific polymer compound, and the crystallinity and the arrangement property of the specific polymer compound are improved.

Accordingly, it is assumed that the charge injection at the interface between the organic semiconductor film (organic semiconductor layer) and the source electrode and the drain electrode can be performed smoothly, and thus excellent hysteresis (voltage controllability) becomes excellent while high mobility is maintained.

For the reason described above, it is assumed that the organic thin film transistor including an organic semiconductor layer formed by using the organic semiconductor composition of the present invention exhibits excellent characteristics with respect to the threshold voltage.

In a case where only the low molecular weight compound is used, there is a tendency in that a liquid crystal structure of the organic semiconductor layer easily breaks, but in a case where the specific polymer compound is used, the organic semiconductor layer is hardly affected by defects caused by heating. Therefore, it is assumed that the organic thin film transistor including an organic semiconductor layer formed by using the organic semiconductor composition of the present invention may suppress the decrease of the carrier mobility before and after the heating and exhibits satisfactory heat resistance.

Hereinafter, components that are included or that may be included in the organic semiconductor composition of the present invention are described.

<Specific Polymer Compound (Compound X)>

The organic semiconductor composition of the present invention contains a specific polymer compound. As described above, the specific polymer compound is the compound X which has a molecular weight of 2,000 or greater and has a repeating unit represented by Formula (1).

The specific polymer compound is a kind of the organic semiconductor compound and has carrier transporting properties.

$$-(D-A)- \qquad (1)$$

A in Formula (1) represents an electron acceptor unit, and is a group having at least one structure selected from the group consisting of structures represented by Formulae (A-1) to (A-9), as a partial structure.

D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure.

(Electron Acceptor Unit ("A" in Formula (1)))

In Formula (1), A preferably has at least one structure selected from the group consisting of structures represented by Formulae (A-1) to (A-9) as a partial structure and more preferably has a structure represented by at least one selected from the group consisting of Formulae (A-1) to (A-9).

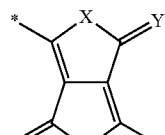
(A-1)

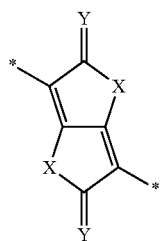
(A-2)

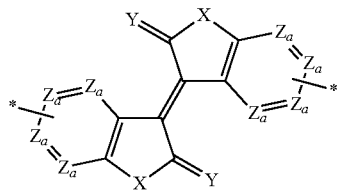
(A-3)

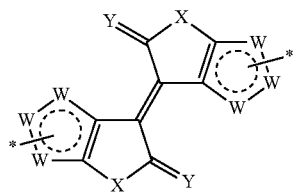
(A-4)

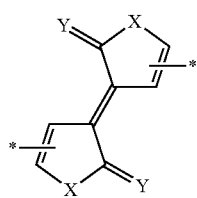
(A-5)

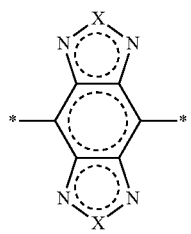
(A-6)

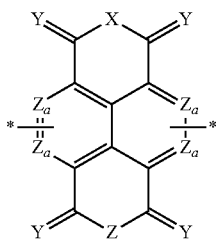
(A-7)

(A-8)

(A-9)

In Formulae (A-1) to (A-9), X's each independently represent an O atom, a S atom, a Se atom, or $NR^{41}$. Y's each independently represent an O atom or a S atom. $Z_a$'s each independently represent $CR^{42}$ or a N atom. W's each independently represent $C(R^{42})_2$, $NR^{41}$, a N atom, $CR^{42}$, an O atom, a S atom, or a Se atom, $R^{41}$'s each independently represent an alkyl group that may contain at least one of —O—, —S—, or —$NR^{43}$—, a monovalent group represented by Formula (1-1), or a bonding site to another structure. $R^{42}$'s each independently represent a hydrogen atom, a halogen atom, an alkyl group that may contain at least one of —O—, —S—, or —$NR^{43}$—, and the monovalent group represented by Formula (1-1), or a bonding site to another structure. $R^{43}$'s each independently represent a hydrogen atom or a substituent. *'s each independently represent a bonding site to another structure.

In Formulae (A-3) and (A-7), in each of the two ring structures including Za, one of Za's is $CR^{42}$, and $R^{42}$ represents a bonding site to another structure. This bonding site to another structure corresponds to * in the formula. Specifically, a bond (hereinafter, simply referred to as a "bond") in which * that represents a bonding site to another structure is positioned at a terminal elongates from any one of Za's in each formula, and Za from which this bond elongates is $CR^{42}$ and corresponds to an aspect in which $R^{42}$ represents a bonding site to another structure.

In Formula (A-8), two Za's are $CR^{42}$, and $R^{42}$ represents a bonding site to another structure. This bonding site to another structure corresponds to * in the formula.

In Formula (A-4), in each of the two ring structures including W's, one of W's represents at least one of the three following aspects.

Aspect 1: W represents $CR^{42}$, and $R^{42}$ represents a bonding site to another structure.

Aspect 2: W represents $NR^{41}$, and $R^{41}$ represents a bonding site to another structure.

Aspect 3: W represents $C(R^{42})_2$ and any one of $R^{42}$'s represents a bonding site to another structure.

$$*-L_a-\text{Ar}-(L_b)_l \quad (1\text{-}1)$$

In Formula (1-1), Ar represents an aromatic heterocyclic group or an aromatic hydrocarbon group having 5 to 18 carbon atoms. $L_a$ represents an alkylene group having 1 to 20 carbon atoms that may include at least one of —O—, —S—, or —$NR^{1S}$—. $L_b$ represents an alkyl group having 1 to 100 carbon atoms that may include at least one of —O—, —S—, or —$NR^{2S}$—. $R^{1S}$ and $R^{2S}$ each independently represent a hydrogen atom or a substituent. l represents an integer of 1 to 5. In a case where l is 2 or greater, a plurality of $L_b$'s may be identical to as or different from each other. * represents a bonding site to another structure.

In Formulae (A-1) to (A-9), X's each independently represent an O atom, a S atom, a Se atom, or $NR^{41}$, and a S atom or $NR^{41}$ is preferable.

Y's each independently represent an O atom or a S atom, and an O atom is preferable.

$Z_a$'s each independently represent $CR^{42}$ or a N atom, and $CR^{42}$ is preferable.

W's each independently represent $C(R^{42})_2$, $NR^{41}$, a N atom, $CR^{42}$, an O atom, a S atom, or a Se atom, and $C(R^{42})_2$, $CR^{42}$, or a S atom is preferable.

$R^{41}$'s each independently represent an alkyl group that may contain at least one of —O—, —S—, or —$NR^{43}$—, the monovalent group represented by Formula (1-1), or a bonding site to another structure, and an alkyl group that may contain at least one of —O—, —S—, or —$NR^{43}$— and the monovalent group represented by Formula (1-1) are preferable.

In a case where $R^{41}$ represents an alkyl group that may contain at least one of —O—, —S—, or —$NR^{43}$—, an alkyl group having 2 to 30 carbon atoms is preferable, and an alkyl group having 8 to 25 carbon atoms is more preferable. The alkyl group may have a linear shape or a branched shape.

A bonding site to another structure in $R^{41}$ is a bonding site to another structure represented by * in Formulae (A-1) to (A-9).

$R^{42}$ each independently represent an alkyl group that may contain at least one of —O—, —S—, or —$NR^{43}$—, a hydrogen atom, a halogen atom, the monovalent group represented by Formula (1-1), or a bonding site to another structure, and a hydrogen atom or a bonding site to another structure is preferable.

In a case where $R^{42}$ represents an alkyl group that may contain at least one of —O—, —S—, or —$NR^{43}$—, an alkyl group having 2 to 30 carbon atoms is preferable, and an alkyl group having 8 to 25 carbon atoms is more preferable. The alkyl group may have a linear shape or a branched shape.

In a case where $R^{42}$ represents a halogen atom, a F atom, a Cl atom, a Br atom, or an I atom is preferable, and a F atom is more preferable.

A bonding site to another structure in $R^{42}$ is a bonding site to another structure represented by * in Formulae (A-1) to (A-9).

$R^{43}$'s each independently represent a hydrogen atom or a substituent. The substituent in $R^{43}$ has the same meaning as the substituents in $R^{1S}$ and $R^{2S}$ described below.

In Formula (1-1), Ar represents an aromatic heterocyclic group or an aromatic hydrocarbon group having 5 to 18 carbon atoms.

Examples of the aromatic hydrocarbon group having 5 to 18 carbon atoms in Ar include a benzene ring group, a biphenyl group, a naphthalene ring group, and a group obtained by removing two or more hydrogen atoms from aromatic hydrocarbon (for example, a fluorene ring) in which three rings are fused. Among these, since the carrier mobility becomes excellent, a benzene ring group, a biphenyl group, or a naphthalene ring group is preferable, and a benzene ring group is preferable.

The aromatic heterocyclic group in Ar may be a single ring or may have a fused ring structure of two or more rings. However, since the carrier mobility becomes excellent, the aromatic heterocyclic group is preferably a single ring. The aromatic heterocyclic group in Ar is preferably a 5-membered to 7-membered ring. The hetero atom included in the aromatic heterocyclic group is preferably a N atom, an O atom, a S atom, or a Se atom and more preferably a S atom.

$L_a$ represents an alkylene group having 1 to 20 carbon atoms that may include at least one of —O—, —S—, or —$NR^{1S}$—. Here, the expression that the alkylene group includes —O— means the case where —O— is introduced in the middle of the carbon-carbon bond of the alkylene group or the case where —O— is introduced at one terminal or both terminals of the alkylene group. The same meaning also applies in a case where the alkylene group includes —S— or —$NR^{1S}$—.

An alkylene group that is represented by $L_a$ may have any one of a linear shape, a branched shape, or a cyclic shape, but is preferably a linear or branched alkylene group.

The number of carbon atoms in the alkylene group represented by $L_a$ is 1 to 20. However, since the carrier mobility becomes excellent, but the number of carbon atoms is preferably 1 to 15 and more preferably 1 to 10.

In the case where the alkylene group represented by $L_a$ has a branched shape, the number of carbon atoms in the branched portion is included in the number of carbon atoms of the alkylene group represented by $L_a$. However, in a case where $L_a$ contains —$NR^{1S}$— and this $R^{1S}$ includes a carbon atom, the number of carbon atoms in $R^{1S}$ is not included in the number of carbon atoms in the alkylene group represented by $L_a$.

$L_b$ represents an alkyl group having 1 to 100 carbon atoms that may include at least one of —O—, —S—, or —$NR^{2S}$—. Here, the expression that the alkyl group includes —O— means the case where —O— is introduced in the middle of the carbon-carbon bond of the alkyl group or the case where —O— is introduced to one terminal (that is, a portion connected to "Ar" above) of the alkyl group. The same meaning also applies in a case where the alkyl group includes —S— or —$NR^{2S}$—.

An alkyl group that is represented by $L_b$ may have any one of a linear shape, a branched shape, or a cyclic shape, but in view of excellent carrier mobility and excellent temporal stability under high temperature and high humidity, a linear or branched alkyl group is preferable, and a branched chain alkyl group is more preferable. The alkyl group represented by $L_b$ may be a halogenated alkyl group having a halogen atom (preferably a F atom, a Cl atom, a Br atom, and an I atom, and more preferably a F atom) as a substituent.

The number of carbon atoms in the alkyl group represented by $L_b$ is 1 to 100 and preferably 9 to 100.

Since carrier mobility becomes excellent, the number of carbon atoms of at least one $L_b$ in $-(L_b)_l$ in Formula (1-1) is preferably 9 to 100, more preferably 20 to 100, and even more preferably 20 to 40.

In the case where the alkyl group represented by $L_b$ has a branched shape, the number of carbon atoms in the branched portion is included in the number of carbon atoms of the alkyl group represented by $L_b$. However, in a case where $L_b$ contains $-NR^{2S}-$ and this $R^{2S}$ includes a carbon atom, the number of carbon atoms in $R^{2S}$ is not included in the number of carbon atoms in the alkylene group represented by $L_b$.

$R^{1S}$ and $R^{2S}$ each independently represent a hydrogen atom or a substituent. The substituent represents an alkyl group (preferably a linear or branched alkyl group having 1 to 10 carbon atoms), a halogen atom (preferably a F atom, a Cl atom, a Br atom, or an I atom) or an aryl group (preferably an aryl group having 6 to 20 carbon atoms). Among these, $R^{1S}$ to $R^{2S}$ each independently and preferably represent a hydrogen atom or an alkyl group, and are more preferably an alkyl group.

l represents an integer of 1 to 5 and is preferably 1 or 2. In a case where l is 2 or greater, a plurality of $L_b$'s may be identical to as or different from each other.

* represents a bonding site to another structure.

With respect to the specific polymer compound, A in Formula (1) has at least one structure selected from the group consisting of structures represented by Formulae (A-1) to (A-9) as a partial structure, preferably has at least one structure selected from the group consisting of structures represented by Formulae (A-1), (A-2), (A-3), (A-4), and (A-9), as a partial structure, more preferably has at least one structure selected from the group consisting of structures represented by Formulae (A-1), (A-3), and (A-4), as a partial structure, and particularly preferably has the structure represented by Formula (A-1), as a partial structure.

The specific polymer compound is preferably an aspect in which A in Formula (1) has a structure represented by each formula to an aspect in which A in Formula (1) has a structure represented by each formula, as a partial structure.

An example of a structure represented by Formulae (A-1) to (A-9) is provided below, but the present invention is not limited thereto. In the following structural formulae, $R^{41}$ has the same meaning as $R^{41}$ in Formulae (A-1) to (A-9), and preferable aspects thereof are also the same.

* represents a bonding site to another structure.

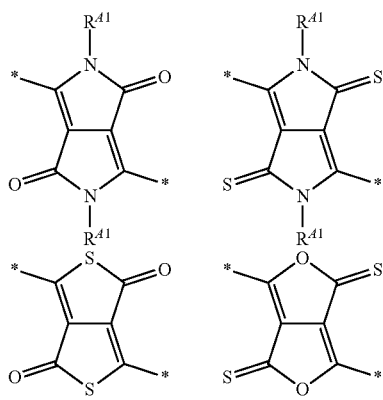

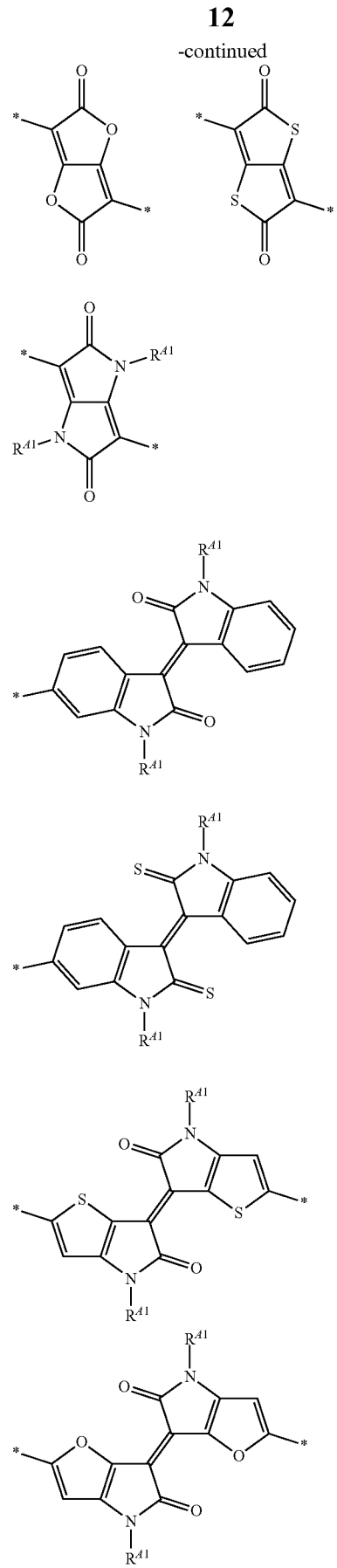

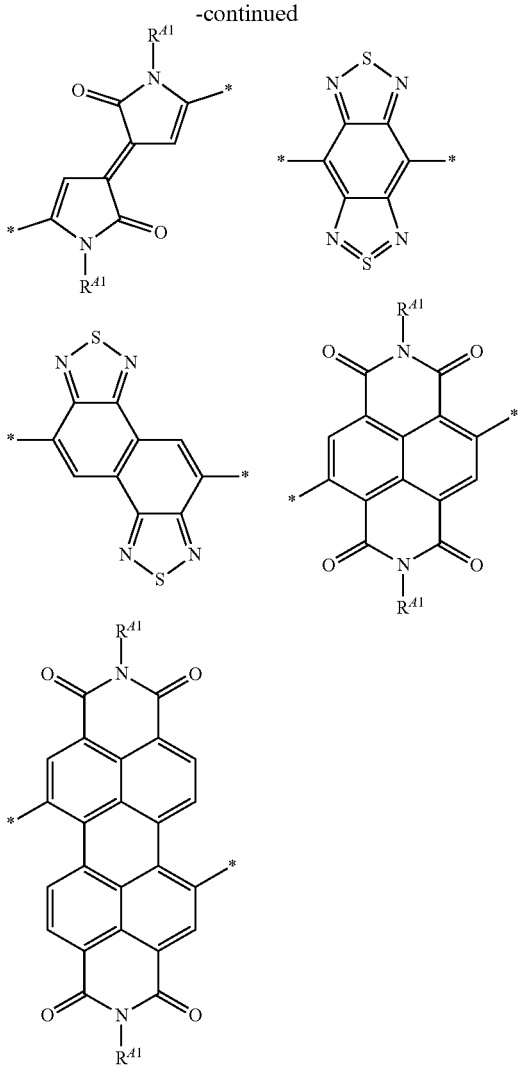

(Electron Donor Unit ("D" of Formula (1)))

D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure.

The divalent aromatic heterocyclic group having at least one of a N atom, an O atom, a S atom, or a Se atom in a ring structure is preferably a divalent aromatic heterocyclic group having at least one S atom in a ring structure.

The divalent aromatic heterocyclic group may have a single ring or a fused ring structure having two or more rings, and preferably has a structure obtained by combining two or more divalent aromatic heterocyclic groups having single rings or a structure obtained by combining a divalent aromatic heterocyclic group having two or more single rings and a divalent aromatic heterocyclic group having one or more fused ring structures having two or more rings.

The divalent aromatic heterocyclic group may further have a substituent, and preferred substituents include a alkyl group that may include at least one of —O—, —S—, or —NR$^{D3}$— (for example, an alkyl group having 1 to 30 carbon atoms or an alkoxy group having 1 to 30 carbon atoms is preferable, and an alkyl group having 1 to 20 carbon atoms is more preferable), an alkenyl group (preferably having 2 to 30 carbon atoms), an alkynyl group (preferably having 2 to 30 carbon atoms), an aromatic hydrocarbon group (preferably having 6 to 30 carbon atoms), an aromatic heterocyclic group (preferably 5-membered to 7-membered rings and preferably an O atom, a N atom, a S atom, a Se atom, as the heteroatom), a halogen atom (preferably a F atom, a Cl atom, a Br atom, and an I atom are, more preferably a F atom or a Cl atom, and particularly preferably a F atom), and the monovalent group represented by Formula (1-1).

R$^{D3}$ has the same meaning as R$^{D3}$ in Formula (D-1), and preferable aspects thereof are also the same.

Examples of the divalent aromatic heterocyclic group are provided below, but the present invention is not limited thereto. In the structural formula, the hydrogen atom may be substituted with an alkyl group that may include at least one of —O—, —S—, or —NR$^{D3}$—, an alkenyl group, an alkynyl group, an aromatic hydrocarbon group, an aromatic heterocyclic group, a halogen atom, or a group represented by Formula (1-1), R$^{D1}$ has the same meaning as R$^{D1}$ in Formula (D-1) described below, the preferable aspect thereof is also the same, and * represents a bonding site to another structure. An alkyl group that may contain at least one of —O—, —S—, or —NR$^{D3}$— is preferably an alkyl group having 1 to 30 carbon atoms and more preferably an alkyl group having 1 to 20 carbon atoms. R$^{D3}$ has the same meaning as R$^{D3}$ in Formula (D-1), and preferable aspects thereof are also the same.

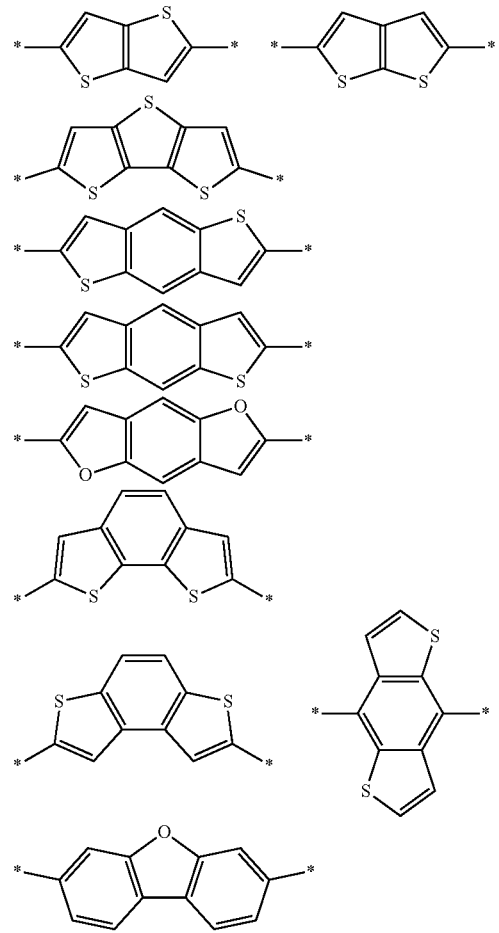

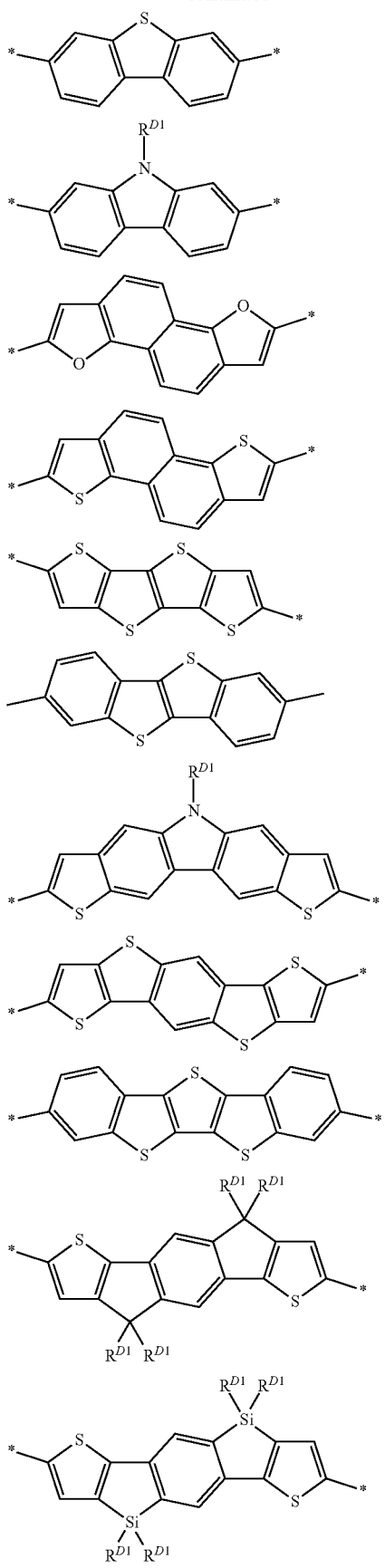

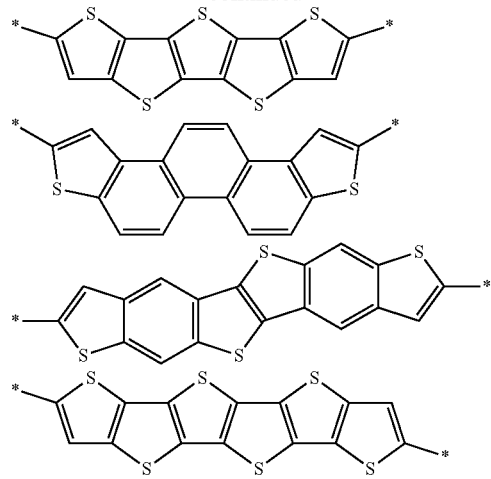

The aromatic hydrocarbon group consisting of a fused ring structure having two or more rings is preferably an aromatic hydrocarbon group having 10 to 20 carbon atoms, more preferably a fluorene group, a naphthylene group, or a group obtained by removing two hydrogen atoms from the aromatic hydrocarbon in which three or four rings are fused, and even more preferably a fluorene group, a naphthylene group, or a group obtained by removing two hydrogen atoms from an anthracene ring, a phenanthrene ring, a chrysene ring, or a pyrene ring.

The aromatic hydrocarbon group may further have a substituent, and preferable examples of the substituent include an alkyl group that may contain at least one of —O—, —S—, or —NR$^{D3}$—, a halogen atom, or the monovalent group represented by Formula (1-1). Preferable examples of the an alkyl group that may contain at least one of —O—, —S—, or —NR$^{D3}$— and the halogen atom are the same as those described for the divalent aromatic heterocyclic group. R$^{D3}$ has the same meaning as R$^{D3}$ in Formula (D-1), and preferable aspects thereof are also the same.

In Formula (1), D has preferably a structure represented by Formula (D-1).

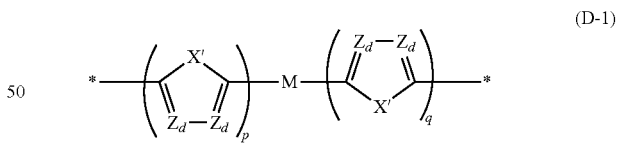

(D-1)

In Formula (D-1), X''s each independently represent an O atom, a S atom, a Se atom, or NR$^{D1}$. R$^{D1}$'s each independently represent a monovalent organic group that may be the monovalent group represented by Formula (1-1). Z$_d$'s each independently represent a N atom or CR$^{D2}$. R$^{D2}$'s each independently represent a hydrogen atom or a monovalent organic group that may be the monovalent group represented by Formula (1-1). M represents a single bond, a divalent aromatic heterocyclic group, a divalent aromatic hydrocarbon group, an alkenylene group, an alkynylene group, or a divalent group obtained by combining these. M may be substituted with an alkyl group that may include at least one of —O—, —S—, or —NR$^{D3}$— or the monovalent group represented by Formula (1-1). R$^{D3}$'s each independently represent a hydrogen atom or a substituent. p and q each independently represent an integer of 0 to 4. *'s each independently represent a bonding site to another structure.

In Formula (D-1), each repeating unit and M described above are bonded to each other at the bonding axis in a rotatable manner.

In Formula (D-1), X''s each independently represent an O atom, a S atom, a Se atom, or $NR^{D1}$, preferably an O atom, a Se atom, or a S atom, and more preferably a S atom.

$Z_d$'s each independently represent a N atom or $CR^{D2}$ and more preferably represents $CR^{D2}$.

$R^{D1}$'s each independently represent a monovalent organic group, preferably represents an alkyl group which may contain at least one of —O—, —S—, or $-NR^{D3}-$ (for example, an alkyl group having 1 to 30 carbon atoms or an alkoxy group having 1 to 30 carbon atoms is preferable, and an alkyl group having 1 to 20 carbon atoms is more preferable), an alkynyl group (preferably having 2 to 30 carbon atoms), an alkenyl group (preferably having 2 to 30 carbon atoms), an aromatic hydrocarbon group (preferably having 6 to 30 carbon atoms), an aromatic heterocyclic group (preferably 5- to 7-membered ring, an O atom, a N atom, a S atom, or a Se atom is preferable as the hetero atom), a halogen atom (preferably a F atom, a Cl atom, a Br atom, or an I atom, more preferably a F atom or a Cl atom, and even particularly preferably a F atom), and the monovalent group represented by Formula (1-1), and more preferably represents an alkyl group, a halogen atom, and the monovalent group represented by Formula (1-1).

$R^{D2}$'s each independently represent a hydrogen atom or a monovalent organic group, preferably represents a hydrogen atom, an alkyl group which may contain at least one of —O—, —S—, or $-NR^{D3}-$ (for example, an alkyl group having 1 to 30 carbon atoms or an alkoxy group having 1 to 30 carbon atoms is preferable, and an alkyl group having 1 to 20 carbon atoms is more preferable), an alkynyl group (preferably having 2 to 30 carbon atoms), an alkenyl group (preferably having 2 to 30 carbon atoms), an aromatic hydrocarbon group (preferably having 6 to 30 carbon atoms), an aromatic heterocyclic group (preferably a 5-membered to 7-membered ring, and preferably an O atom, a N atom, a S atom, and a Se atom, as the hetero atom), a halogen atom (preferably a F atom, a Cl atom, a Br atom, or an I atom, more preferably a F atom or a Cl atom, and particularly preferably a F atom), and the monovalent group represented by Formula (1-1) and more preferably represents a hydrogen atom, an alkyl group, a halogen atom, or the monovalent group represented by Formula (1-1).

M represents a single bond, a divalent aromatic heterocyclic group, a divalent aromatic hydrocarbon group, an alkenylene group, an alkynylene group, or a divalent group obtained by combining these. M may be substituted with an alkyl group that may include at least one of —O—, —S—, or $-NR^{D3}-$ or the monovalent group represented by Formula (1-1).

The divalent aromatic heterocyclic group in M may have a single ring or may have a fused ring structure having two or more rings. Examples of the divalent aromatic heterocyclic group preferably used in the present invention are the same as those of the above divalent aromatic heterocyclic group having a fused ring structure having two or more rings.

The divalent aromatic hydrocarbon group in M is preferably an aromatic hydrocarbon group having 6 to 20 carbon atoms, more preferably a phenylene group, a biphenylene group, a fluorene group, a naphthylene group, or a group obtained by removing two hydrogen atoms from aromatic hydrocarbon in which three or four rings are condensed, and even more preferably a fluorene group, a naphthylene group, an anthracene ring, a phenanthrene ring, a chrysene ring, or a group obtained by removing two or more hydrogen atoms from a pyrene ring.

The divalent aromatic heterocyclic group or the divalent aromatic hydrocarbon group in M may further have a substituent, and preferable examples of the substituents include an alkyl group that may include at least one of —O—, —S—, or $-NR^{D3}-$ (for example, an alkyl group having 1 to 30 carbon atoms or an alkoxy group having 1 to 30 carbon atoms is preferable, and an alkyl group having 1 to 20 carbon atoms is more preferable), a halogen atom (preferably a F atom, a Cl atom, a Br atom, and an I atom, more preferably a F atom or a Cl atom, and particularly preferably a F atom), and the monovalent group represented by Formula (1-1).

An alkenylene group in M is preferably an alkenylene group having 2 to 10 carbon atoms, more preferably an alkenylene group having 2 to 4 carbon atoms, and even more preferably an ethenylene group.

An alkynylene group in M is preferably an alkynylene group having 2 to 10 carbon atoms, more preferably an alkynylene group having 2 to 4 carbon atoms, and even more preferably an ethynylene group.

$R^{D3}$'s each independently represent a hydrogen atom or a substituent. The substituent in $R^{D3}$ has the same meaning as the substituents in $R^{1S}$ and $R^{2S}$ described below.

p and q each independently represent an integer of 0 to 4, preferably an integer of 1 to 3, and more preferably an integer of 1 to 2. It is preferable that p and q have the same value. It is preferable that p+q is 2 to 4.

Here, in a case where p+q is 0, M preferably includes a divalent aromatic heterocyclic group having at least one of a N atom, an O atom, a S atom, or a Se atom in a ring structure or a divalent aromatic hydrocarbon group consisting of a fused ring structure having two or more rings, as a partial structure.

Examples of the structure represented by D are provided below, but the present invention is not limited to the following examples. In the structural formula, the hydrogen atom may be substituted with an alkyl group that may include at least one of —O—, —S—, or $-NR^{D3}-$ or the group represented by Formula (1-1), $R^{D1}$ has the same meaning as $R^{D1}$ in Formula (D-1) described above, the preferable aspect thereof is also the same, and * represents a bonding site to another structure. The alkyl group that may contain at least one of —O—, —S—, or $-NR^{D3}-$, is preferably an alkyl group having 1 to 30 carbon atoms or an alkoxy group having 1 to 30 carbon atoms and more preferably an alkyl group having 8 to 30 carbon atoms. $R^{D3}$ has the same meaning as $R^{D3}$ in Formula (D-1), and preferable aspects thereof are also the same.

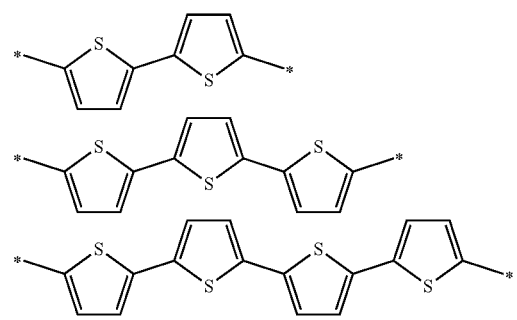

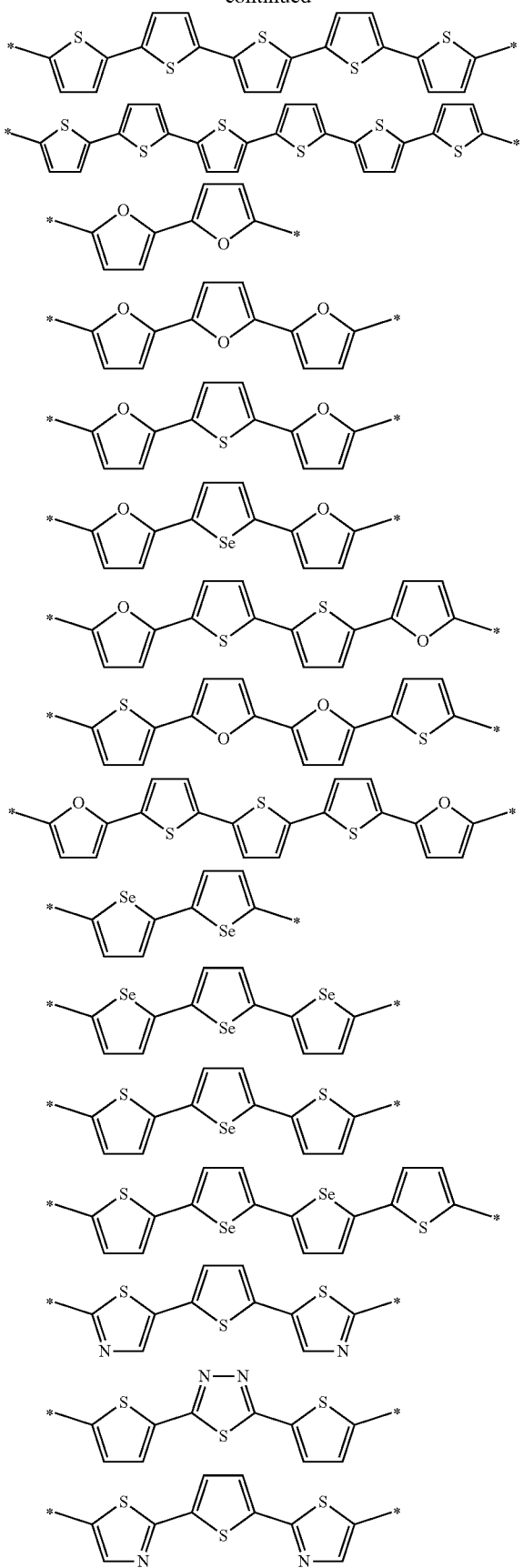
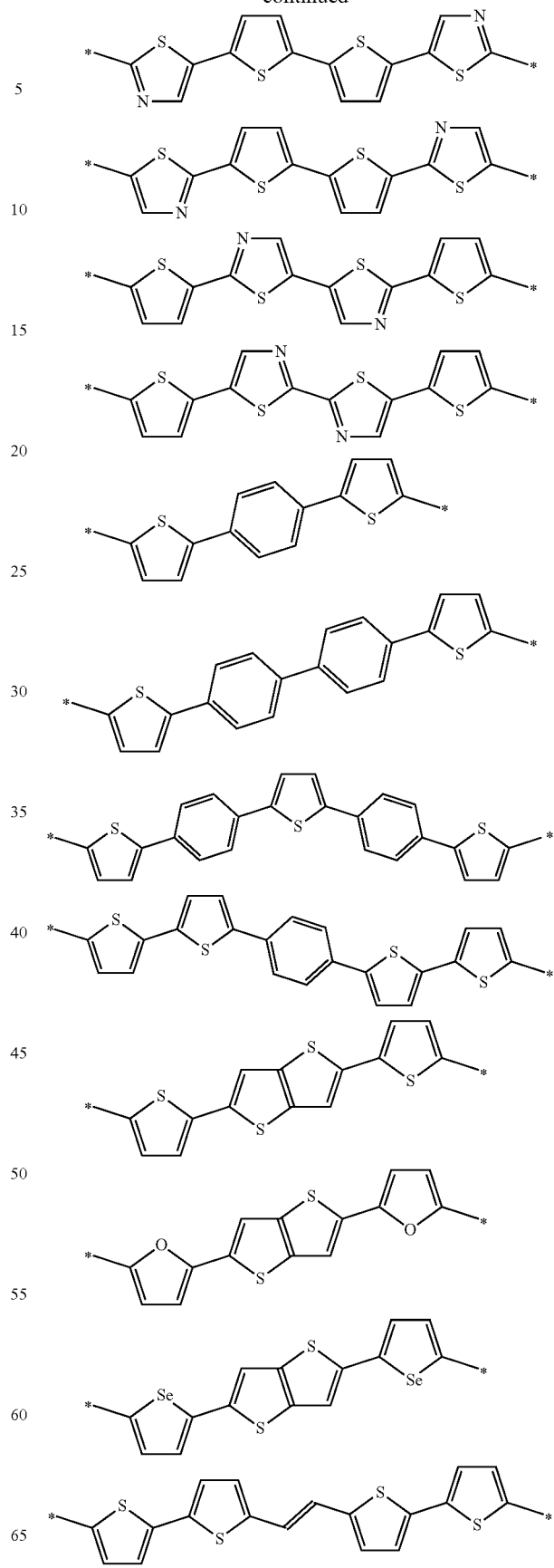

-continued
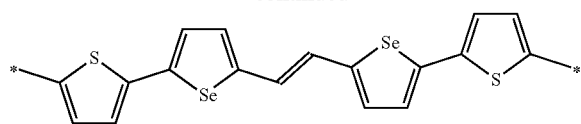
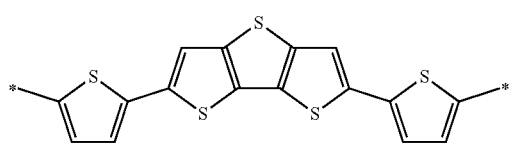
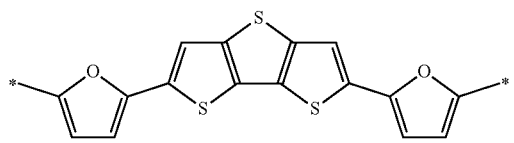
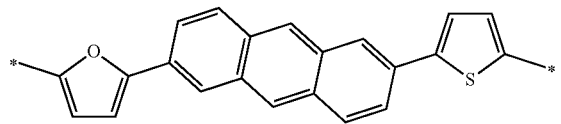
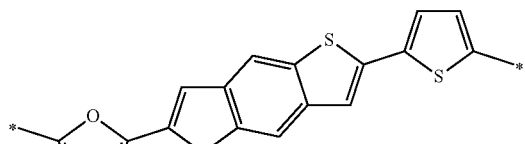
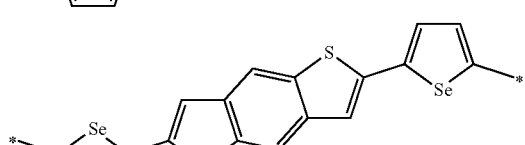
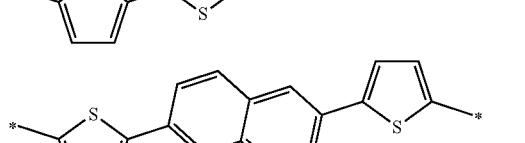
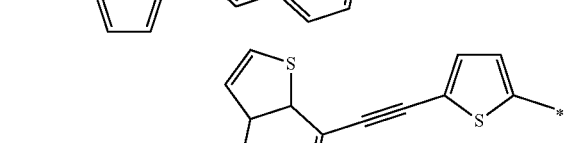
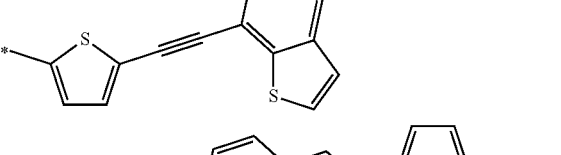
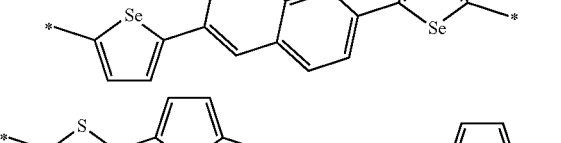
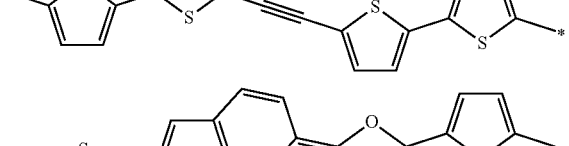
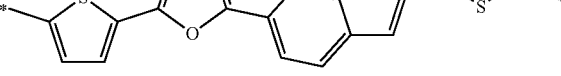
-continued
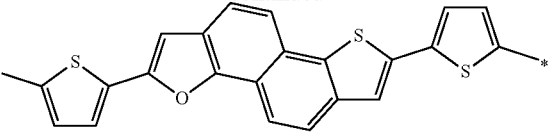
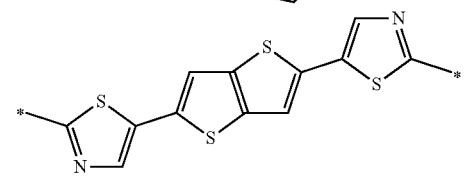
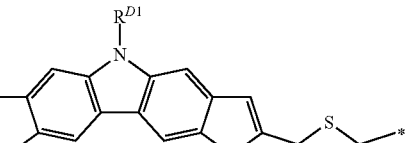
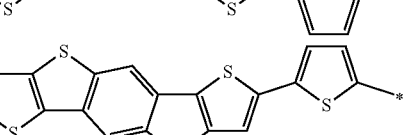
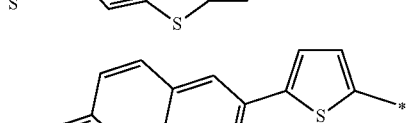
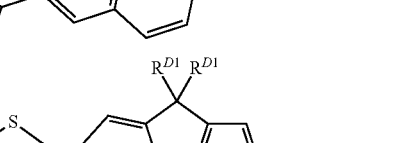
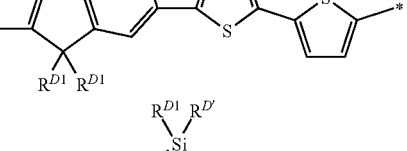
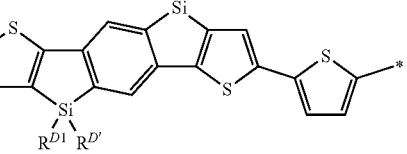
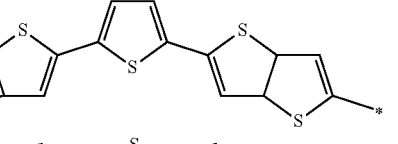
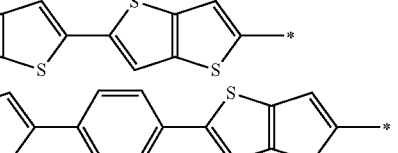
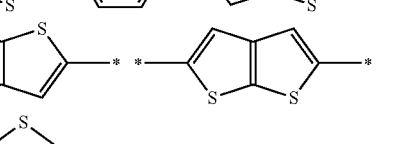

-continued
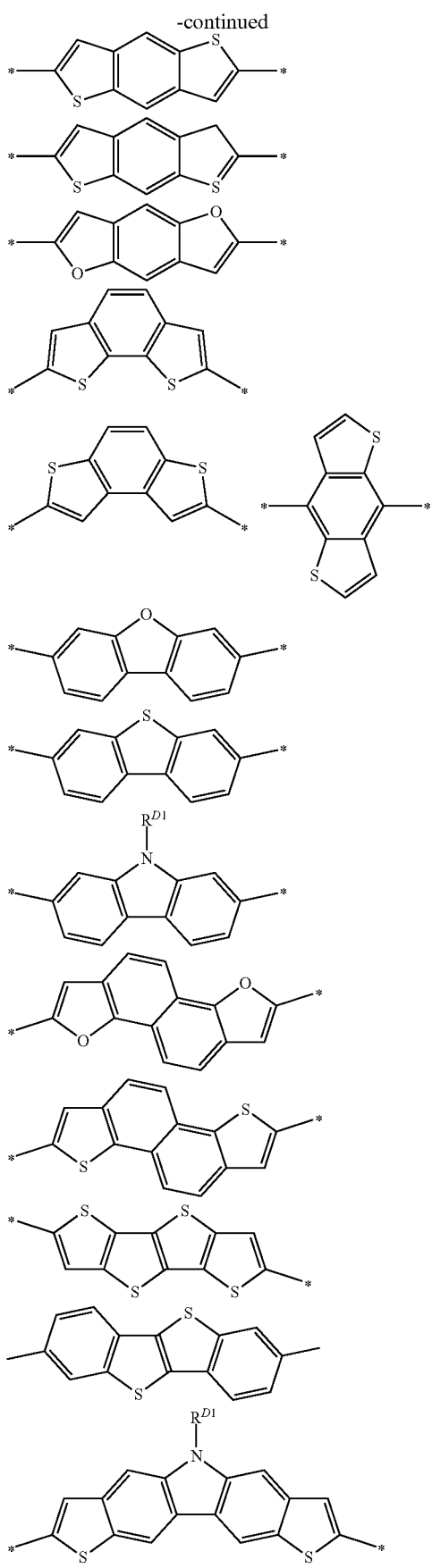
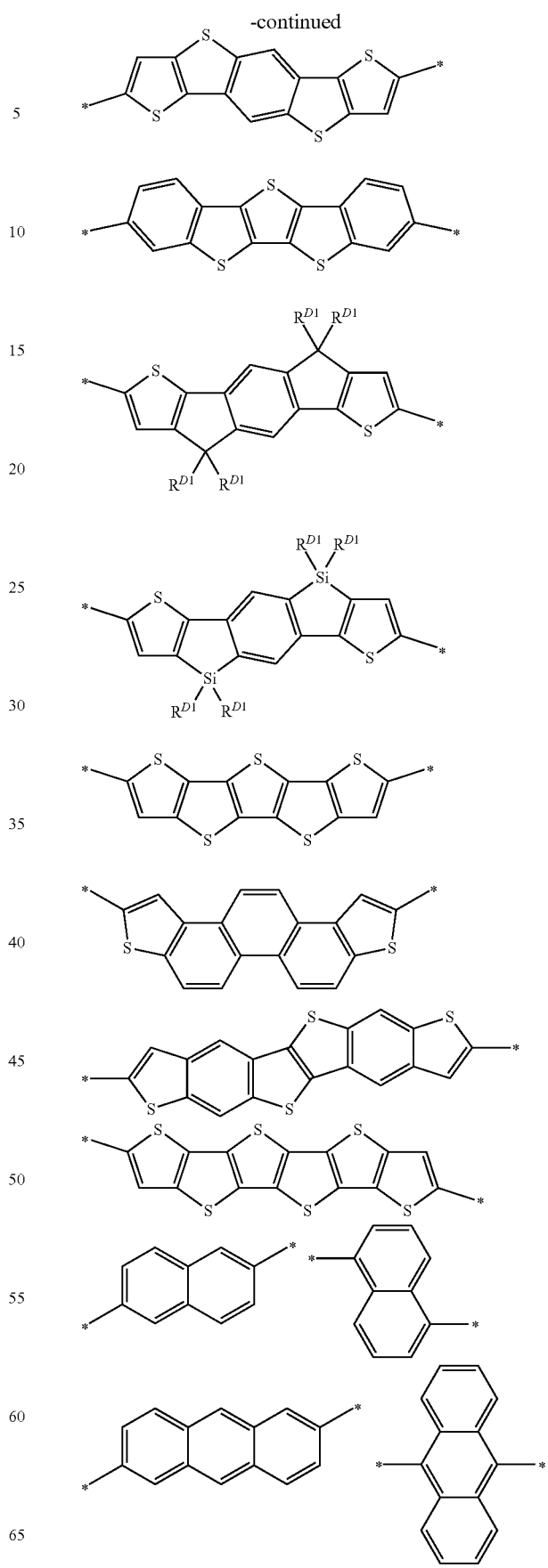

-continued

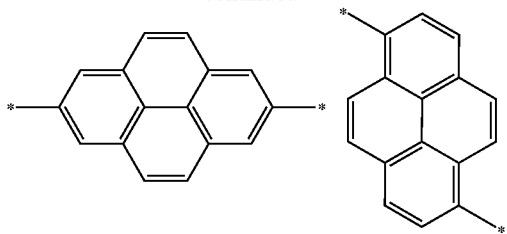

(Repeating Unit Represented by Formulae (3) to (5))

The repeating unit represented by Formula (1) is preferably a repeating unit represented by any one of Formulae (3) to (5) and more preferably a repeating unit represented by Formula (3).

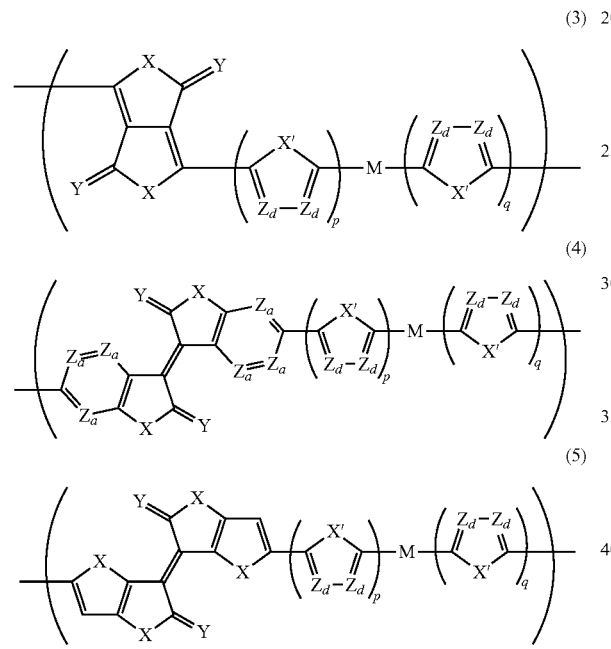

In Formulae (3) to (5), X's each independently represent an O atom, a S atom, a Se atom, or $NR^{A1}$.

$R^{A1}$'s each independently represent an alkyl group that may contain at least one of —O—, —S—, or —$NR^{A3}$—, and the monovalent group represented by Formula (1-1), or a bonding site to another structure.

Y's each independently represent an O atom or a S atom.

$Z_a$'s each independently represent $CR^{A2}$ or a N atom. $R^{A2}$'s each independently represent a hydrogen atom, a halogen atom, an alkyl group that may contain at least one of —O—, —S—, or —$NR^{A3}$—, or a bonding site to another structure. $R^{A3}$'s each independently represent a hydrogen atom or a substituent. X''s each independently represent an O atom, a S atom, a Se atom, or $NR^{D1}$. $R^{D1}$'s each independently represent a monovalent organic group that may be the monovalent group represented by Formula (1-1). $Z_d$'s each independently represent a N atom or $CR^{D2}$. $R^{D2}$'s each independently represent a hydrogen atom or a monovalent organic group that may be the monovalent group represented by Formula (1-1). M represents a single bond, a divalent aromatic heterocyclic group, a divalent aromatic hydrocarbon group, an alkenylene group, an alkynylene group, or a divalent group, or a divalent group obtained by combining these. M may be substituted with an alkyl group that may include at least one of —O—, —S—, or —$NR^{D3}$— or the monovalent group represented by Formula (1-1). $R^{D3}$'s each independently represent a hydrogen atom or a substituent. p and q each independently represent an integer of 0 to 4.

X, Y, $Z_a$, $R^{A1}$, $R^{A2}$, and $R^{A3}$ in Formulae (3) to (5) are the same as X, Y, $Z_a$, $R^{A1}$, $R^{A2}$, and $R^{A3}$ in Formulae (A-1) to (A-9), and preferable aspects thereof are also the same.

X', Y, $Z_d$, $R^{D1}$, $R^{D2}$, $R^{D3}$, M, p, and q in Formulae (3) to (5) are the same as X', Y, $Z_d$, $R^{D1}$, $R^{D2}$, $R^{D3}$, M, p, and q in Formula (D-1), and preferable aspects thereof are also the same.

The repeating unit represented by Formula (1) is preferably a repeating unit represented by Formula (6).

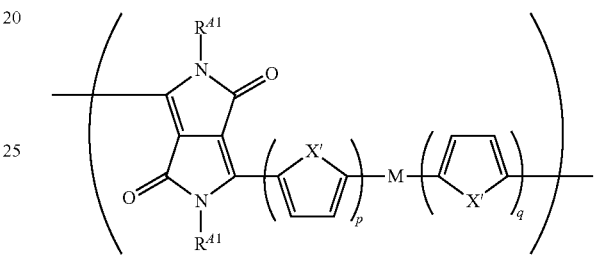

In Formula (6), $R^{A1}$'s each independently represent an alkyl group that may contain at least one of —O—, —S—, or —$NR^{A3}$—, and the monovalent group represented by Formula (1-1), or a bonding site to another structure. $R^{A3}$'s each independently represent a hydrogen atom or a substituent.

X''s each independently represent O, S, Se, or $NR^{D1}$, and $R^{D1}$'s each independently represent a monovalent organic group that may be the monovalent group represented by Formula (1-1).

M represents a single bond, a divalent aromatic heterocyclic group, a divalent aromatic hydrocarbon group, an alkenylene group, an alkynylene group, or a divalent group obtained by combining these. M may be substituted with an alkyl group that may include at least one of —O—, —S—, or —$NR^{D3}$— or the monovalent group represented by Formula (1-1). $R^{D3}$'s each independently represent a hydrogen atom or a substituent.

p and q each independently represent an integer of 0 to 4.

In Formula (6), $R^{A1}$ and $R^{A3}$ have the same meaning as RA1 and RA3 in Formulae (A-1) to (A-9), respectively, and preferable aspects thereof are also the same.

In Formula (6), X', $R^{D1}$, M, $R^{D3}$, p, and q have the same meaning as X', $R^{D1}$, M, $R^{D3}$, p, and q in Formula (D-1), respectively, and preferable aspects thereof are also the same.

The specific polymer compound may include a repeating unit represented by Formula (1) singly or two or more kinds thereof may be included.

The specific polymer compound is a compound having two or more repeating units represented by Formula (1) and may be an oligomer in which the number n of repeating units is 2 to 9 or may be a polymer in which the number n of constitutional repeating units is 10 or greater. Among these, a polymer in which the number n of repeating units is 10 or greater is preferable, in view of carrier mobility and obtainable physical properties of the organic semiconductor layer.

In view of carrier mobility, the molecular weight of the compound having a repeating unit represented by Formula (1) is 2,000 or greater, preferably 5,000 or greater, more preferably 10,000 or greater, even more preferably 20,000 or greater, and particularly preferably 30,000 or greater. In view of solubility, the molecular weight is preferably 1,000,000 or less, more preferably 300,000 or less, even more preferably 150,000 or less, and particularly preferably 100,000 or less.

According to the present invention, in a case where a specific polymer compound has molecular weight distribution, the molecular weight of this compound means a weight-average molecular weight.

According to the present invention, the weight-average molecular weight and the number-average molecular weight of the specific polymer compound can be measured by gel permeation chromatography (GPC) method, and can be obtained in terms of standard polystyrene. Specifically, for example, GPC is performed by using HLC-8121GPC (manufactured by Tosoh Corporation), using two items of TSKgel GMHHR-H (20) HT (manufactured by Tosoh Corporation, 7.8 mmID×30 cm) as columns, and using 1,2,4-trichlorobenzene as an eluent. GPC is performed by using an infrared (IR) detector under the conditions in which the sample concentration is 0.02 mass %, the flow rate is 1.0 ml/min, the sample injection amount is 300 μl, and the measurement temperature is 160° C. The calibration curve is manufactured from 12 samples of "standard sample TSK standard, polystyrene": "F-128", "F-80", "F-40", "F-20", "F-10", "F-4", "F-2", "F-1", "A-5000", "A-2500", "A-1000", and "A-500" manufactured by Tosoh Corporation.

The structure of the terminal of the specific polymer compound is not particularly limited, and depends on the existence of other constitutional units, kinds of base substances used in the synthesis, and kinds of a quench agent (reaction terminator) used in the synthesis. Here, examples thereof include a hydrogen atom, a hydroxy group, a halogen atom, an ethylenically unsaturated group, an alkyl group, an aromatic heterocyclic group (preferably a thiophene ring), and an aromatic hydrocarbon group (preferably a benzene ring).

A method of synthesizing a specific polymer compound is not particularly limited, and may be synthesized with reference to well-known methods. For example, with reference to documents such as JP2010-527327A, JP2007-516315A, JP2014-515043A, JP2014-507488A, JP2011-501451A, JP2010-18790A, WO2012/174561A, JP2011-514399A, and JP2011-514913A, the specific polymer compound are synthesized by synthesizing a precursor of the electron acceptor unit and a precursor of the electron donor unit and subjecting each precursor to a cross coupling reaction such as Suzuki coupling or Stille coupling.

Hereinafter, preferable specific examples of the preferable repeating unit represented by Formula (1) are provided, but the present invention is not limited to the examples below.

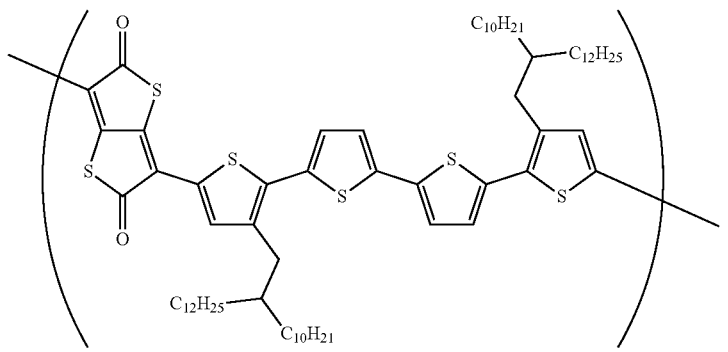

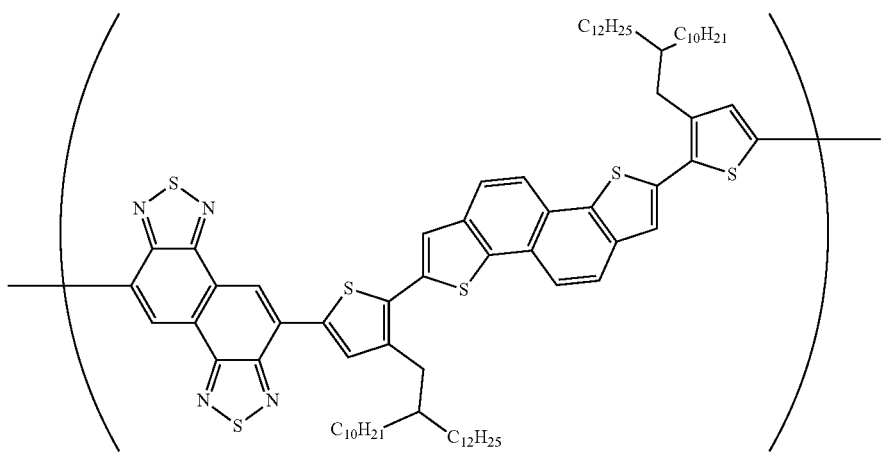

-continued
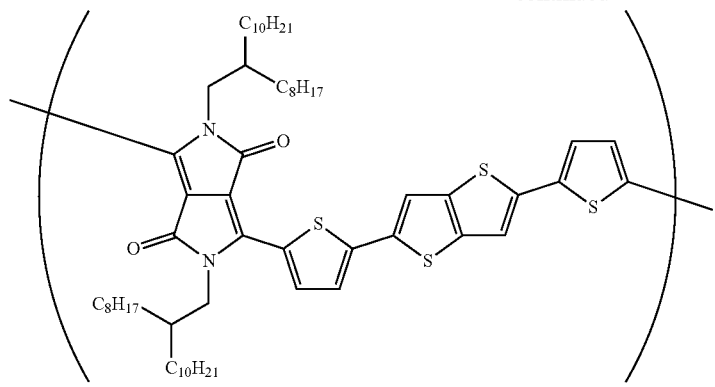
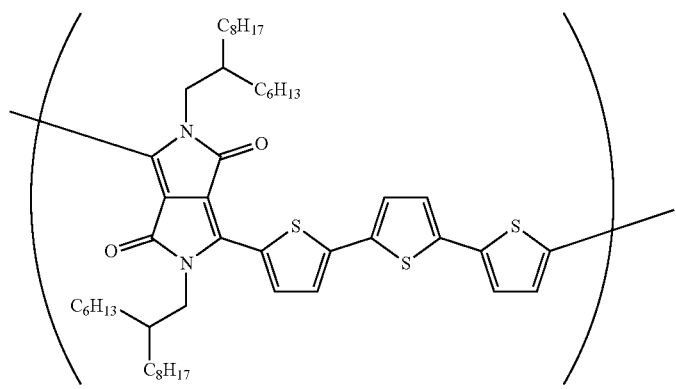
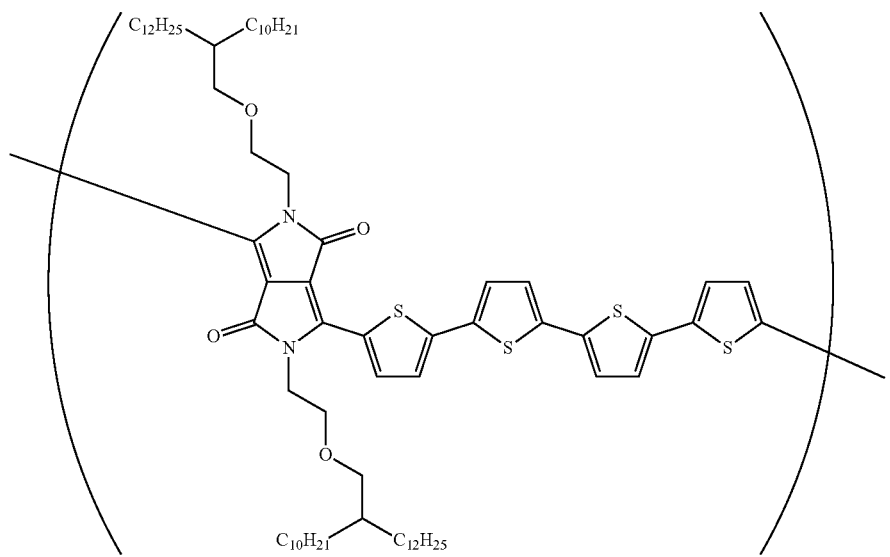

-continued
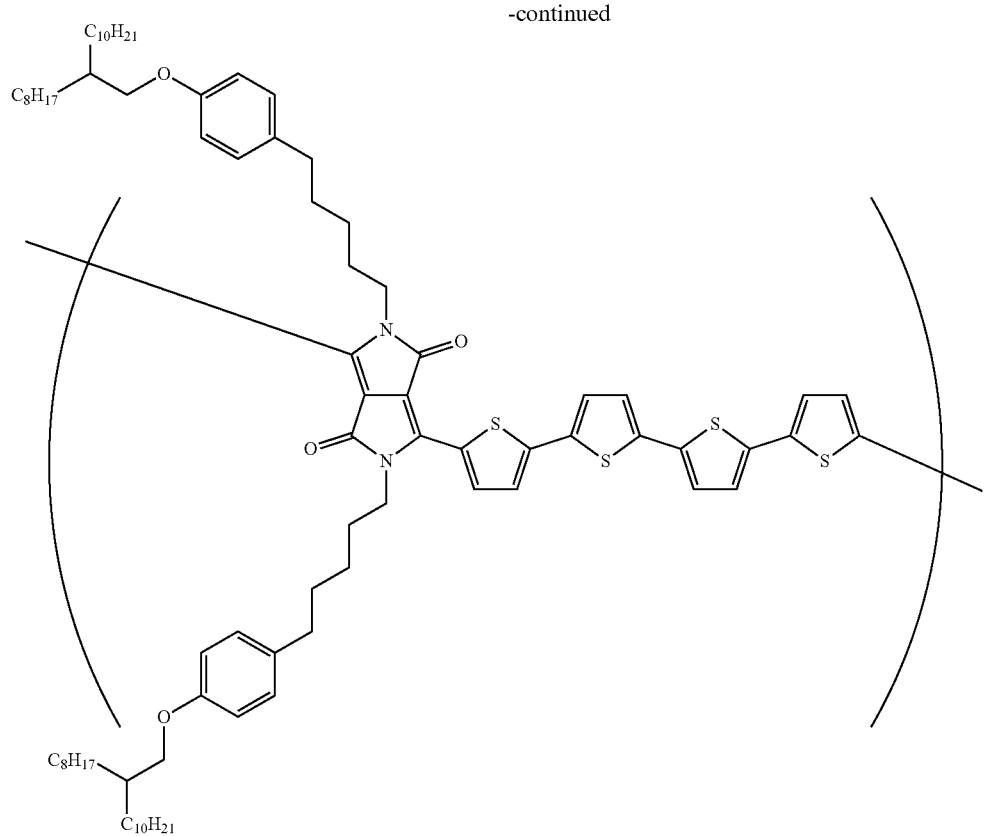
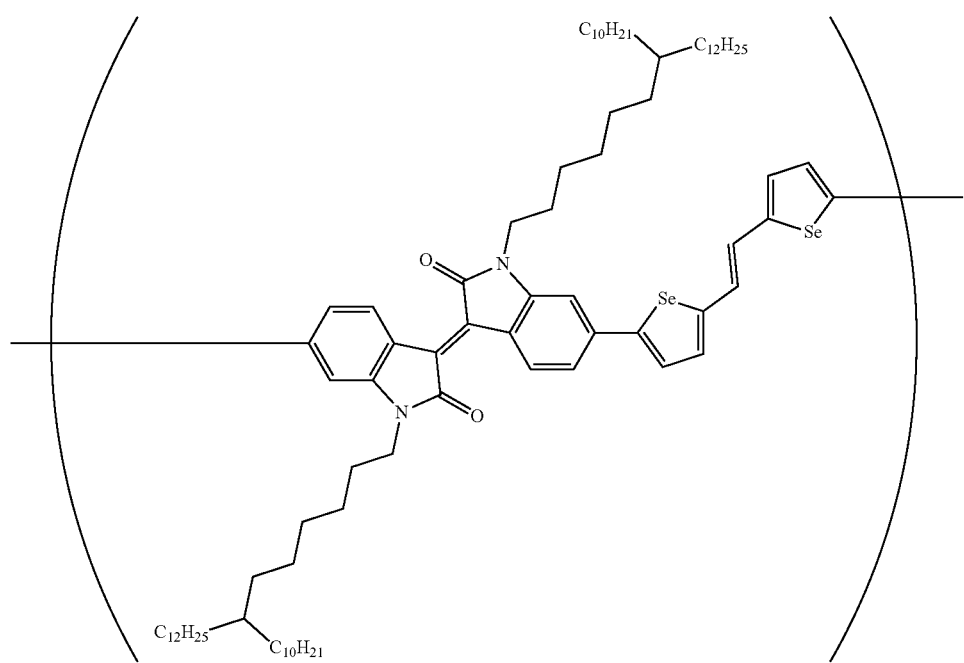

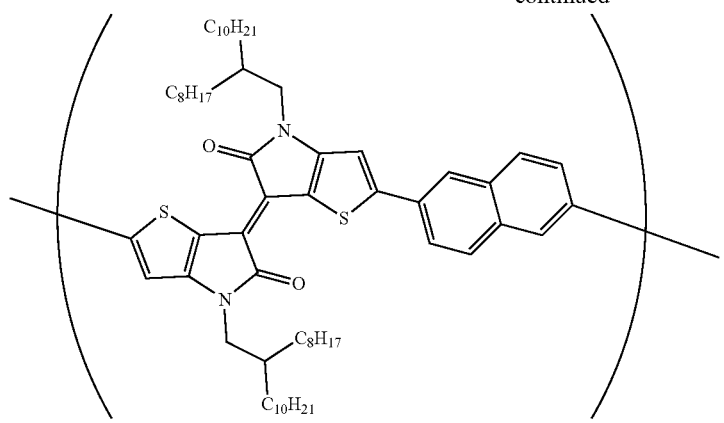
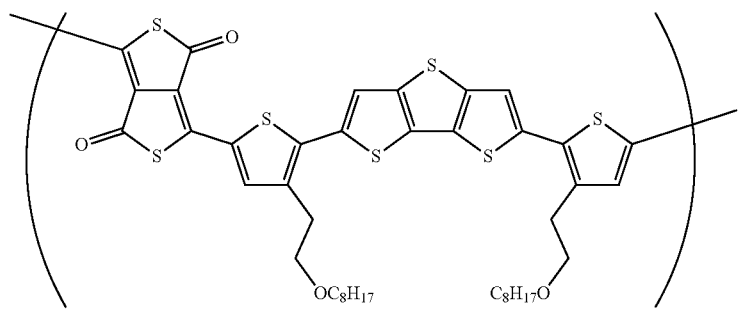
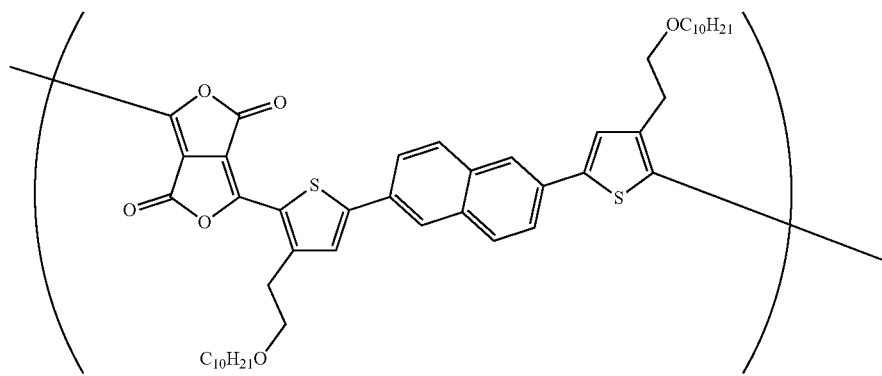
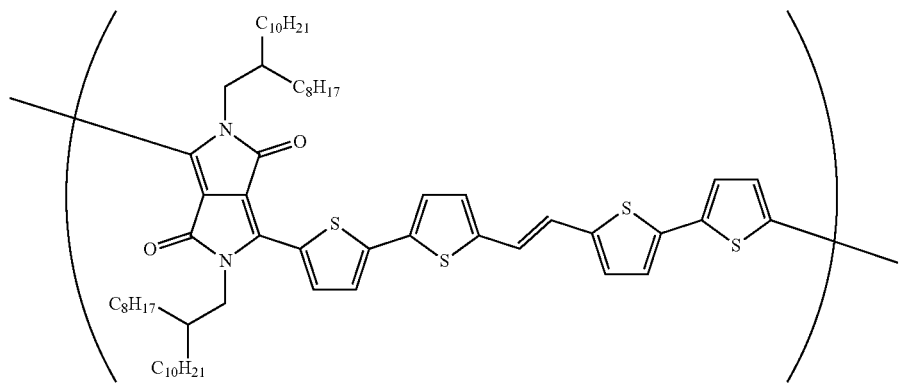

-continued
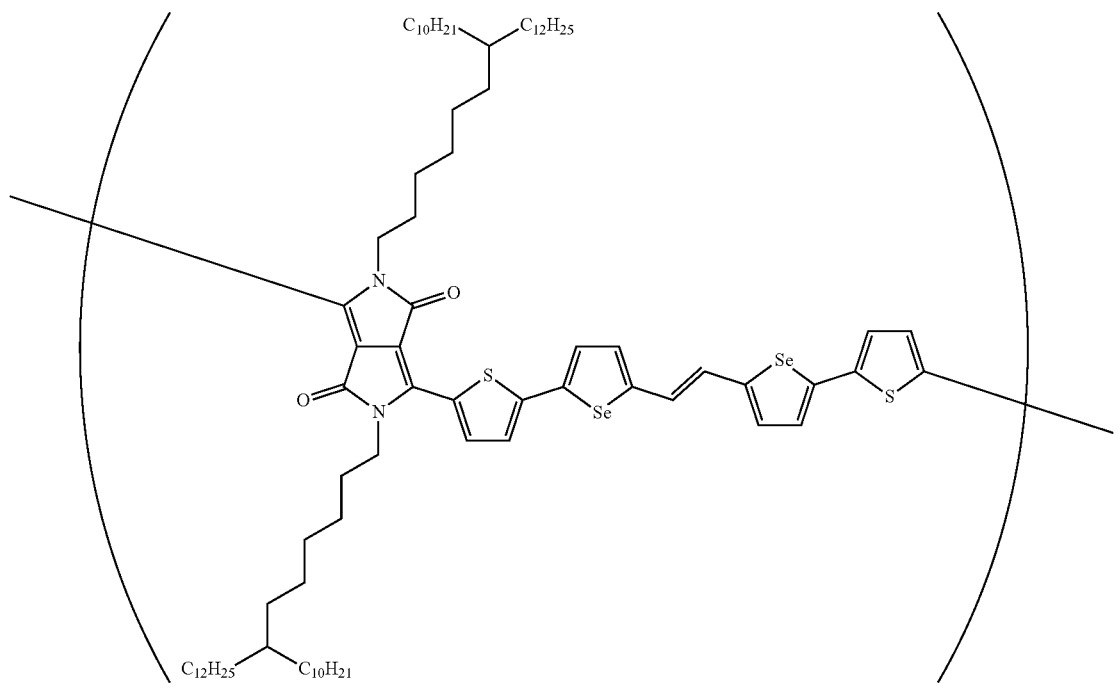
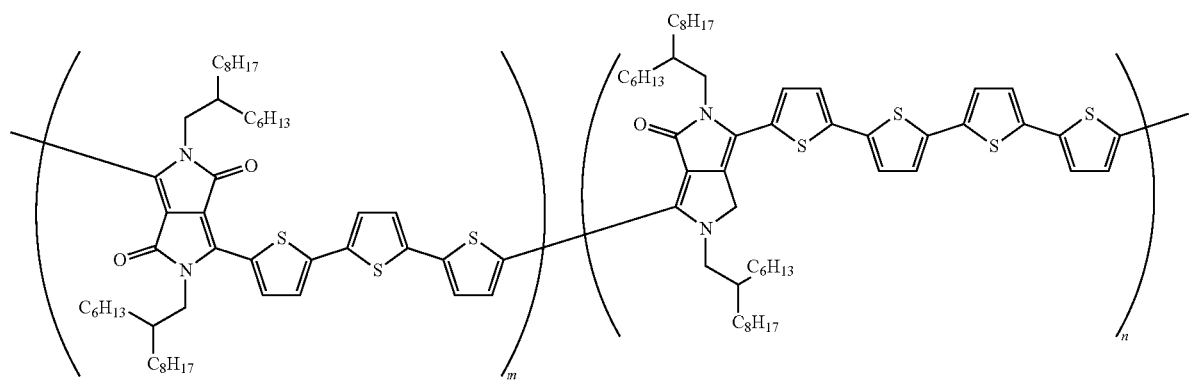
m/n = 0.2/ 0.8
random copolymer
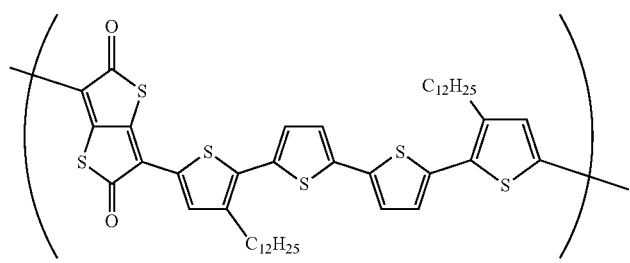

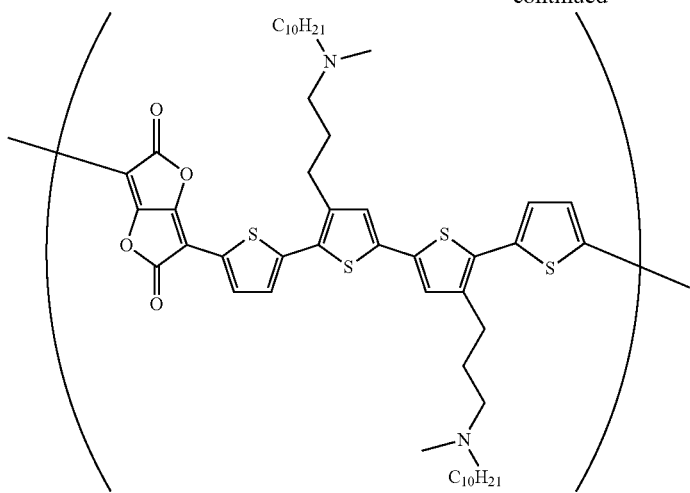
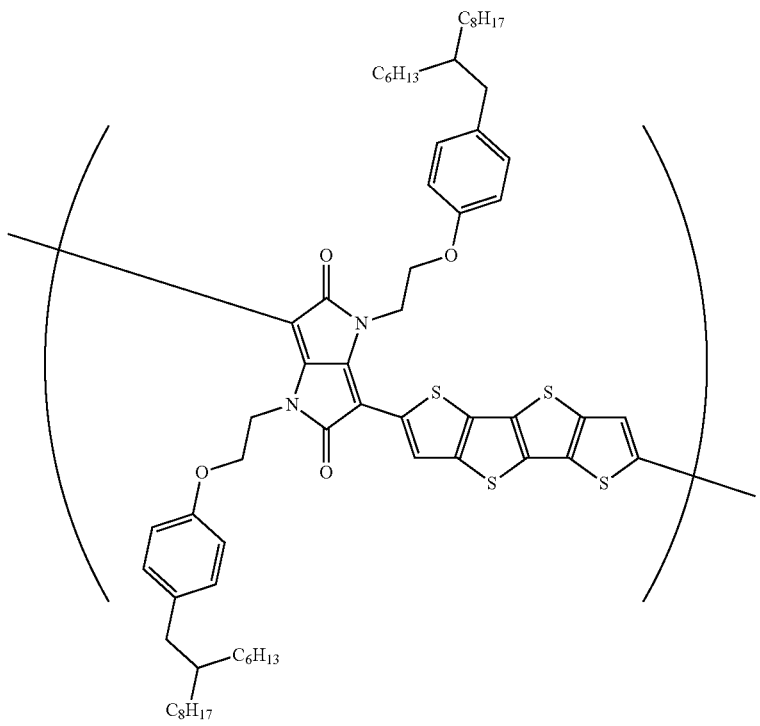

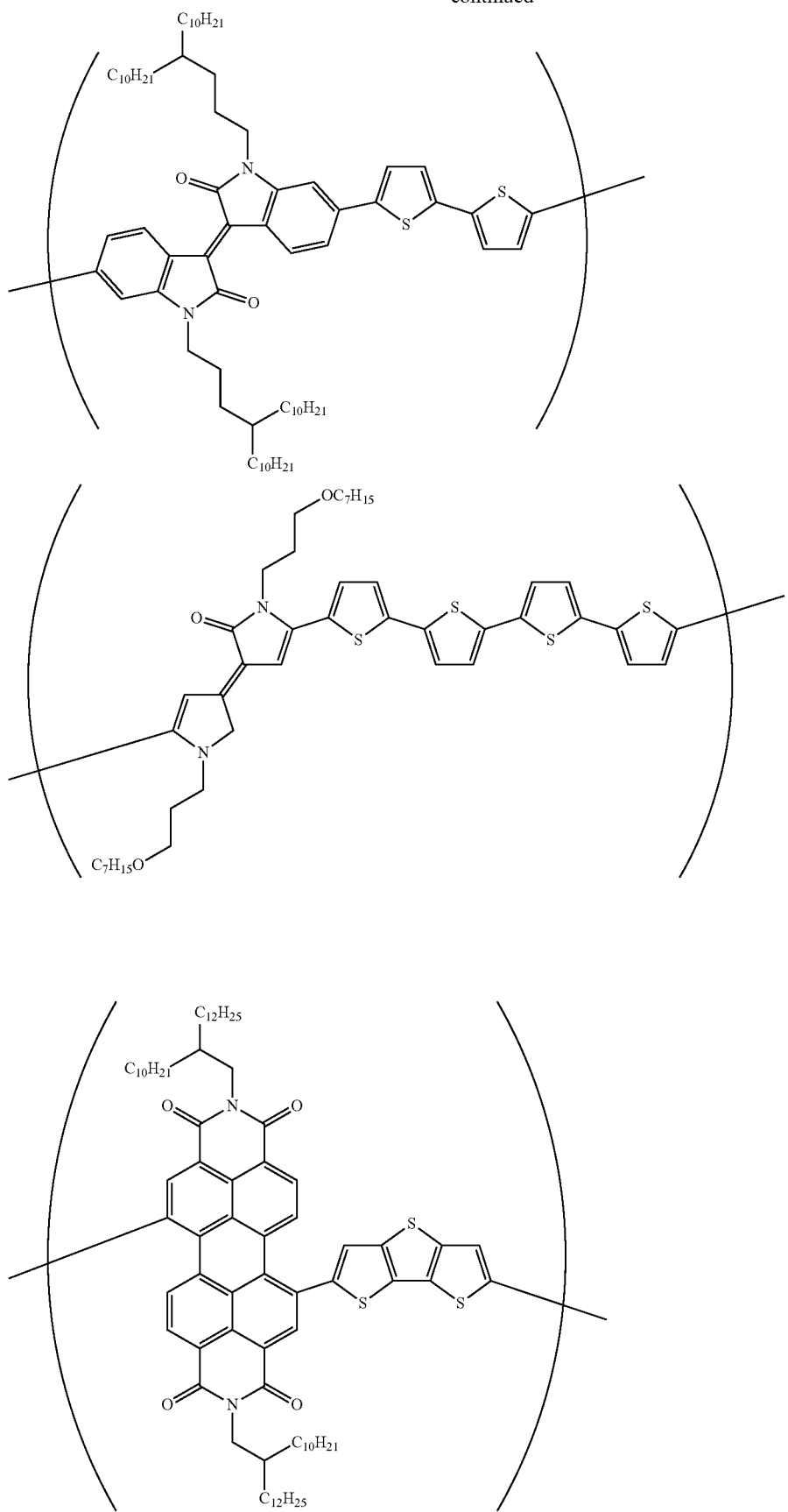

-continued

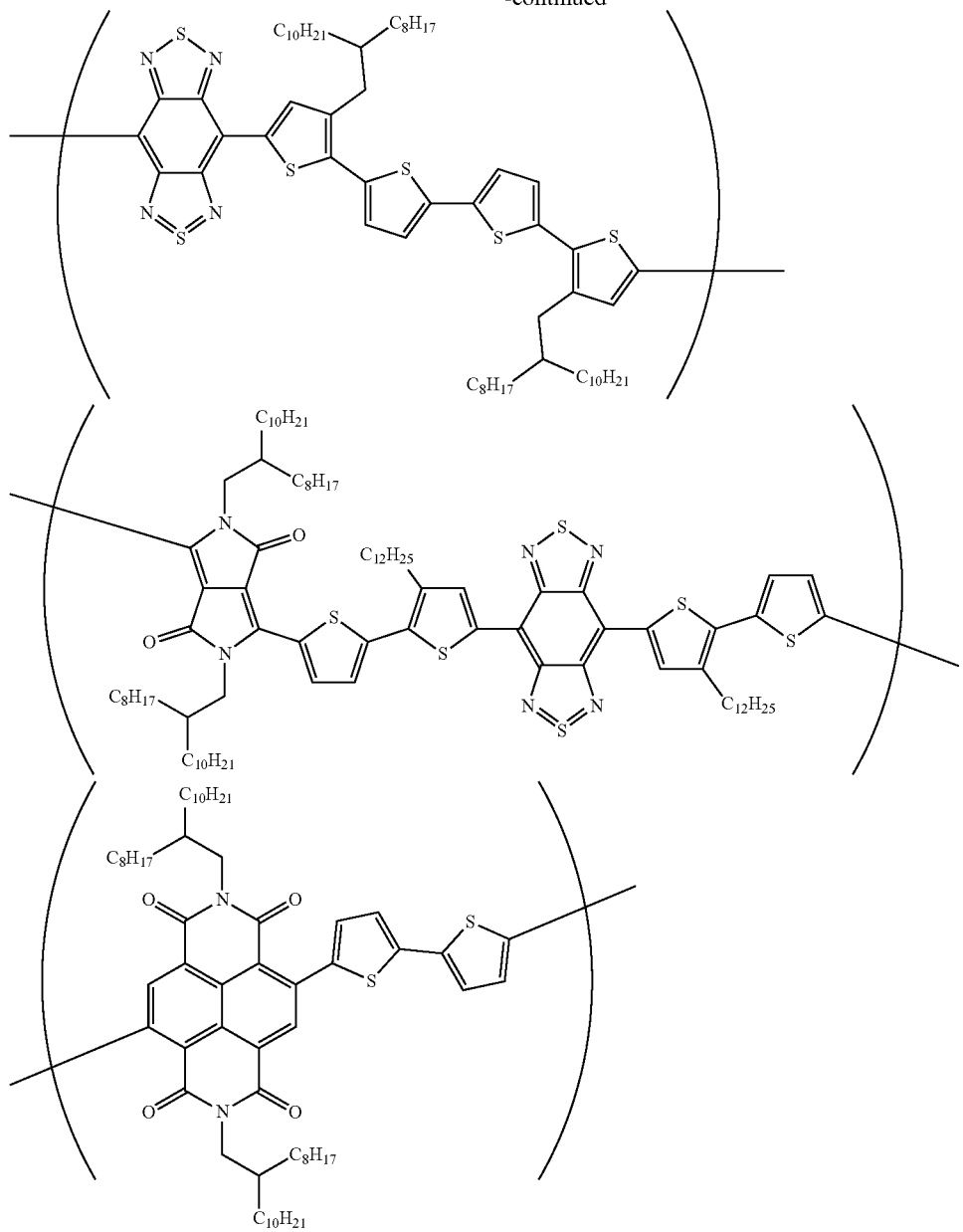

<Specific Low Molecular Weight Compound (Compound Y)>

The organic semiconductor composition of the present invention contains a specific low molecular weight compound. The specific low molecular weight compound is the compound Y represented by Formula (2).

The specific low molecular weight compound is a kind of the organic semiconductor compound and has carrier transporting properties.

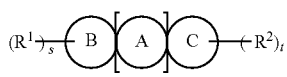
(2)

In Formula (2), A, B, and C each independently represent a ring structure selected from a benzene ring, a 6-membered heterocyclic ring, a 5-membered heterocyclic ring, and a cyclopentadiene ring. Adjacent rings may be fused with each other.

Here, the expression "adjacent rings may be fused with each other" means that a portion of bonds that form a ring structure forms a portion of the other adjacent ring structure. With respect to Formula (2), adjacent A and B are fused with each other, adjacent A's are fused with each other, and adjacent A and C are fused with each other.

Examples of the heteroatom included in the 5-membered heterocyclic ring and the 6-membered heterocyclic ring include an O atom, a S atom, a Se atom, a N atom, a P atom, a B atom, and a Si atom. The number of heteroatoms included in the ring is not particularly limited, as long as the number is 1 or greater.

n represents an integer of 2 to 8, preferably an integer of 2 to 6, more preferably an integer of 2 to 4, even more preferably an integer of 2 to 3, and particularly preferably 3. Particularly, in a case where n is 3, there is a tendency in that the heat resistance of the organic thin film transistor is further improved.

A plurality of A's may be identical to each other, and at least one of the plurality of A's represents a 5-membered heterocyclic ring.

Rings that form A's each independently represent a ring structure selected from a benzene ring, a 6-membered heterocyclic ring, a 5-membered heterocyclic ring, and a cyclopentadiene ring, but are preferably a benzene ring, a thiophene ring, a selenophene ring, or a cyclopentadiene ring, more preferably a benzene ring, a thiophene ring, or a selenophene ring, and even more preferably a benzene ring or a thiophene ring. These rings may have a substituent.

A fused ring including a plurality of A's preferably includes at least one benzene ring and at least one 5-membered ring (preferably a thiophene ring). Accordingly, there is a tendency in that the threshold voltage and the hysteresis characteristics of the organic thin film transistor become more excellent.

The ring structures representing a plurality of A's may each independently have a substituent. The substituent is the same as $R^1$ and $R^2$ described below.

Rings that form B's each independently represent a ring structure selected from a benzene ring, a 6-membered heterocyclic ring, a 5-membered heterocyclic ring, and a cyclopentadiene ring, but are preferably a benzene ring, a thiophene ring, a selenophene ring, or a cyclopentadiene ring, more preferably a benzene ring, a thiophene ring, or a selenophene ring, even more preferably a benzene ring or a thiophene ring, and particularly preferably a thiophene ring. Accordingly, in a case where the ring including B is a thiophene ring, there is a tendency in that the threshold voltage and the hysteresis characteristics of the organic thin film transistor become more excellent.

Rings that form C's each independently represent a ring structure selected from a benzene ring, a 6-membered heterocyclic ring, a 5-membered heterocyclic ring, and a cyclopentadiene ring, but are preferably a benzene ring, a thiophene ring, a selenophene ring, or a cyclopentadiene ring, more preferably a benzene ring, a thiophene ring, or a selenophene ring, even more preferably a benzene ring or a thiophene ring, and particularly preferably a thiophene ring. Accordingly, in a case where the ring including C is a thiophene ring, there is a tendency in that the threshold voltage and the hysteresis characteristics of the organic thin film transistor become more excellent.

$R^1$ and $R^2$ each independently represent a monovalent group selected from the group consisting of a saturated hydrocarbon group that may include at least one of —O—, —S—, or —$NR^B$—, an unsaturated hydrocarbon group that may include at least one of —O—, —S—, or —$NR^C$—, an aryl group, a heteroaryl group, an alkoxy group, an amino group, a carbonyl group, an ester group, a nitro group, a hydroxy group, a cyano group, an aryl alkyl group, a heteroaryl alkyl group, an aryloxy group, a heteroaryloxy group, an alkylsilyl group, and a halogen atom.

$R^B$'s each independently represent a hydrogen atom or a substituent, and $R^C$'s each independently represent a hydrogen atom or a substituent, and the substituents in $R^B$ and $R^C$ have the same meaning as the substituents in $R^{1S}$ and $R^{2S}$ described above.

These monovalent groups may be further substituted with a substituent, and examples of this substituent include a group represented by $R^1$ and $R^2$.

The unsaturated hydrocarbon groups in $R^1$ and $R^2$ preferably have 1 to 20 carbon atoms and more preferably have 1 to 16 carbon atoms. The saturated hydrocarbon group may have a linear shape or a branched shape. Examples of the saturated hydrocarbon group include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, an n-nonanyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-eicosanyl group.

The unsaturated hydrocarbon groups in $R^1$ and $R^2$ preferably have 1 to 20 carbon atoms and more preferably have 1 to 16 carbon atoms. The unsaturated hydrocarbon group may have a linear shape or a branched shape. Examples of the unsaturated hydrocarbon group include a vinyl group, a 1-propenyl group, an allyl group, a propargyl group, an isopropenyl group, a 1-butenyl group, and a 2-butenyl group. In view of chemical stability, as the unsaturated hydrocarbon group, in the chains, it is preferable that the number of units of double bond or triple bond is one.

With respect to the alkoxy group in $R^1$ and $R^2$, the number of carbon atoms in the alkoxy group is preferably 1 to 20 and more preferably 1 to 16. An alkoxy group may have any one of a linear shape and a branched shape.

The aryl group in $R^1$ and $R^2$ is preferably an aromatic hydrocarbon group having 6 to 60 carbon atoms and more preferably an aromatic hydrocarbon group having 6 to 20 carbon atoms. Examples of the aromatic hydrocarbon group include a benzene ring, a fluorene ring, a naphthalene ring, and an anthracene ring.

The heteroaryl group in $R^1$ and $R^2$ is preferably an aromatic heterocyclic group having 4 to 60 carbon atoms and more preferably an aromatic heterocyclic group having 4 to 20 carbon atoms. Here, in the heterocyclic ring that forms the aromatic heterocyclic group, at least one carbon atom of a cyclic structure including carbon is substituted with a heteroatom such as an oxygen atom, a sulfur atom, a selenium atom, a nitrogen atom, a phosphorus atom, a boron atom, or a silicon atom, and this cyclic structure has a structure with aromaticity. Examples of this heterocyclic ring include a thiophene ring, a selenophene ring, and a furan ring.

In the aryl alkyl group or the aryloxy group in $R^1$ and $R^2$, an aryl moiety is formed by an aromatic hydrocarbon group, and the number of carbon atoms of this moiety is preferably 6 to 60 and more preferably 6 to 20. In the alkyl moiety in an aryl alkyl group, the number of carbon atoms in the moiety is preferably 1 to 20 and more preferably 1 to 10.

In the heteroaryl alkyl group or the heteroaryloxy group in $R^1$ and $R^2$, a heteroaryl moiety is formed by an aromatic heterocyclic group, and the number of carbon atoms of this moiety is preferably 4 to 60 and more preferably 4 to 20. In the alkyl moiety in a heteroaryl alkyl group, the number of carbon atoms in the moiety is preferably 1 to 20 and more preferably 1 to 10.

Examples of the halogen atom in $R^1$ and $R^2$ include a fluorine atom, a chlorine atom, a bromine atom, and an iodine atom.

Examples of the amino group in $R^1$ and $R^2$ include —$NH_2$ and an alkylamino group (a monoalkylamino group and a dialkylamino group). The number of carbon atoms in a case of an alkylamino group is preferably 2 to 20 and more preferably 2 to 16.

Examples of an alkylsilyl group in $R^1$ and $R^2$ include a monoalkylsilyl group, a dialkylsilyl group, and a trialkylsilyl group. The number of carbon atoms in a case of an alkylsilyl group is preferably 3 to 20 and more preferably 3 to 16.

Among the monovalent groups represented by $R^1$ and $R^2$, in view of improvement of the carrier mobility, a saturated hydrocarbon group is preferable.

s and t each independently represent an integer of 0 to 4, preferably an integer of 1 to 3, more preferably an integer of 1 to 2, and even more preferably 1.

In a case where s or t is 2 or greater, a plurality of $R^1$'s or a plurality of $R^2$'s may be identical to or different from each other.

(Suitable Aspect a of Specific Low Molecular Weight Compound)

The specific low molecular weight compound preferably has a structure represented by Formula (2A) as a partial structure. Accordingly, the threshold voltage and the hysteresis characteristics of the obtainable organic thin film transistor become more excellent.

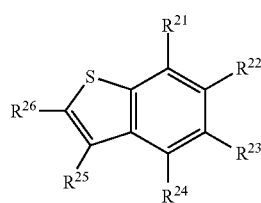

(2A)

$R^{21}$ to $R^{26}$ each independently represent a hydrogen atom or a substituent. Adjacent groups in $R^{21}$ to $R^{26}$ are bonded to each other to form an aromatic hydrocarbon ring or an aromatic heterocyclic ring, in this case, the aromatic hydrocarbon ring or the aromatic heterocyclic ring may be further fused with an aromatic hydrocarbon ring or an aromatic heterocyclic ring.

Here, at least one set of adjacent groups in $R^{21}$ to $R^{24}$ may be bonded to each other, to form an aromatic hydrocarbon ring or an aromatic heterocyclic ring.

The substituent in $R^{21}$ to $R^{26}$ is the same as the monovalent group represented by $R^1$ and $R^2$ of Formula (2), a preferable aspect thereof is also the same, and thus the description thereof is omitted.

Examples of the aromatic hydrocarbon ring formed by bonding adjacent groups in $R^{21}$ to $R^{26}$ to each other include a benzene ring.

Examples of the aromatic heterocyclic ring formed by bonding adjacent groups in $R^{21}$ to $R^{26}$ to each other include a thiophene ring and a selenophene ring.

The expression that adjacent groups in $R^{21}$ to $R^{26}$ are bonded to each other to form an aromatic hydrocarbon ring or an aromatic heterocyclic ring specifically refers to a state in which at least one set of $R^{21}$ or $R^{22}$, $R^{22}$ and $R^{23}$, $R^{23}$ and $R^{24}$, $R^{24}$ and $R^{25}$, $R^{25}$ and $R^{26}$ form an aromatic hydrocarbon ring or an aromatic heterocyclic ring.

The expression that at least one set of adjacent groups in $R^{21}$ to $R^{24}$ is bonded to each other to form an aromatic hydrocarbon ring or an aromatic heterocyclic ring specifically refers to a state in which at least one set of $R^{21}$ and $R^{22}$, $R^{22}$ and $R^{23}$, or $R^{23}$ and $R^{24}$ form an aromatic hydrocarbon ring or an aromatic heterocyclic ring.

It is preferable that $R^{22}$ and $R^{23}$ among $R^{21}$ to $R^{24}$ are bonded to each other to form an aromatic hydrocarbon ring or an aromatic heterocyclic ring.

Among $R^{24}$ to $R^{26}$, it is preferable that $R^{25}$ and $R^{26}$ are bonded to each other to form an aromatic hydrocarbon ring or an aromatic heterocyclic ring.

An aspect in which $R^{22}$ and $R^{23}$ are bonded to each other to form an aromatic hydrocarbon ring or an aromatic heterocyclic ring, and $R^{25}$ and $R^{26}$ are bonded to each other to form an aromatic hydrocarbon ring or an aromatic heterocyclic ring is more preferable. At this point, it is preferable that $R^{21}$ and $R^{24}$ each independently represent a hydrogen atom or a substituent. Accordingly, the threshold voltage and the hysteresis characteristics of the obtainable organic thin film transistor become more excellent.

In a case where adjacent groups in $R^{21}$ to $R^{26}$ are bonded to each other to form an aromatic hydrocarbon ring or an aromatic heterocyclic ring, an aromatic hydrocarbon ring or an aromatic heterocyclic ring may be further fused with an aromatic hydrocarbon ring or an aromatic heterocyclic ring (preferably an aromatic heterocyclic ring).

A ring (that is, an aromatic hydrocarbon ring or an aromatic heterocyclic ring) fused with a ring formed with respect to $R^{21}$ to $R^{26}$ may have a substituent, and the substituent in this case is the same as a monovalent group represented by $R^1$ and $R^2$, and a preferable aspect thereof is also the same.

(Suitable Aspect B of Specific Low Molecular Weight Compound)

The specific low molecular weight compound preferably is a compound represented by Formula (2B). Accordingly, the threshold voltage and the hysteresis characteristics of the obtainable organic thin film transistor become more excellent.

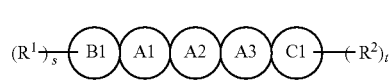

(2B)

In Formula (2B), A1, A2, A3, B1, and C1 each independently represent a benzene ring or a thiophene ring, and adjacent rings are fused with each other. Here, among A1, A2, A3, B1, and C1, 2 to 4 rings are thiophene rings, and a ring other than a thiophene ring is a benzene ring. Here, at least one of A1, A2, or A3 is a thiophene ring.

Here, the expression that adjacent groups in A1, A2, A3, B1, and C1 are fused with each other means that each of B1 and A1, A1 and A2, A2 and A3, and A3 and C1 are fused with each other.

Among A1, A2, A3, B1, and C1, it is preferable that the number of thiophene rings is 2 to 4 and is preferably 3 to 4. Accordingly, the threshold voltage and the hysteresis characteristics of the obtainable organic thin film transistor become more excellent.

Among A1, A2, A3, B1, and C1, it is preferable that a linking number of thiophene rings is preferably 2 or less. Accordingly, the threshold voltage and the hysteresis characteristics of the obtainable organic thin film transistor become more excellent.

Here, the linking number of thiophene rings refers to the number of thiophene rings that are fused and linked. Specifically, in the compound represented by Formula (2B-1), a linking number of thiophene rings is 2 (within the circle in Formula (2B-1)) and, in the compound represented by Formula (2B-2), the linking number of thiophene rings is 3 (within the circle in Formula (2B-2)).

As a more suitable aspect of the compound represented by Formula (2B), in A1, A2, A3, B1, and C1 of Formula (2B), three to four rings are thiophene rings, and the linking number between the thiophene rings is 2 or less. Accordingly, the threshold voltage and the hysteresis characteristics of the obtainable organic thin film transistor become more excellent.

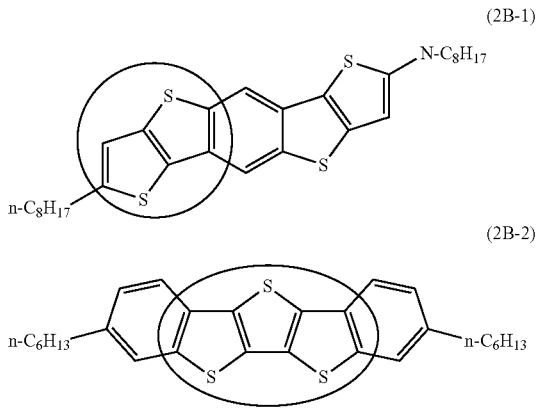

(2B-1)

(2B-2)

$R^1$ and $R^2$ in Formula (2B) are the same as $R^1$ and $R^2$ in Formula (2), and the preferable aspect is also the same.

s and t in Formula (2B) are the same as s and t in Formula (2), and the preferable aspect is also the same.

Specific examples of the specific low molecular weight compound are provided below.

—Compound Represented by Formula O-4—

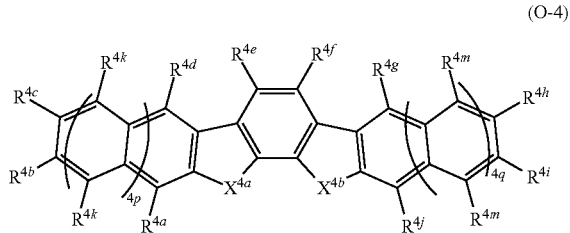

(O-4)

In Formula O-4, $X^{4a}$ and $X^{4b}$ each independently represent an O atom, a S atom, a Se atom, or $NR^{4n}$, 4p and 4q each independently represent an integer of 0 to 2, and $R^{4a}$ to $R^{4k}$ and $R^{4m}$ and $R^{4n}$ each independently represent a hydrogen atom or a substituent. Examples of the substituent include a substituent X.

It is preferable that $X^{4a}$ and $X^{4b}$ each independently represent an O atom or a S atom, and it is more preferable that at least one of $X^{4a}$ or $X^{4b}$ is a S atom, in view of increasing mobility. It is preferable that $X^{4a}$ and $X^{4b}$ are the same linking groups. It is particularly preferable that both of $X^{4a}$ and $X^{4b}$ are S atoms.

In Formula O-4, 4p and 4q each independently represent an integer of 0 to 2. In view of compatibility between mobility and solubility, 4p and 4q each independently and preferably represent 0 or 1 and more preferably represent 4p=4q=0 or 4p=4q=1.

In the compound represented by Formula O-4, among $R^{4a}$ to $R^{4k}$ and $R^{4m}$, in view of increasing the mobility and increasing solubility to an organic solvent, the number of groups represented by Formula W is preferably 1 to 4, more preferably 1 or 2, and particularly preferably 2.

Among $R^{4a}$ to $R^{4k}$ and $R^{4m}$, a position of the group represented by Formula W is not particularly limited. Among these, according to the present invention, it is preferable that, in Formula O-4, $R^{4a}$, $R^{4d}$ to $R^{4g}$, $R^{4j}$, $R^{4k}$, and $R^{4m}$ each independently represent a hydrogen atom or a halogen atom, $R^{4b}$, $R^{4c}$, $R^{4h}$, and $R^{4i}$ each independently represent a hydrogen atom, a halogen atom, or a group represented by Formula W, and at least one of $R^{4b}$, $R^{4c}$, $R^{4h}$, or $R^{4i}$ is a group represented by Formula W, in view of increasing mobility and increasing solubility to an organic solvent.

According to the present invention, it is more preferable that $R^{4a}$, $R^{4c}$ to $R^{4h}$, and $R^{4j}$ each independently represent a hydrogen atom or a halogen atom, $R^{4b}$ and $R^{4i}$ each independently represent a hydrogen atom, a halogen atom, or a group represented by Formula W, and at least one is more preferably a group represented by Formula W.

According to the present invention, it is even more preferable that both of $R^{4b}$ and $R^{4i}$ are groups represented by Formula W, and both of $R^{4c}$ and $R^{4h}$ are hydrogen atoms or halogen atoms, or both of $R^{4c}$ and $R^{4h}$ are groups represented by Formula W, and both of $R^{4b}$ and $R^{4i}$ are hydrogen atoms or halogen atoms.

According to the present invention, it is particularly preferable that both of $R^{4b}$ and $R^{4i}$ are groups represented by Formula W and both of $R^{4c}$ and $R^{4h}$ are hydrogen atoms or halogen atoms, or both of $R^{4c}$ and $R^{4h}$ are groups represented by Formula W and both of $R^{4b}$ and $R^{4i}$ are hydrogen atoms or halogen atoms.

In Formula O-4, two or more of $R^{4a}$ to $R^{4k}$ and $R^{4m}$ may or may not be bonded to each other to form rings, but it is preferable that two or more of $R^{4a}$ to $R^{4k}$ and $R^{4m}$ are not bonded to each other to form rings.

Types of the substituent are not particularly limited, but examples thereof include the substituent X described below. Examples of the substituent X include a group represented by Formula W, a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group (also referred to as a heterocyclic group), a cyano group, a hydroxy group, a nitro group, a carboxy group, an alkoxy group, an aryloxy group, a silyloxy group, a heterocyclic oxy group, acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl and arylsulfonylamino group, a mercapto group, an alkylthio group, an arylthio group, a heterocyclic thio group, a sulfamoyl group, a sulfo group, an alkyl and arylsulfinyl group, an alkyl and arylsulfonyl group, an acyl group, an aryloxycarbonyl group, an alkoxycarbonyl group, a carbamoyl group, an aryl and heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), and a sulfato group (—OSO$_3$H). The substituent X may further have a substituent.

It is preferable that the substituent is a substituent represented by Formula W.

$-L^W-R^W$                 (W)

In Formula W, $L^W$ represents a divalent linking group represented by any one of Formulae L-1 to L-25 or a divalent linking group obtained by bonding two or more divalent linking groups represented by any one of Formulae L-1 to L-25, and $R^W$ represents an alkyl group, a cyano group, a vinyl group, an ethynyl group, an oxyethylene group, an oligooxyethylene group in which the repeating number v of the oxyethylene unit is 2 or more, a siloxane group, an oligosiloxane group having 2 or more silicon atoms, or a trialkylsilyl group.

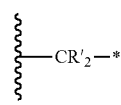 (L-1)

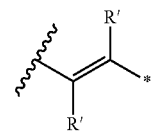 (L-2)

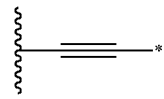 (L-3)

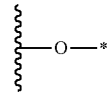 (L-4)

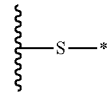 (L-5)

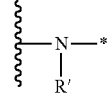 (L-6)

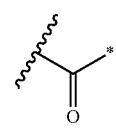 (L-7)

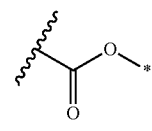 (L-8)

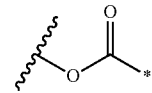 (L-9)

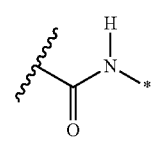 (L-10)

-continued

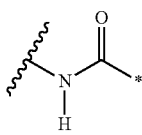 (L-11)

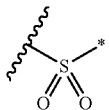 (L-12)

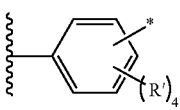 (L-13)

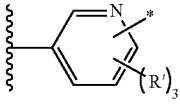 (L-14)

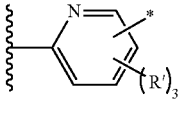 (L-15)

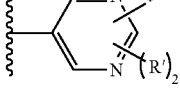 (L-16)

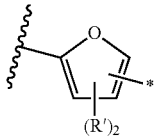 (L-17)

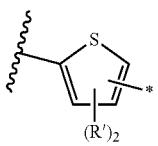 (L-18)

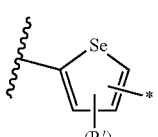 (L-19)

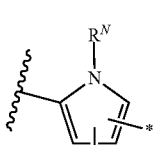 (L-20)

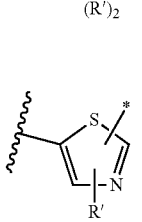 (L-21)

-continued

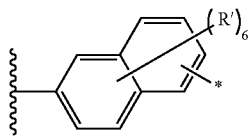
(L-22)

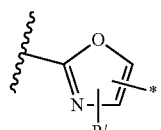
(L-23)

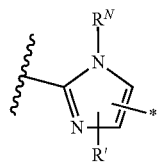
(L-24)

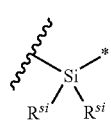
(L-25)

In Formulae L-1 to L-25, * represents a bonding site to $R^W$, a wavy line portion represents the other bonding site, R' in Formulae L-1, L-2, L-6, and L-13 to L-24 each independently represent a hydrogen atom or a substituent, $R^N$ represents a hydrogen atom or a substituent, and $R^{si}$ each independently represent a hydrogen atom, an alkyl group, an alkenyl group, an alkynyl group, or an aryl group.

—Compound Represented by Formula O-6—

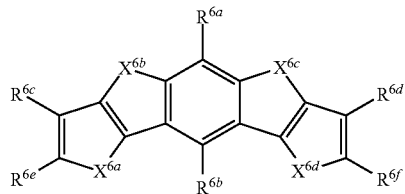
(O-6)

In Formula O-6, $X^{6a}$ to $X^{6d}$ each independently represent a S atom, an O atom, a Se atom, or $NR^{6g}$, and $R^{6a}$ to $R^{6g}$ each independently represent a hydrogen atom or a substituent. Examples of the substituent include the substituent X.

It is preferable that $X^{6a}$ to $X^{6d}$ each independently represent an O atom or a S atom, in view of easiness of synthesis. Meanwhile, it is preferable that at least one of $X^{6a}$ to $X^{6d}$ is a S atom, in view of increasing mobility. It is preferable that $X^{6a}$ to $X^{6d}$ are the same linking groups. It is preferable that all of $X^{6a}$ to $X^{6d}$ are S atoms.

$R^{6g}$ is preferably a hydrogen atom, an alkyl group, an alkenyl group, an alkynyl group, an acyl group, an aryl group, or a heteroaryl group, more preferably a hydrogen atom, an alkyl group, an alkenyl group, an alkynyl group, or an acyl group, even more preferably a hydrogen atom or an alkyl group, particularly preferably an alkyl group having 1 to 14 carbon atoms, and most preferably an alkyl group having 1 to 4 carbon atoms.

In a case where $R^{6g}$ is an alkyl group, $R^{6g}$ may be a linear alkyl group, a branched alkyl group, or a cyclic alkyl group, but is preferably a linear alkyl group, in view of increasing linearity of molecules and increasing mobility.

In Formula O-6, as the substituent that $R^{6a}$ to $R^{6f}$ may each independently represent, an alkyl group, an aryl group, an alkenyl group, an alkynyl group, a heterocyclic ring group, an alkoxy group, an alkylthio group, or a group represented by Formula W is preferable, an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic ring group having 5 to 12 carbon atoms, an alkylthio group having 1 to 12 carbon atoms, or a group represented by Formula W is more preferable, and a group having a chain length of a linking group of 3.7 Å or less or a group represented by Formula W is even more preferable, and a group represented by Formula W is particularly preferable.

According to the present invention, a chain length of a linking group refers to a length from a C atom to a terminal of a substituent R in a C (carbon atom)-R bond. Structural optimization calculation may be performed by using a density functional theory (Gaussian 03 (US Gaussian, Inc.)/basis function: 6-31G*, exchange correlation functional: B3LYP/LANL2DZ). With respect to molecular lengths of representative substituents, that of a propyl group is 4.6 Å, that of a pyrrole group is 4.6 Å, that of a propynyl group is 4.5 Å, that of a propenyl group is 4.6 Å, that of an ethoxy group is 4.5 Å, that of a methylthio group is 3.7 Å, that of an ethenyl group is 3.4 Å, that of an ethyl group is 3.5 Å, that of an ethynyl group is 3.6 Å, that of a methoxy group is 3.3 Å, that of a methyl group is 2.1 Å, and that of a hydrogen atom is 1.0 Å.

In the compound represented by Formula O-6, among $R^{6a}$ to $R^{6f}$, in view of increasing the mobility and increasing solubility to an organic solvent, the number of groups represented by Formula W is preferably 1 to 4, more preferably 1 or 2, and particularly preferably 2.

Among $R^{6a}$ to $R^{6f}$, the position of a group represented by Formula W is not particularly limited, but the position is preferably $R^{6c}$ to $R^{6f}$ in view of increasing mobility and increasing solubility to an organic solvent and is more preferably $R^{6e}$ or $R^{6f}$.

Among $R^{6a}$ to $R^{6f}$, the number of substituents other than the groups represented by Formula W is preferably 0 to 4, more preferably 0 or 2, even more preferably 0 or 1, and particularly preferably 0. The substituent in a case where $R^{6a}$ to $R^{6f}$ are substituents other than the group represented by Formula W is preferably a group in which a chain length of a linking group is 3.7 Å or less, more preferably a group in which a chain length of a linking group is 1.0 to 3.7 Å, and even more preferably a group in which a chain length of a linking group is 1.0 to 2.1 Å. The definition of the chain length of a linking group is as described above.

The substituents in a case where $R^{6a}$ to $R^{6f}$ are substituents other than the group represented by Formula W each independently and preferably represent a substituted or unsubstituted alkyl group having 2 or less carbon atoms, a substituted or unsubstituted alkynyl group having 2 or less carbon atoms, a substituted or unsubstituted alkenyl group having 2 or less carbon atoms, or a substituted or unsubstituted acyl group having 2 or less carbon atoms and more preferably a substituted or unsubstituted alkyl group having 2 or less carbon atoms.

In a case where the substituent in a case where $R^{6a}$ to $R^{6f}$ are substituents other than the group represented by Formula W each independently represent a substituted alkyl group having 2 or less carbon atoms, examples of the substituent that may be included in an alkyl group include a cyano group, a fluorine atom, and a heavy hydrogen atom, and a cyano group is preferable. The substituted or unsubstituted alkyl group having 2 or less carbon atoms which is represented by the substituent in a case of being a substituent other than the group represented by Formula W is preferably a methyl group, an ethyl group, or a cyano group-substituted methyl group, more preferably a methyl group or a cyano group-substituted methyl group, and particularly preferably a cyano group-substituted methyl group.

In a case where the substituent in a case where $R^{6a}$ to $R^{6f}$ are substituents other than the group represented by Formula W each independently represent a substituted alkynyl group having 2 or less carbon atoms, examples of the substituent that may be included in an alkynyl group include a heavy hydrogen atom. Examples of the substituted or unsubstituted alkynyl group having 2 or less carbon atoms represented by the substituent in a case of being the substituent other than the group represented by Formula W include an ethynyl group and a heavy hydrogen atom-substituted acetylene group, and an ethynyl group is preferable.

In a case where the substituent in a case where $R^{6a}$ to $R^{6f}$ are substituents other than the group represented by Formula W each independently represent a substituted alkenyl group having 2 or less carbon atoms, examples of the substituent that may be included in an alkenyl group include a heavy hydrogen atom. Examples of the substituted or unsubstituted alkenyl group having 2 or less carbon atoms which is represented by the substituent in a case of being a substituent other than the group represented by Formula W include an ethenyl group and a heavy hydrogen atom-substituted ethenyl group, and an ethenyl group is preferable.

In a case where the substituents in a case where $R^{6a}$ to $R^{6f}$ are substituents other than the group represented by Formula W each independently represent a substituted acyl group having 2 or less carbon atoms, examples of the substituent that may be included in an acyl group include a fluorine atom. Examples of the substituted or unsubstituted acyl group having 2 or less carbon atoms represented by the substituent in a case of being the substituent other than the group represented by Formula W include a formyl group, an acetyl group, and a fluorine-substituted acetyl group, and a formyl group is preferable.

The compound represented by Formula O-6 is preferably a compound represented by Formula O-6A or O-6B and particularly preferably a compound represented by Formula O-6A, in view of high mobility.

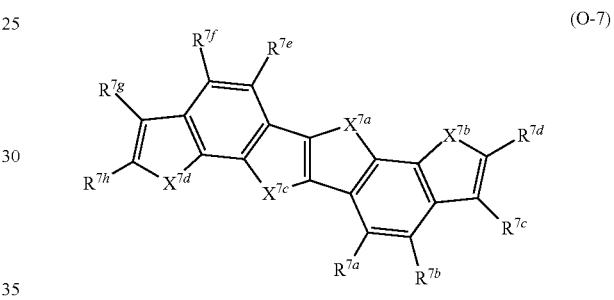

In Formula O-6A, $X^{6a}$ to $X^{6d}$ each independently represent an O atom or a S atom, $R^{6a}$ to $R^{6c}$, $R^{6A}$, and $R^{6e}$ each independently represent a hydrogen atom or a substituent, $R^{6a}$ to $R^{6c}$, $R^{6A}$, and $R^{6e}$ are not the group represented by Formula W, $R^W$ represents an alkyl group having 5 to 19 carbon atoms, and $L^W$ represents a divalent linking group represented by any one of Formulae L-1 to L-25 or a divalent linking group obtained by bonding two or more divalent linking groups represented by any one of Formulae L-1 to L-25.

In Formula O-6B, $X^{6a}$ to $X^{6d}$ each independently represent an O atom or a S atom, $R^{6a}$, $R^{6b}$, $R^{6B}$, and $R^{6C}$ each independently represent a hydrogen atom or a substituent, $R^W$'s each independently represent an alkyl group having 5 to 19 carbon atoms, $L^W$'s each independently represent a divalent linking group represented by any one of Formulae L-1 to L-25 or a divalent linking group obtained by bonding two or more divalent linking groups represented by any one of Formulae L-1 to L-25.

Examples of the substituent include the substituent described above.

—Compound Represented by Formula O-7—

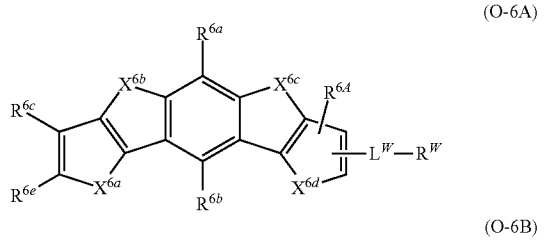

In Formula O-7, $X^{7a}$ to $X^{7d}$ each independently represent a S atom, an O atom, a Se atom, or $NR^{7i}$, and $R^{7a}$ to $R^{7i}$ each independently represent a hydrogen atom or a substituent. Examples of the substituent include the substituent X.

It is preferable that $X^{7a}$ to $X^{7d}$ each independently represent an O atom or a S atom, in view of easiness of synthesis. Meanwhile, it is preferable that at least one of $X^{7a}$ to $X^{7d}$ is a S atom, in view of increasing mobility. It is preferable that $X^{7a}$ to $X^{7d}$ are the same linking groups. It is preferable that all of $X^{7a}$ to $X^{7d}$ are S atoms.

In Formula O-7, examples of the substituent represented by $R^{7a}$ to $R^{7i}$ include the substituent X. The definition of the group represented by Formula W is as described above.

$R^{7i}$ is preferably a hydrogen atom or an alkyl group, more preferably an alkyl group having 5 to 12 carbon atoms, and particularly preferably an alkyl group having 8 to 10 carbon atoms.

In a case where $R^{7i}$ represents an alkyl group, $R^{7i}$ may be a linear alkyl group, a branched alkyl group, or a cyclic alkyl group, but is preferably a linear alkyl group, in view of overlapping HOMO orbits.

In the compound represented by Formula O-7, among $R^{7a}$ to $R^{7i}$, in view of increasing the mobility and increasing solubility to an organic solvent, the number of substituents represented by Formula W is preferably 1 to 4, more preferably 1 or 2, and particularly preferably 2.

Among $R^{7a}$ to $R^{7i}$, the position of a group represented by Formula W is not particularly limited, but the position is preferably $R^{7d}$ or $R^{7h}$ in view of increasing mobility and increasing solubility to an organic solvent and is more preferably $R^{7d}$ or $R^{7h}$.

Among $R^{7a}$ to $R^{7i}$ of Formula O-7, the number of substituents other than the groups represented by Formula W is preferably 0 to 4, more preferably 0 or 2, even more preferably 0 or 1, and particularly preferably 0.

The substituent in a case where $R^{7a}$ to $R^{7i}$ are substituents other than the group represented by Formula W is preferably a group in which a chain length of a linking group is 3.7 Å or less, more preferably a group in which a chain length of a linking group is 1.0 to 3.7 Å, and even more preferably a group in which a chain length of a linking group is 1.0 to 2.1 Å. The definition of the chain length of a linking group is as described above.

The substituents in a case where $R^{7a}$ to $R^{7i}$ are substituents other than the group represented by Formula W each independently and preferably represent a substituted or unsubstituted alkyl group having 2 or less carbon atoms, a substituted or unsubstituted alkynyl group having 2 or less carbon atoms, a substituted or unsubstituted alkenyl group having 2 or less carbon atoms, or a substituted or unsubstituted acyl group having 2 or less carbon atoms and more preferably a substituted or unsubstituted alkyl group having 2 or less carbon atoms.

In a case where the substituent in a case where $R^{7a}$ to $R^{7i}$ are substituents other than the group represented by Formula W each independently represent a substituted alkyl group having 2 or less carbon atoms, examples of the substituent that may be included in an alkyl group include a cyano group, a fluorine atom, and a heavy hydrogen atom, and a cyano group is preferable. The substituted or unsubstituted alkyl group having 2 or less carbon atoms which is represented by the substituent in a case of being a substituent other than the group represented by Formula W is preferably a methyl group, an ethyl group, or a cyano group-substituted methyl group, more preferably a methyl group or a cyano group-substituted methyl group, and particularly preferably a cyano group-substituted methyl group.

In a case where the substituent in a case where $R^{7a}$ to $R^{7i}$ are substituents other than the group represented by Formula W each independently represent a substituted alkynyl group having 2 or less carbon atoms, examples of the substituent that may be included in an alkynyl group include a heavy hydrogen atom. Examples of the substituted or unsubstituted alkynyl group having 2 or less carbon atoms represented by the substituent in a case of being the substituent other than the substituent represented by Formula W include an ethynyl group and a heavy hydrogen atom-substituted acetylene group, and an ethynyl group is preferable.

In a case where the substituent in a case where $R^{7a}$ to $R^{7i}$ are substituents other than the group represented by Formula W each independently represent a substituted alkenyl group having 2 or less carbon atoms, examples of the substituent that may be included in an alkenyl group include a heavy hydrogen atom. Examples of the substituted or unsubstituted alkenyl group having 2 or less carbon atoms which is represented by the substituent in a case of being a substituent other than the substituent represented by Formula W include an ethenyl group and a heavy hydrogen atom-substituted ethenyl group, and an ethenyl group is preferable.

In a case where the substituents in a case where $R^{7a}$ to $R^{7i}$ are substituents other than the group represented by Formula W each independently represent a substituted acyl group having 2 or less carbon atoms, examples of the substituent that may be included in an acyl group include a fluorine atom. Examples of the substituted or unsubstituted acyl group having 2 or less carbon atoms represented by the substituent in a case of being the substituent other than the substituent represented by Formula W include a formyl group, an acetyl group, and a fluorine-substituted acetyl group, and a formyl group is preferable.

The compound represented by Formula O-7 is preferably a compound represented by Formula O-7A or O-7B and particularly preferably a compound represented by Formula O-7B, in view of high mobility.

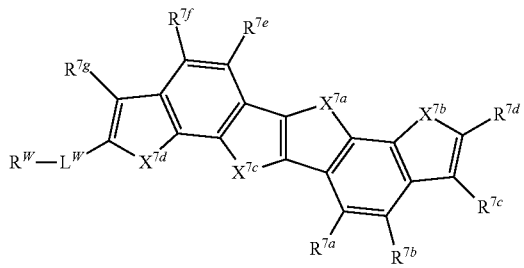

(O-7A)

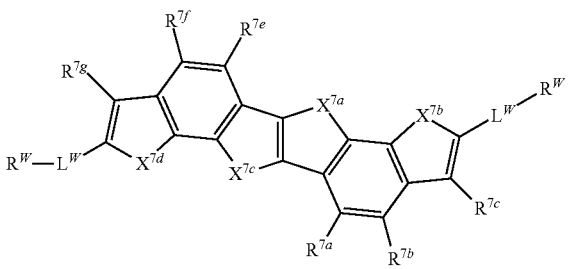

(O-7B)

In Formula O-7A, $X^{7a}$ and $X^{7c}$ each independently represent a S atom, an O atom, a Se atom, or NR9, $X^{7b}$ and $X^{7d}$ each independently represent a S atom, an O atom, or a Se atom, $R^{7a}$ to $R^{7g}$ and $R^{7i}$ each independently represent a hydrogen atom or a substituent, and, here, $R^{7d}$ is not the group represented by Formula W. The definitions of $L^W$ and $R^W$ in Formula O-7A are the same as $L^W$ and $R^W$ in Formula W, respectively.

In Formula O-7B, $X^{7a}$ and $X^{7c}$ each independently represent a S atom, an O atom, a Se atom, or NR$^{7i}$, $X^{7b}$ and $X^{7d}$ each independently represent a S atom, an O atom, or a Se atom, $R^{7a}$ to $R^{7c}$, $R^{7e}$ to $R^{7g}$, and $R^{7i}$ each independently represent a hydrogen atom or a substituent, and the definitions of $L^W$ and $R^W$ in Formula O-7B are the same as $L^W$ and $R^W$ in Formula W. In Formula O-7B, two of $L^W$'s and two of $R^W$'s may be identical to or different from each other.

—Compound Represented by Formula O-8—

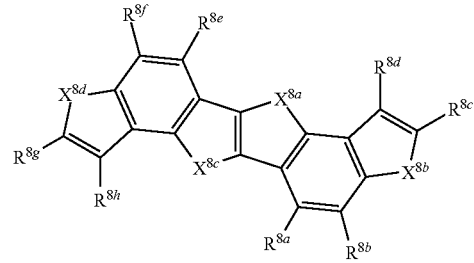

(O-8)

In Formula O-8, $X^{8a}$ to $X^{8d}$ each independently represent a S atom, an O atom, a Se atom, or NR$^{8i}$, and $R^{8a}$ to $R^{8i}$ each independently represent a hydrogen atom or a substituent. Examples of the substituent include the substituent X.

It is preferable that $X^{8a}$ to $X^{8d}$ each independently represent an O atom or a S atom, in view of easiness of synthesis. Meanwhile, it is preferable that at least one of $X^{8a}$ to $X^{8d}$ is a S atom, in view of increasing mobility. It is preferable that $X^{8a}$ to $X^{8d}$ are the same linking groups. It is preferable that all of $X^{8a}$ to $X^{8d}$ are S atoms.

In Formula O-8, examples of the substituent represented by $R^{8a}$ to $R^{8i}$ include the substituent X described above. The definition of the group represented by Formula W is as described above.

$R^{8i}$ is preferably a hydrogen atom or an alkyl group, more preferably an alkyl group having 5 to 12 carbon atoms, and particularly preferably an alkyl group having 8 to 10 carbon atoms.

In a case where $R^{8i}$ represents an alkyl group, $R^{8i}$ may be a linear alkyl group, a branched alkyl group, or a cyclic alkyl group, but is preferably a linear alkyl group, in view of overlapping HOMO orbits.

In the compound represented by Formula O-8, among $R^{8a}$ to $R^{8i}$, in view of increasing the mobility and increasing solubility to an organic solvent, the number of substituents represented by Formula W is preferably 1 to 4, more preferably 1 or 2, and particularly preferably 2.

Among $R^{8a}$ to $R^{8i}$, the position of a group represented by Formula W is not particularly limited, but the position is preferably $R^{8c}$ or $R^{8g}$ in view of increasing mobility and increasing solubility to an organic solvent and is more preferably $R^{8c}$ or $R^{8g}$.

Among $R^{8a}$ to $R^{8i}$ of Formula O-8, the number of substituents other than the groups represented by Formula W is preferably 0 to 4, more preferably 0 or 2, even more preferably 0 or 1, and particularly preferably 0.

The substituent in a case where $R^{8a}$ to $R^{8i}$ are substituents other than the group represented by Formula W is preferably a group in which a chain length of a linking group is 3.7 Å or less, more preferably a group in which a chain length of a linking group is 1.0 to 3.7 Å, and even more preferably a group in which a chain length of a linking group is 1.0 to 2.1 Å. The definition of the chain length of a linking group is as described above.

The substituents in a case where $R^{8a}$ to $R^{8i}$ are substituents other than the group represented by Formula W each independently and preferably represent a substituted or unsubstituted alkyl group having 2 or less carbon atoms, a substituted or unsubstituted alkynyl group having 2 or less carbon atoms, a substituted or unsubstituted alkenyl group having 2 or less carbon atoms, or a substituted or unsubstituted acyl group having 2 or less carbon atoms and more preferably a substituted or unsubstituted alkyl group having 2 or less carbon atoms.

In a case where the substituent in a case where $R^{8a}$ to $R^{8i}$ are substituents other than the group represented by Formula W each independently represent a substituted alkyl group having 2 or less carbon atoms, examples of the substituent that may be included in an alkyl group include a cyano group, a fluorine atom, and a heavy hydrogen atom, and a cyano group is preferable. The substituted or unsubstituted alkyl group having 2 or less carbon atoms which is represented by the substituent in a case of being a substituent other than the group represented by Formula W is preferably a methyl group, an ethyl group, or a cyano group-substituted methyl group, more preferably a methyl group or a cyano group-substituted methyl group, and particularly preferably a cyano group-substituted methyl group.

In a case where the substituent in a case where $R^{8a}$ to $R^{8i}$ are substituents other than the group represented by Formula W each independently represent a substituted alkynyl group having 2 or less carbon atoms, examples of the substituent that may be included in an alkynyl group include a heavy hydrogen atom. Examples of the substituted or unsubstituted alkynyl group having 2 or less carbon atoms represented by the substituent in a case of being the substituent other than the group represented by Formula W include an ethynyl group and a heavy hydrogen atom-substituted acetylene group, and an ethynyl group is preferable.

In a case where the substituent in a case where $R^{8a}$ to $R^{8i}$ are substituents other than the group represented by Formula W each independently represent a substituted alkenyl group having 2 or less carbon atoms, examples of the substituent that may be included in an alkenyl group include a heavy hydrogen atom. Examples of the substituted or unsubstituted alkenyl group having 2 or less carbon atoms which is represented by the substituent in a case of being a substituent other than the group represented by Formula W include an ethenyl group and a heavy hydrogen atom-substituted ethenyl group, and an ethenyl group is preferable.

In a case where the substituents in a case where $R^{8a}$ to $R^{8i}$ are substituents other than the group represented by Formula W each independently represent a substituted acyl group having 2 or less carbon atoms, examples of the substituent that may be included in an acyl group include a fluorine atom. Examples of the substituted or unsubstituted acyl group having 2 or less carbon atoms represented by the substituent in a case of being the substituent other than the group represented by Formula W include a formyl group, an acetyl group, and a fluorine-substituted acetyl group, and a formyl group is preferable.

The compound represented by Formula O-8 is preferably a compound represented by Formula O-8A or O-8B and particularly preferably a compound represented by Formula O-8B, in view of high mobility.

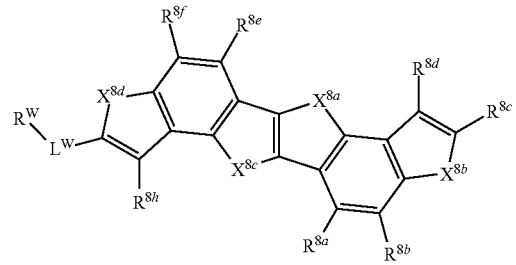

(O-8A)

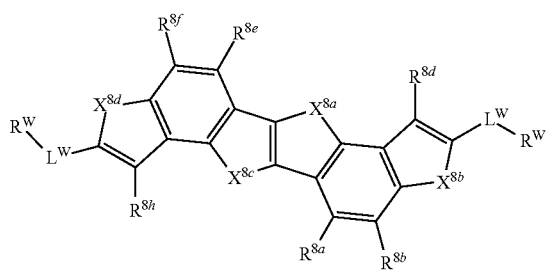

(O-8B)

In Formula O-8A, $X^{8a}$ and $X^{8c}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8f}$ and $R^{8h}$ each independently represent a hydrogen atom or a substituent, and, here, $R^{8c}$ is not the group represented by Formula W. The definitions of $L^W$ and $R^W$ in Formula O-8A are the same as $L^W$ and $R^W$ in Formula W, respectively.

In Formula O-8B, $X^{8a}$ and $X^{8c}$ each independently represent a S atom, an O atom, a Se atom, or $NR^{8i}$, $X^{8b}$ and $X^{8d}$ each independently represent a S atom, an O atom, or a Se atom, $R^{8a}$, $R^{8b}$, $R^{8d}$ to $R^{8f}$, and $R^{8h}$ each independently represent a hydrogen atom or a substituent, and the definitions of $L^W$ and $R^W$ in Formula O-8B are the same as $L^W$ and $R^W$ in Formula W. In Formula O-8B, two of $L^W$'s and two of $R^W$'s may be identical to or different from each other.

—Compound Represented by Formula O-9—

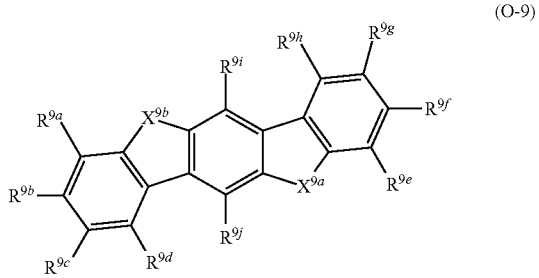

(O-9)

In Formula O-9, $X^{9a}$ to $X^{9b}$ each independently represent a S atom, an O atom, a Se atom, or $NR^{9k}$, and $R^{9c}$ to $R^{9k}$ each independently represent a hydrogen atom or a substituent. Examples of the substituent include the substituent X described above.

In view of mobility, it is preferable that $X^{9a}$ and $X^{9b}$ is a S atom.

In Formula O-9, it is preferable that $R^{9c}$, $R^{9d}$, and $R^{9g}$ to $R^{9j}$ each independently represent a hydrogen atom, a halogen atom, or a group represented by Formula W. Among these, it is more preferable that $R^{9c}$, $R^{9d}$, and $R^{9g}$ to $R^{9j}$ are hydrogen atoms.

$L^W$ is preferably Formulae L-3, L-5, L-7 to L-9, and L-12 to L-24 and more preferably the group represented by any one of Formulae L-3, L-5, L-13, L-17, and L-18.

At least one of $R^{9a}$ to $R^{9i}$ is preferably the group represented by Formula W.

In the compound represented by Formula O-9, among $R^{9a}$ to $R^{9i}$, in view of increasing the mobility and increasing solubility to an organic solvent, the number of substituents represented by Formula W is preferably 1 to 4, more preferably 1 or 2, and particularly preferably 2.

Among $R^{9a}$ to $R^{9i}$, the position of a group represented by Formula W is not particularly limited, but the position is preferably $R^{9b}$ or $R^{9f}$ in view of increasing mobility and increasing solubility to an organic solvent and is more preferably $R^{9b}$ or $R^{9f}$.

Among $R^{9a}$ to $R^{9i}$ of Formula O-9, the number of substituents other than the groups represented by Formula W is preferably 0 to 4, more preferably 0 or 2, even more preferably 0 or 1, and particularly preferably 0.

—Compound Represented by Formula O-10—

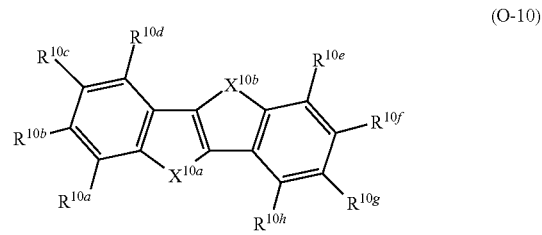

(O-10)

In Formula O-10, $X^{10a}$ to $X^{10b}$ each independently represent a S atom, an O atom, a Se atom, or $NR^{10i}$, and $R^{10a}$ to $R^{10i}$ each independently represent a hydrogen atom or a substituent. Examples of the substituent include the substituent X described above.

In view of mobility, it is preferable that $X^{10a}$ and $X^{10b}$ is a S atom.

In Formula O-10, it is preferable that at least one of $R^{10a}$ to $R^{10h}$ is a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group.

With respect to $R^{10a}$ to $R^{10h}$ of Formula O-10, it is preferable that at least one of $R^{10b}$ or $R^{10f}$ is a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, it is more preferable that at least one of $R^{10b}$ or $R^{10f}$ is a substituted or unsubstituted alkyl group, a substituted or unsubstituted arylthio group, or a substituted or unsubstituted heteroarylthio group, it is even more preferable that all of $R^{10b}$ and $R^{10f}$ are substituted or unsubstituted alkyl groups, substituted or unsubstituted arylthio groups, or substituted or unsubstituted heteroarylthio groups, and it is particularly preferable that all of $R^{10b}$ and $R^{10f}$ are substituted or unsubstituted alkyl groups, substituted or unsubstituted phenylthio groups, or heteroarylthio groups.

The alkyl group is more preferably an alkyl group having 5 to 20 carbon atoms and particularly preferably an alkyl group having 8 to 12 carbon atoms.

The arylthio group is preferably a group in which a sulfur atom is linked to an aryl group having 6 to 20 carbon atoms, more preferably a naphthylthio group or a phenylthio group, and particularly preferably a phenylthio group.

The heteroarylthio group is preferably a group in which a sulfur atom linked to a heteroaryl group of a 3-membered to 10-membered ring, more preferably a group in which a sulfur atom is linked to a heteroaryl group of a 5-membered or 6-membered ring, and particularly preferably a group A.

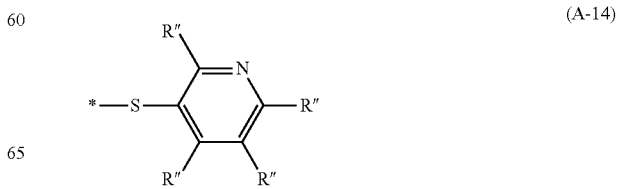

(A-14)

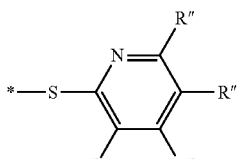
(A-15)

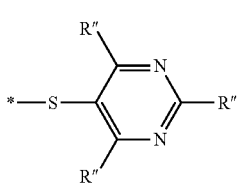
(A-16)

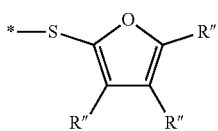
(A-17)

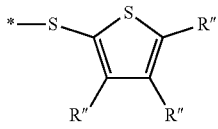
(A-18)

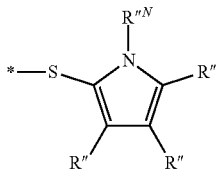
(A-20)

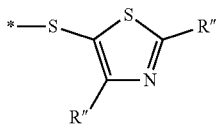
(A-21)

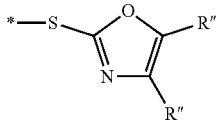
(A-23)

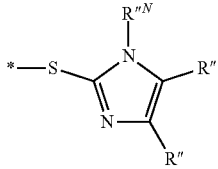
(A-24)

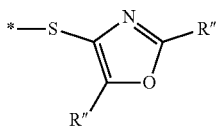
(A-26)

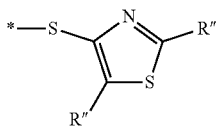
(A-27)

In the group A, R" and $R''^N$ each independently represent a hydrogen atom or a substituent.

In the group A, it is preferable that R"'s each independently represent a hydrogen atom or a group represented by Formula W.

In the group A, $R''^N$ preferably represents a substituent, more preferably an alkyl group, an aryl group, or a heteroaryl group, more preferably an alkyl group, an aryl group substituted with an alkyl group, or a heteroaryl group substituted with an alkyl group, and particularly preferably an alkyl group having 1 to 4 carbon atoms, a phenyl group substituted with an alkyl group having 1 to 4 carbon atoms or a 5-membered heteroaryl group substituted with an alkyl group having 1 to 4 carbon atoms.

The alkyloxycarbonyl group is preferably a group in which a carbonyl group is linked to an alkyl group having 1 to 20 carbon atoms. The number of carbon atoms of the alkyl group is more preferably 2 to 15 and particularly preferably 5 to 10.

The aryloxycarbonyl group is preferably a group in which a carbonyl group is linked to an aryl group having 6 to 20 carbon atoms. The number of carbon atoms of the aryl group is more preferably 6 to 15 and particularly preferably 8 to 12.

The alkylamino group is preferably a group in which an amino group is linked to an alkyl group having 1 to 20 carbon atoms. The number of carbon atoms of the alkyl group is more preferably 2 to 15 and particularly preferably 5 to 10.

Among $R^{10a}$ to $R^{10h}$, the number of substituents (hereinafter, referred to as other substituents) other than a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group is preferably 0 to 4, more preferably 0 to 2, particularly preferably 0 or 1, and more particularly preferably 0.

—Compound Represented by Formula O-11—

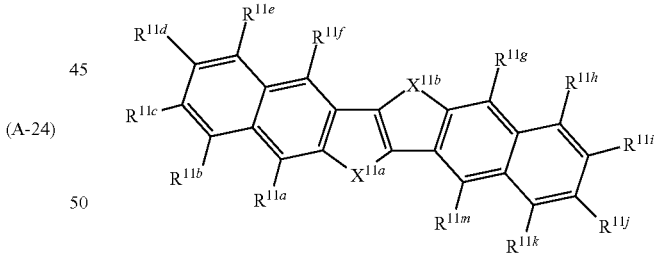

(O-11)

In Formula O-11, $X^{11a}$ to $X^{11b}$ each independently represent a S atom, an O atom, a Se atom, or $NR^{11n}$, and $R^{11a}$ to $R^{11k}$, $R^{11m}$, and $R^{11n}$ each independently represent a hydrogen atom or a substituent. Examples of the substituent include the substituent X described above.

In Formula O-11, it is preferable that at least one of $X^{11a}$ to $X^{11b}$ is a S atom, in view of increasing mobility. It is preferable that $X^{11a}$ and $X^{11b}$ are the same linking groups. It is preferable that all of $X^{11a}$ and $X^{11b}$ are S atoms.

With respect to $R^{11a}$ to $R^{11k}$ and $R^{11m}$ of Formula O-11, it is preferable that at least one of $R^{11c}$ or $R^{11i}$ is a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, it is more preferable that at least one of $R^{11c}$ or $R^{11i}$ is a substituted or unsubstituted alkyl group, and it is even more preferable that all of $R^{11c}$ and $R^{11i}$ is substituted or unsubstituted alkyl groups.

—Compound Represented by Formula O-12—

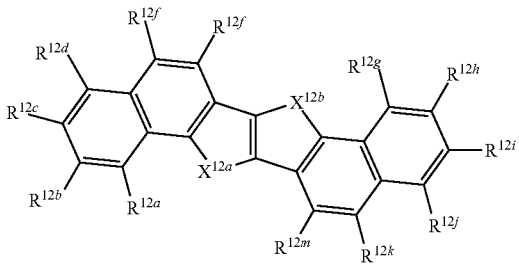

(O-12)

In Formula O-12, $X^{12a}$ and $X^{12b}$ each independently represent a S atom, an O atom, a Se atom or $NR^{12n}$, $R^{12a}$ to $R^{12k}$, $R^{12m}$, and $R^{12n}$ each independently represent a hydrogen atom or a substituent. Examples of the substituent include the substituent X described above.

In Formula O-12, it is preferable that at least one of $X^{12a}$ to $X^{12b}$ is a S atom, in view of increasing mobility. It is preferable that $X^{12a}$ and $X^{12b}$ are the same linking groups. It is preferable that all of $X^{12a}$ and $X^{12b}$ are S atoms.

With respect to $R^{12a}$ to $R^{12k}$ and $R^{12m}$ of Formula O-12, it is preferable that at least one of $R^{12c}$ or $R^{12i}$ is a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, it is more preferable that at least one of $R^{12c}$ or $R^{12i}$ is a substituted or unsubstituted alkyl group, and it is even more preferable that all of $R^{12c}$ and $R^{12i}$ is substituted or unsubstituted alkyl groups.

—Compound Represented by Formula O-13—

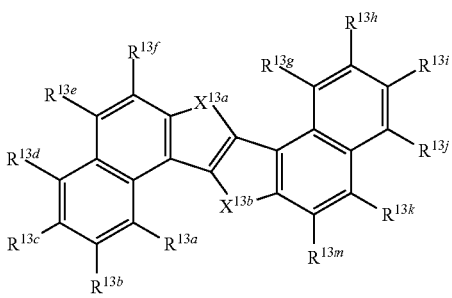

(O-13)

In Formula O-13, $X^{13a}$ and $X^{13b}$ each independently represent a S atom, an O atom, a Se atom or $NR^{13n}$, $R^{13a}$ to $R^{13k}$, $R^{13m}$, and $R^{13n}$ each independently represent a hydrogen atom or a substituent. Examples of the substituent include the substituent X described above.

In Formula O-13, it is preferable that at least one of $X^{13a}$ to $X^{13b}$ is a S atom, in view of increasing mobility. It is preferable that $X^{13a}$ and $X^{13b}$ are the same linking groups. It is preferable that all of $X^{13a}$ and $X^{13b}$ are S atoms.

With respect to $R^{13a}$ to $R^{13k}$ and $R^{13m}$ of Formula O-13, it is preferable that at least one of $R^{13c}$ or $R^{13i}$ is a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, it is more preferable that at least one of $R^{13c}$ or $R^{13i}$ is a substituted or unsubstituted alkyl group, and it is even more preferable that all of $R^{13c}$ and $R^{13i}$ is substituted or unsubstituted alkyl groups.

—Compound Represented by Formula O-14—

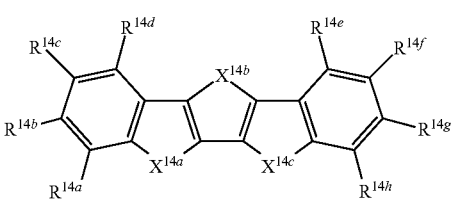

(O-14)

In Formula O-14, $X^{14a}$ to $X^{14c}$ each independently represent a S atom, an O atom, a Se atom, or $NR^{14i}$, and $R^{14a}$ to $R^{14i}$ each independently represent a hydrogen atom or a substituent. Examples of the substituent include the substituent X described above.

In Formula O-14, it is preferable that at least one of $X^{14a}$ to $X^{14c}$ is a S atom, in view of increasing mobility. It is preferable that $X^{14a}$ to $X^{14c}$ are the same linking groups. It is preferable that all of $X^{14a}$ to $X^{14c}$ are S atoms.

With respect to $R^{14a}$ to $R^{14h}$ of Formula O-14, it is preferable that at least one of $R^{14b}$ or $R^{14g}$ is a group represented by Formula W, and it is more preferable that all of $R^{14b}$ and $R^{14g}$ are groups represented by Formula W.

—Compound Represented by Formula O-15—

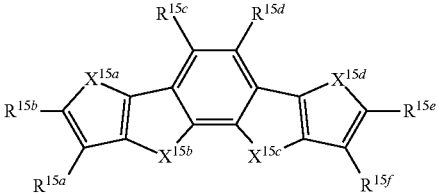

(O-15)

In Formula O-15, $X^{15a}$ to $X^{15d}$ each independently represent a S atom, an O atom, a Se atom, or $NR^{15g}$, and $R^{15a}$ to $R^{15g}$ each independently represent a hydrogen atom or a substituent. Examples of the substituent include the substituent X described above.

In Formula O-15, it is preferable that at least one of $X^{15a}$ to $X^{15d}$ is a S atom, in view of increasing mobility. It is preferable that $X^{15a}$ to $X^{15d}$ are the same linking groups. It is preferable that all of $X^{15a}$ to $X^{15d}$ are S atoms.

With respect to $R^{15a}$ to $R^{15f}$ of Formula O-15, it is preferable that at least one of $R^{15b}$ or $R^{15e}$ is a group represented by Formula W, and it is more preferable that all of $R^{15b}$ and $R^{15e}$ are groups represented by Formula W.

—Compound Represented by Formula O-16—

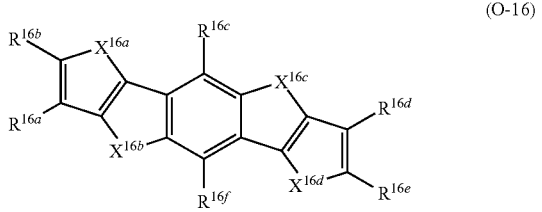

(O-16)

In Formula O-16, $X^{16a}$ to $X^{16d}$ each independently represent a S atom, an O atom, a Se atom, or $NR^{16g}$, and $R^{16a}$ to $R^{16g}$ each independently represent a hydrogen atom or a substituent. Examples of the substituent include the substituent X described above.

In Formula O-16, it is preferable that at least one of $X^{16a}$ to $X^{16d}$ is a S atom, in view of increasing mobility. It is preferable that $X^{16a}$ to $X^{16d}$ are the same linking groups. It is preferable that all of $X^{16a}$ to $X^{16d}$ are S atoms.

With respect to $R^{16a}$ to $R^{16f}$ of Formula O-16, it is preferable that at least one of $R^{16a}$ or $R^{16d}$ is a group represented by Formula W, and it is more preferable that all of $R^{16a}$ and $R^{16d}$ are groups represented by Formula W.

It is preferable that $R^{16c}$ and $R^{16f}$ are hydrogen atoms.

Formulae O-4 and O-6 to O-16 preferably have alkyl groups, more preferably have alkyl groups having 3 to 20 carbon atoms, and even more preferably have alkyl groups having 7 to 14 carbon atoms, on fused polycyclic aromatic rings on the fused polycyclic aromatic group. According to the above aspect, the mobility and the heat stability of the obtained organic semiconductor are excellent.

Formulae O-4 and O-6 to O-16 preferably have one or more alkyl groups, more preferably have 2 to 4 alkyl groups, and even more preferably have 2 to 14 alkyl groups on fused polycyclic aromatic rings on the fused polycyclic aromatic group. According to the above aspect, the mobility and the heat stability of the obtained organic semiconductor are excellent.

A method of synthesizing Formulae O-4 and O-6 to O-16 is not particularly limited, and the synthesis may be performed with reference to the well-known methods. Examples of the method of synthesizing the compounds represented by Formulae O-4 and O-6 to O-16 include Journal of American Chemical Society, 116, 925 (1994), Journal of Chemical Society, 221 (1951), Org. Lett., 2001, 3, 3471, Macromolecules, 2010, 43, 6264, Tetrahedron, 2002, 58, 10197, JP2012-513459A, JP2011-46687A, Journal of Chemical Research. miniprint, 3, 601-635 (1991), Bull. Chem. Soc. Japan, 64, 3682-3686 (1991), Tetrahedron Letters, 45, 2801-2803 (2004), EP2251342A, EP2301926A, EP2301921A, KR10-2012-0120886A, J. Org. Chem., 2011, 696, Org. Lett., 2001, 3, 3471, Macromolecules, 2010, 43, 6264, J. Org. Chem., 2013, 78, 7741, Chem. Eur. J., 2013, 19, 3721, Bull. Chem. Soc. Jpn., 1987, 60, 4187, J. Am. Chem. Soc., 2011, 133, 5024, Chem. Eur. J. 2013, 19, 3721, Macromolecules, 2010, 43, 6264-6267, and J. Am. Chem. Soc., 2012, 134, 16548-16550.

In view of the mobility, the threshold voltage, the hysteresis, and the heat resistance of the organic semiconductor, the compound represented by any one of Formulae O-10, O-14, and O-16 is preferable, the compound represented by Formulae O-14 and O-16 is more preferable, and the compound represented by Formula O-16 is even more preferable.

Specific preferable examples of Formula (2) are provided below, and it is obvious that the present invention is not limited to these.

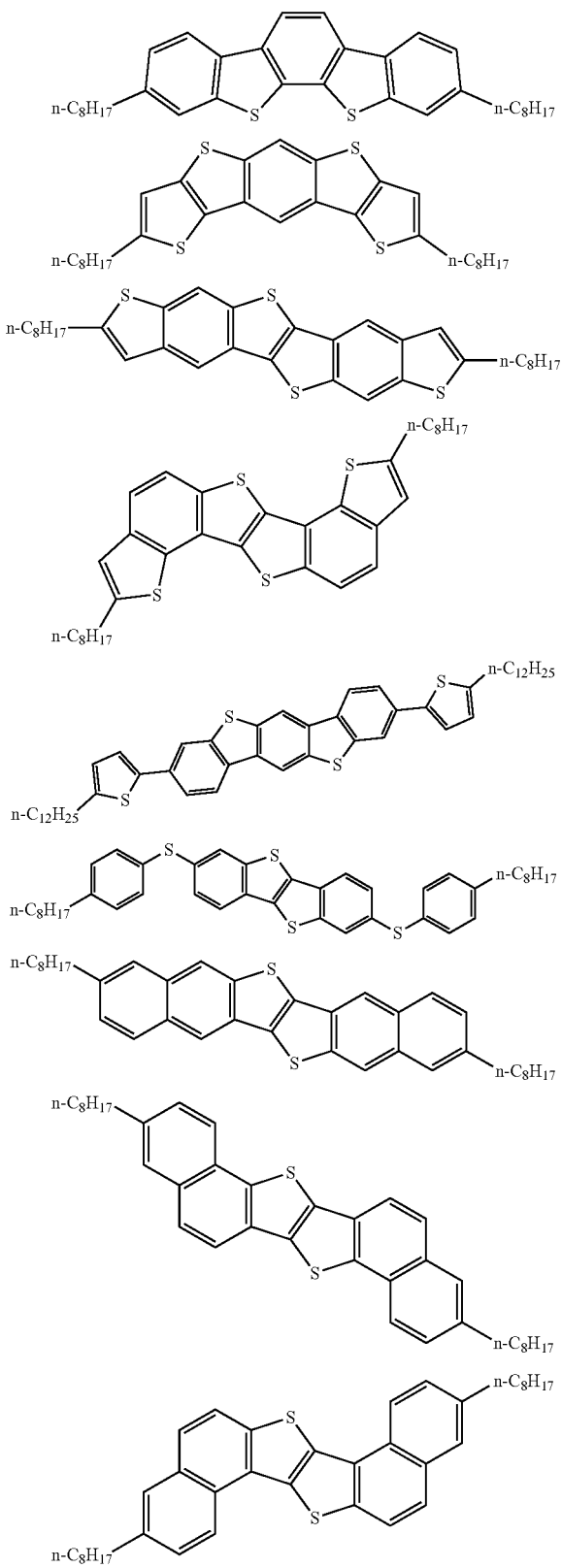

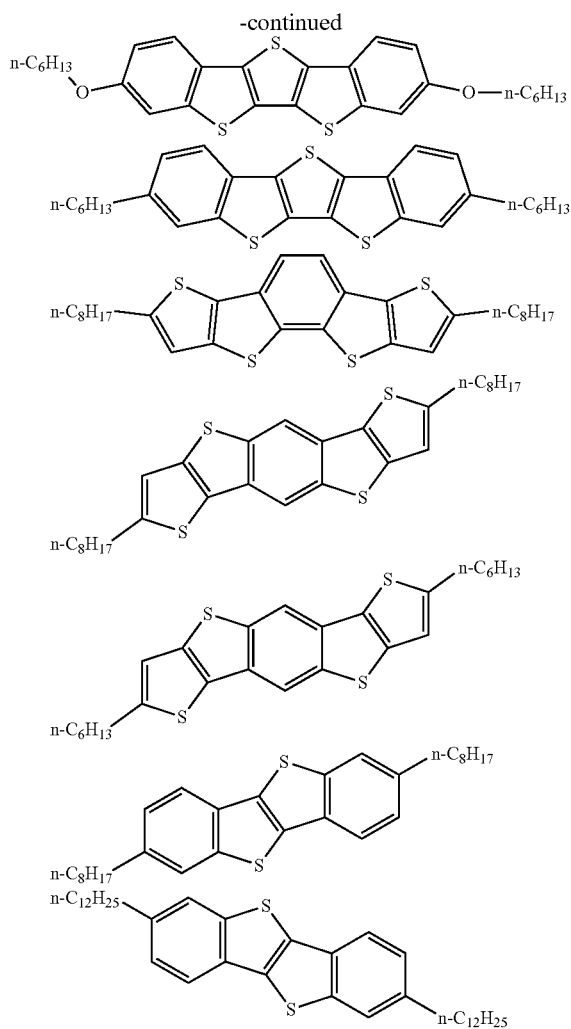

These specific low molecular weight compounds may be used singly, and two or more kinds thereof may be used in combination.

The content of the specific low molecular weight compound is preferably 100 parts by mass or less, more preferably 50 parts by mass or less, even more preferably 25 parts by mass or less, and particularly preferably 10 parts by mass or less with respect to 100 parts by mass of the specific polymer compound. The lower limit value is preferably 1 part by mass or greater, more preferably 2 parts by mass or greater, and even more preferably 3 parts by mass or greater.

In a case where the content of the specific low molecular weight compound is 50 parts by mass or less, the mobility of the obtained organic thin film transistor is further improved. In a case where the content of the specific low molecular weight compound is 1 parts by mass or greater, the effect obtained by the specific low molecular weight compound is satisfactorily exhibited.

The molecular weight of the specific low molecular weight compound is preferably less than 2,000, more preferably 150 to 1,500, and even more preferably 200 to 600.

<Organic Solvent>

The organic semiconductor composition of the present invention may contain an organic solvent.

The organic solvent is not particularly limited, and examples thereof include a hydrocarbon solvent such as hexane, octane, and decane, an aromatic hydrocarbon solvent such as toluene, xylene, mesitylene, ethylbenzene, decalin, 1-methylnaphthalene, tetralin, and anisole, a ketone solvent such as acetone, methyl ethyl ketone, methyl isobutyl ketone, and cyclohexanone, a halogenated hydrocarbon solvent such as dichloromethane, chloroform, tetrachloromethane, dichloroethane, trichloroethane, tetrachloroethane, chlorobenzene, dichlorobenzene, and chlorotoluene, an ester solvent such as ethyl acetate, butyl acetate, amyl acetate, and ethyl lactate, an alcohol solvent such as methanol, propanol, butanol, pentanol, hexanol, cyclohexanol, methyl cellosolve, ethyl cellosolve, and ethylene glycol, an ether solvent such as butoxybenzene, dibutyl ether, tetrahydrofuran, and dioxane, an amide solvent such as N,N-dimethylformamide and N,N-dimethylacetamide, an imide solvent such as 1-methyl-2-pyrrolidone and 1-methyl-2-imidazolidinone, a sulfoxide type solvent such as dimethylsulfoxide, and a nitrile solvent such as acetonitrile.

The organic solvents may be used singly, and two or more kinds thereof may be used in combination.

The content in a case of containing the organic solvent is preferably 90 to 99.99 mass %, more preferably 95 to 99.99 mass %, and even more preferably 96 to 99.95 mass % with respect to the total mass of the organic semiconductor composition.

<Binder Polymer>

The organic semiconductor composition of the present invention may contain a binder polymer. Types of the binder polymer are not particularly limited, and well-known binder polymers may be used.

Examples of the binder polymer include polystyrene, poly(α-methylstyrene), polyvinyl cinnamate, poly(4-vinylphenyl), poly(4-methylstyrene), rubber, and a thermoplastic elastomer.

The weight-average molecular weight of the binder polymer is not particularly limited, and preferably 1,000 to 10,000,000, more preferably 3,000 to 5,000,000, and even more preferably 5,000 to 3,000,000.

The content in a case of containing a binder polymer is preferably 1 to 200 parts by mass, more preferably 10 to 150 parts by mass, and even more preferably 20 to 120 parts by mass with respect to 100 parts by mass of the total content of the specific polymer compound and the specific low molecular weight compound. In a case where the content is in the range, there is a tendency in that the carrier mobility and the heat resistance of the obtained organic thin film transistor are further improved.

<Other Components>

Other components other than the above may be included in the organic semiconductor composition of the present invention.

As the other component, well-known additives and the like can be used.

The content of the other components is preferably 10 mass % or less, more preferably 5 mass % or less, and even more preferably 1 mass % or less with respect to the total mass of the organic semiconductor composition. In a case where the content is in the above range, there is a tendency in that the film forming property becomes excellent, and the carrier mobility and the heat resistance of the obtained organic thin film transistor are more improved.

<Preparation Method>

The method of preparing the organic semiconductor composition is not particularly limited, and well-known methods may be employed. For example, the organic semiconductor composition according to the present invention may be obtained by adding the predetermined amounts of the specific polymer compound and the specific low molecular weight compound in the organic solvent and suitably performing a stirring treatment.

[Organic Semiconductor Film, Organic Thin Film Transistor, and Method of Manufacturing Organic Thin Film Transistor]

The organic semiconductor film according to the present invention include the organic semiconductor composition. That is, the organic semiconductor film of the present invention is a film (layer) of containing the specific polymer compound and the specific low molecular weight compound.

The organic semiconductor film of the present invention is suitably used in the organic thin film transistor and may be used in other applications. Examples of the other applications include a non-luminous organic semiconductor device. The non-luminous organic semiconductor device means a device that is not intended to emit light. Examples of the non-luminous organic semiconductor device include an organic photoelectric conversion element (a solid imaging element for an optical sensor, a solar cell for an energy conversion application, and the like), a gas sensor, an organic rectifying element, an organic inverter, and an information recording element, in addition to the organic thin film transistor. The non-luminous organic semiconductor device preferably causes the organic semiconductor film to function as an electronic element.

Hereinafter, as one of suitable aspects of the organic semiconductor film of the present invention, a case of being applied to the organic thin film transistor is described.

The organic thin film transistor according to the present invention may have an organic semiconductor film (organic semiconductor layer) and may further have a source electrode, a drain electrode, and a gate electrode.

The structure of the organic thin film transistor according to the present invention is not particularly limited. For example, the structure thereof may have any one of a bottom contact type (bottom contact-bottom gate type and bottom contact-top gate type) and a top contact type (top contact-bottom gate type and top contact-top gate type).

Hereinafter, one of the organic thin film transistor of the present invention is described with reference to the drawings.

FIG. 1 is a schematic cross-sectional view of a bottom contact type organic thin film transistor 100 according to an embodiment of the present invention.

In the example of FIG. 1, the organic thin film transistor 100 has a substrate 10, a gate electrode 20, a gate insulating film 30, a source electrode 40, a drain electrode 42, an organic semiconductor film (organic semiconductor layer) 50, and a sealing layer 60. Here, the organic semiconductor film 50 is manufactured by using the organic semiconductor composition.

Hereinafter, each of methods of manufacturing the substrate, the gate electrode, the gate insulating film, the source electrode, the drain electrode, the organic semiconductor film (the organic semiconductor layer), and the sealing layer is specifically described below.

(Substrate)

The substrate plays a role of supporting the gate electrode, the source electrode, the drain electrode, and the like which will be described later.

The type of the substrate is not particularly limited, and examples thereof include a plastic substrate, a glass substrate, and a ceramic substrate. Among these, in view of applicability to each device and costs, a glass substrate or a plastic substrate is preferable.

(Gate Electrode)

Examples of materials of the gate electrode include metal such as gold (Au), silver, aluminum, copper, chromium, nickel, cobalt, titanium, platinum, magnesium, calcium, barium, or sodium; conductive oxide such as $InO_2$, $SnO_2$, or indium tin oxide (ITO); a conductive polymer such as polyaniline, polypyrrole, polythiophene, polyacetylene, or polydiacetylene; a semiconductor such as silicon, germanium, or gallium arsenide; and a carbon material such as fullerene, carbon nanotubes, or graphite. Among these, a metal is preferable, and silver and aluminum are more preferable.

The thickness of the gate electrode is not particularly limited but is preferably 20 to 200 nm.

The gate electrode may function as a substrate, and, in this case, the substrate may not be provided.

A method of forming the gate electrode is not particularly limited, but examples thereof include a method of vacuum vapor-depositing or sputtering an electrode material onto a substrate, a method of coating a substrate with a composition for forming an electrode, a method of printing a composition for forming an electrode onto a substrate, and the like. Examples of a patterning method in a case where the electrode is patterned include a photolithography method; a printing method such as ink jet printing, screen printing, offset printing, or relief printing (flexo printing); and a mask vapor deposition method.

(Gate Insulating Film)

Examples of the material of the gate insulating film include a polymer such as polymethyl methacrylate, polystyrene, polyvinyl phenol, polyimide, polycarbonate, polyester, polyvinyl alcohol, polyvinyl acetate, polyurethane, polysulfone, polybenzoxazole, polysilsesquioxane, an epoxy resin, and a phenol resin; oxide such as silicon dioxide, aluminum oxide, and titanium oxide; and nitride such as silicon nitride. Among these materials, in view of the compatibility with the organic semiconductor film, it is preferable that the material of the gate insulating film is a polymer.

The thickness of the gate insulating film is not particularly limited but is preferably 100 to 1,000 nm.

The method of forming the gate insulating film is not particularly limited, and examples thereof include a method of coating a substrate on which a gate electrode is formed with a composition for forming a gate insulating film and a method of vapor-depositing or sputtering a material of a gate insulating film.

(Source Electrode and Drain Electrode)

Specific examples of the materials of the source electrode and the drain electrode are the same as those of the gate electrode. Among these, a metal is preferable, and silver is more preferable.

Methods of forming the source electrode and the drain electrode are not particularly limited, but examples thereof include a method of vacuum vapor-depositing or sputtering an electrode material onto a substrate on which the gate electrode and the gate insulating film are formed and a method of applying or printing a composition for forming an electrode. Specific examples of the patterning method are the same as those of the gate electrode.

(Organic Semiconductor Film)

The organic semiconductor film may be obtained by the step of applying the organic semiconductor composition and forming the organic semiconductor film. Specifically, the organic semiconductor film may be formed by the step of coating the substrate with the organic semiconductor composition and drying the organic semiconductor composition.

The expression "coating the substrate with the organic semiconductor composition" includes an aspect of applying the organic semiconductor composition over the substrate through another layer provided on the substrate, in addition to an aspect of directly the organic semiconductor composition to the substrate.

Well-known methods can be used as the coating method with the organic semiconductor composition, and examples thereof include a bar coating method, a spin coating method, a knife coating method, a doctor blade method, an ink jet printing method, a flexographic printing method, a gravure printing method, and a screen printing method. As the coating method with the organic semiconductor composition, a method (so-called gap cast method) of forming an organic semiconductor film disclosed in JP2013-207085A and a method (a so-called edge casting method and a continuous edge casting method) of manufacturing an organic semiconductor thin film disclosed in WO2014/175351A and the like are suitably used.

With respect to drying (a drying treatment), an optimum condition may be suitably selected depending on the types of the respective components included in the organic semiconductor composition so as to perform natural drying. However, in view of improvement of productivity, a heating treatment is preferably performed. For example, the heating temperature is preferably 30° C. to 250° C., more preferably 40° C. to 200° C., and even more preferably 50° C. to 150° C., and the heating time is preferably 10 to 300 minutes and more preferably 20 to 180 minutes.

The film thickness of the manufactured organic semiconductor film is not particularly limited. However, in view of the excellent effect of the present invention, the film thickness is preferably 10 to 500 nm and more preferably 20 to 200 nm.

(Sealing Layer)

In view of durability, the organic thin film transistor of the present invention preferably includes a sealing layer as an outermost layer. In the sealing layer, a known sealant (sealing layer forming composition) can be used.

The thickness of the sealing layer is not particularly limited, and is preferably 0.2 to 10 μm.

(Other Organic Thin Film Transistors)

Figure 2:
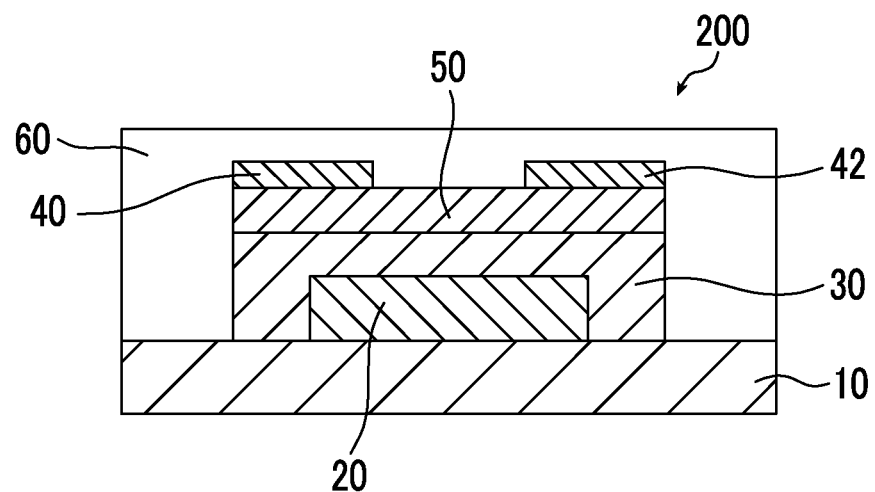
FIG. 2 is a schematic cross-sectional view of a top contact type organic thin film transistor according to an embodiment of the present invention.

FIG. 2 is a schematic cross-sectional view of a top contact type organic thin film transistor 200 according to an embodiment of the present invention.

In the example of FIG. 2, the organic thin film transistor 200 has a substrate 10, a gate electrode 20, a gate insulating film 30, a source electrode 40, a drain electrode 42, an organic semiconductor film (organic semiconductor layer) 50, and a sealing layer 60. Here, the organic semiconductor film 50 is formed by using the organic semiconductor composition according to the present invention.

The substrate, the gate electrode, the gate insulating film, the source electrode, the drain electrode, the organic semiconductor film, and the sealing layer are as described above, and the description thereof is omitted.

(Application of Organic Thin Film Transistor)

The above organic thin film transistor can be applied to a display unit of electronic paper and a display device, which displays an image. Electronic paper and a display device may have well-known structures, and thus the description thereof is omitted.

EXAMPLES

Hereinafter, the present invention is specifically described by using the examples. However, the present invention is not limited thereto.

<Organic Semiconductor Compound>

The organic semiconductor compound (specific polymer compound, specific low molecular weight compound, comparative polymer compound, or comparative low molecular weight compound) included in the organic semiconductor composition is described below. Hereinafter, the specific polymer compound and the comparative polymer compound are simply referred to as a "polymer compound", and the specific low molecular weight compound and the comparative low molecular weight compound are simply referred to as a "low molecular weight compound" in some cases.

Specific Polymer Compounds (1) to (4), (7), and (8) were synthesized by the method of synthesizing a well-known D-A type π conjugated polymer. Specific Polymer Compounds (5) and (6) were synthesized by the following synthesis method.

Comparative Polymer Compound (1) was purchased from Sigma-Aldrich Japan K.K., Comparative Polymer Compounds (2) and (3) were compounds disclosed in JP2012-39103A, and Comparative Polymer Compound (4) was a compound disclosed in Macromolecules, 2013, 46, 3887.

The molecular weight of the polymer compound was measured by the method.

Specific Low Molecular Weight Compound (1) was a compound disclosed in JP2009-267372A, Specific Low Molecular Weight Compound (3) was a compound disclosed in JP2012-39103A, and Comparative Low Molecular Weight Compound (1) was a compound disclosed in JP2015-507840A. Specific Low Molecular Weight Compound (2) was synthesized with reference to the method disclosed in JP2011-526588A. TIPS-PEN is a comparative low molecular weight compound and represents TIPS PENTACENE (6,13-bis(triisopropylsilylethynyl) pentacene) manufactured by Sigma-Aldrich Japan K.K.

<Synthesis of Specific Polymer Compound (5)>

Specific Polymer Compound (5) was synthesized in the following scheme.

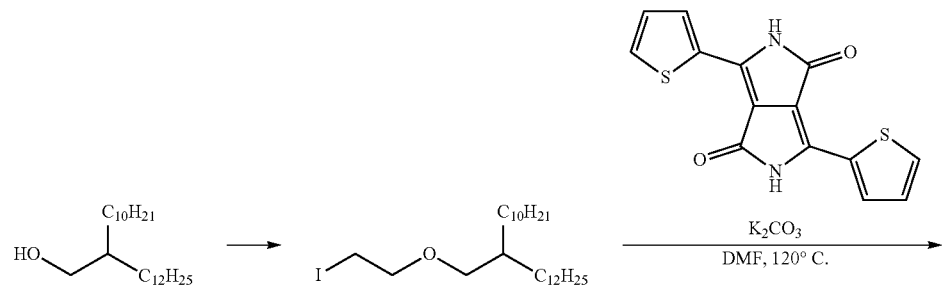

-continued
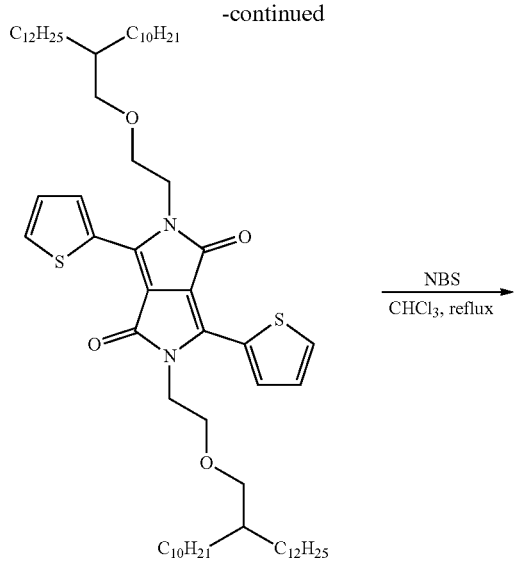
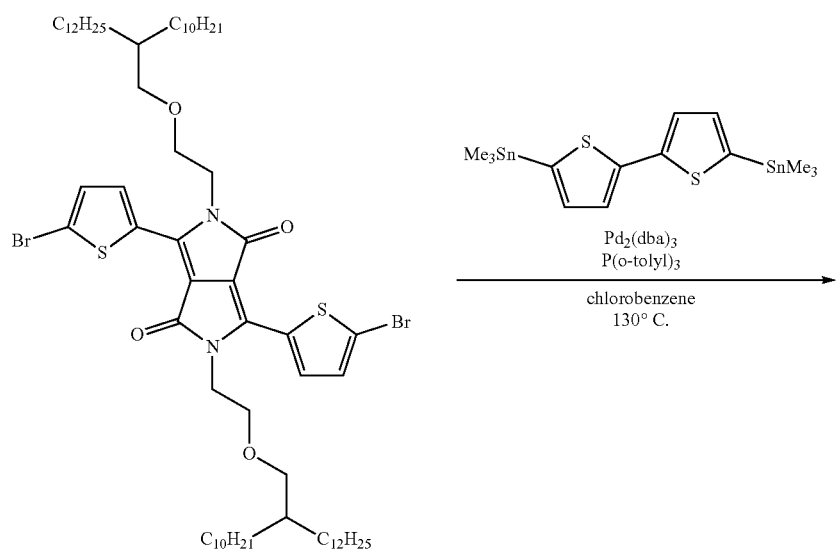
Intermediate X

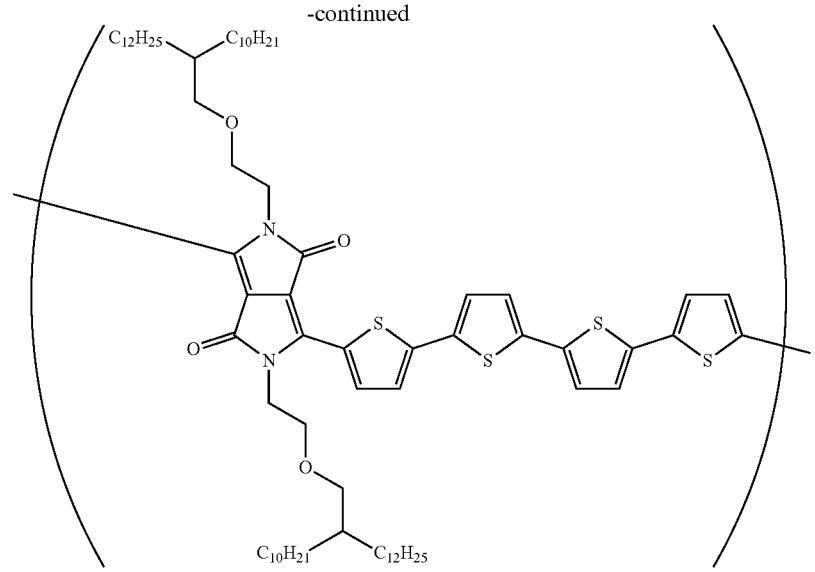

Specific Polymer Compound (5)

An intermediate X which is a monomer was synthesized with reference to Tetrahedron, 2010, 66, 3173. and Organic Electronics, 2011, 12, 993.

The intermediate X (244 mg, 200 mmol), 5,5'-bis(trimethylstannyl)-2,2'-bithiophene (98.4 mg, 200 mmol), tri(o-tolyl) phosphine (9.8 mg, 32 mmol), tris(dibenzylideneacetone) dipalladium (3.7 mg, 4 mmol), and dehydrated chlorobenzene (17 mL) were mixed and stirred at 130° C. for 24 hours under nitrogen atmosphere. The reaction solution was cooled to room temperature, poured into a mixed solution of methanol (240 mL) and concentrated hydrochloric acid (10 mL), and stirred for two hours. After the precipitate was filtered and washed with methanol, soxhlet extraction was performed sequentially with methanol, acetone, and ethyl acetate, so as to remove soluble impurities. Subsequently, soxhlet extraction was performed with chloroform, the obtained solution was subjected to vacuum concentration, methanol was added, the precipitated solid content was filtrated and washed with methanol, and vacuum drying was performed at 80° C. for 12 hours, so as to obtain 201 mg of Specific Polymer Compound (5) (yield: 82%).

The number-average molecular weight in terms of polystyrene was $2.4 \times 10^4$, and the weight-average molecular weight was $7.5 \times 10^4$.

<Synthesis of Specific Polymer Compound (6)>

Specific Polymer Compound (6) was synthesized in the following scheme.

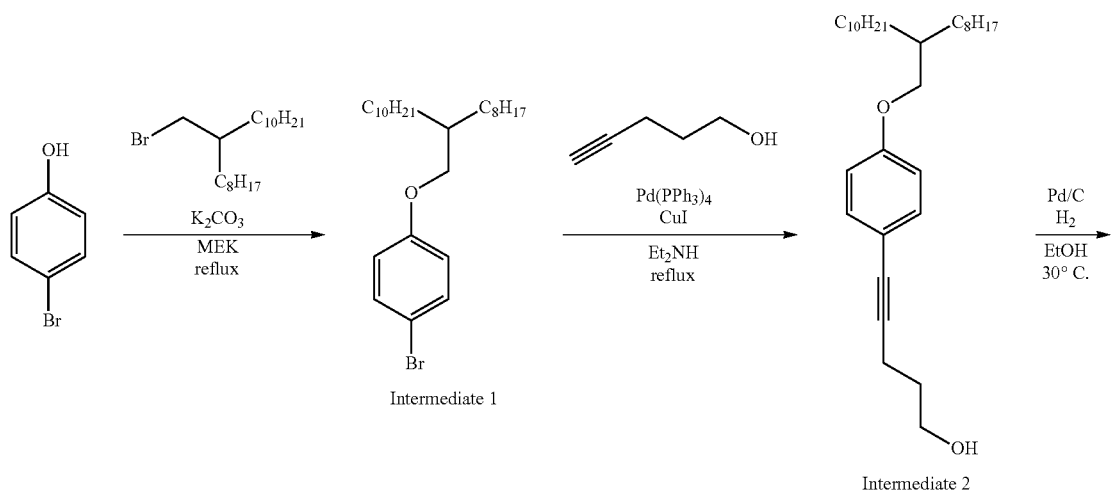

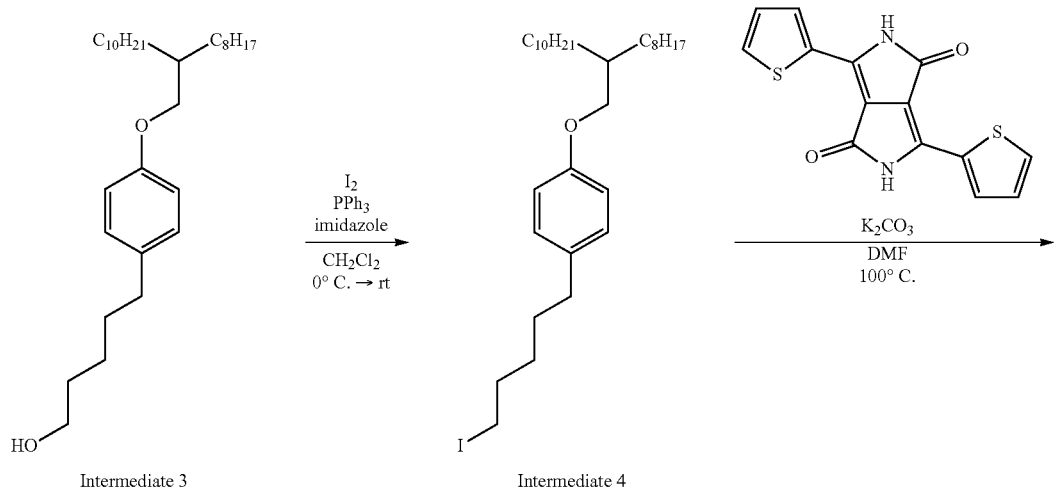
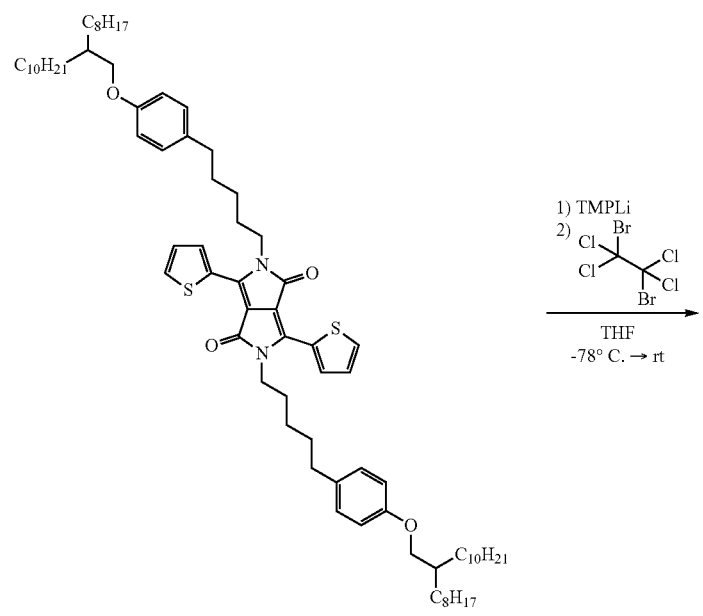
Intermediate 5

-continued

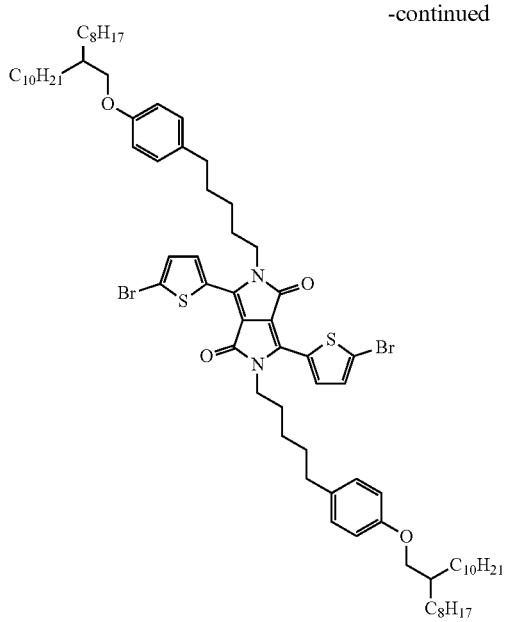

Intermediate 6

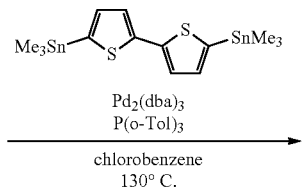

Pd₂(dba)₃
P(o-Tol)₃
────────────→
chlorobenzene
130° C.

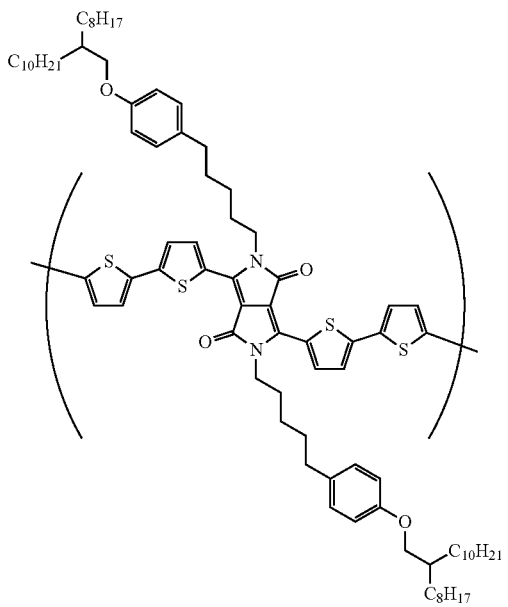

Specific Polymer Compound (6)

(Synthesis of Intermediate 1)

4-Bromophenol (41.6 g, 240 mmol), 2-octyl-1-dodecyl bromide (174 g, 480 mmol), potassium carbonate (100 g, 720 mmol), and methyl ethyl ketone (480 mL) were mixed and were stirred at 100° C. for 72 hours under the nitrogen atmosphere. The reaction solution was cooled to room temperature, filtered through celite, and the celite was washed with hexane. The filtrate was concentrated under reduced pressure, and the obtained crude product was subjected to silica gel column chromatography (eluate:hexane) for purification to obtain an intermediate 1 (80 g).

(Synthesis of Intermediate 2)

The intermediate 1 (30 g, 66 mmol), 4-pentyn-1-ol (18.3 mL, 198 mmol), copper iodide (630 mg, 3.3 mmol), diethylamine (90 mL), and tetrakistriphenylphosphine palladium (1.9 g, 1.7 mmol) were mixed and stirred at 70° C. for four hours under nitrogen atmosphere. Ethyl acetate (200 mL) was added to the reaction solution, and filtration was performed through celite, so as to remove insoluble matters. The filtrate was concentrated under reduced pressure, and the obtained crude product was subjected to silica gel column chromatography (eluate:hexane/ethyl acetate=4:1 to 1:1) for purification to obtain an intermediate 2 (17.5 g).

(Synthesis of Intermediate 3)

The intermediate 2 (5.0 g, 11 mmol), 10 wt % of Pd/C (3.6 g), and ethanol (25 mL) were mixed in an autoclave container. Hydrogen was charged at 0.9 MPa and stirred at 30° C. for four hours. The reaction vessel was returned to the atmosphere, the reaction solution was filtered through celite, and the celite was washed with tetrahydrofuran. The filtrate was concentrated under reduced pressure, and the obtained crude product was subjected to silica gel column chromatography (eluate:hexane/ethyl acetate=4:1 to 2:1) for purification to obtain an intermediate 3 (4.2 g).

(Synthesis of Intermediate 4)

The intermediate 3 (8.5 g, 18 mmmol), imidazole (1.5 g, 22 mol), triphenylphosphine (5.8 g, 22 mol), and dichloromethane (54 mL) were mixed and were cooled to 0° C. under a nitrogen atmosphere. Subsequently, iodine (5.6 g, 22 mol) was added little by little. The temperature of the reaction solution was increased to the room temperature, and the reaction solution was stirred for one hour. The reaction was stopped by adding an aqueous solution of sodium bisulfate, the solution was separated, and the aqueous layer was removed. The organic layer was dried over magnesium sulfate, filtration was performed, and vacuum concentration was performed. The obtained crude product was subjected to silica gel column chromatography (eluate:hexane) for purification to obtain an intermediate 4 (8.7 g).

(Synthesis of Intermediate 5)

3,6-di(2-thienyl)-2,5-dihydropyrrolo [3,4-c]pyrrole-1,4-dione (1.53 g, 5.1 mmol), potassium carbonate (2.1 g, 15.3 mmol), and N,N-dimethylformamide (75 mL) were mixed and stirred at 100° C. for one hour under a nitrogen atmosphere. Thereafter, the intermediate 4 (8.7 g, 15 mmol) was added, and the mixture was further stirred at 100° C. for six hours. The reaction solution was cooled to room temperature, filtered through celite, and the celite was washed with ethyl acetate. The filtrate was concentrated under reduced pressure, and the obtained crude product was subjected to silica gel column chromatography (eluate:hexane/ethyl acetate=19:1 to 9:1) for purification to obtain an intermediate 5 (3.2 g).

(Synthesis of Intermediate 6)

1) Preparation of Lithiation Agent (TMPLi)

Under nitrogen atmosphere, 2,2,6,6-tetramethylpiperidine (2.4 mL, 14 mmol) and dehydrated tetrahydrofuran (13 mL) were mixed and cooled to −78° C. 2.6 M of a normal butyllithium hexane solution (5.2 mL, 13 mmol) was added dropwise, and the temperature was raised to 0° C. to prepare a lithiation agent (TMPLi).

2) Preparation of Intermediate 6

Under nitrogen atmosphere, the intermediate 5 (800 mg, 0.67 mmol) and dehydrated tetrahydrofuran (3.6 mL) were mixed and cooled to −78° C. The prepared lithiation agent (4.1 mL, corresponding to 4.2 mmol) was dropwise added. After stirring was performed at −78° C. for one hour, 1,2-dibromo-1,1,2,2-tetrachloroethane (439 mg, 1.3 mmol) was added. Thereafter, the temperature of the reaction solution was increased to the room temperature, the reaction solution was stirred for one hour, and the reaction was stopped by adding water. After the reaction solution was extracted with hexane, the organic layer was washed with 1 M of hydrochloric acid and then washed with saturated saline. The organic layer was dried over magnesium sulfate, filtration was performed, and vacuum concentration was performed. The obtained crude product was subjected to silica gel column chromatography (eluate:hexane/ethyl acetate=19:1 to 9:1) for purification to obtain an intermediate 6 (390 mg).

(Synthesis of Specific Polymer Compound (6))

The intermediate 6 (130 mg, 97 μmol), 5,5'-bis(trimethylstannyl)-2,2'-bithiophene (48 mg, 97 μmol), tri(o-tolyl)phosphine (2.4 mg, 7.7 μmol), tris(dibenzylideneacetone)dipalladium (1.8 mg, 1.9 μmol), and dehydrated chlorobenzene (3 mL) were mixed and stirred at 130° C. for 24 hours under nitrogen atmosphere. The reaction solution was cooled to room temperature, poured into a mixed solution of methanol (40 mL) and concentrated hydrochloric acid (2 mL), and stirred for two hours, and the precipitate was filtrated and washed with methanol. The resulting crude product was sequentially subjected to soxhlet extraction with methanol, acetone, and hexane, and soluble impurities were removed. Subsequently, soxhlet extraction was performed with chlorobenzene, the obtained solution was subjected to vacuum concentration, methanol was added, the precipitated solid content was filtrated and washed with methanol, and vacuum drying was performed at 80° C. for 12 hours, so as to obtain Specific Polymer Compound (6) (130 mg) (weight-average molecular weight Mw=50,000).

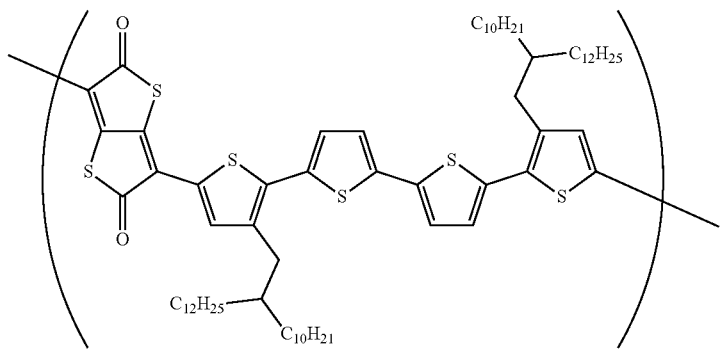

Specific Polymer Compound (1)
Mw = 61,000

-continued
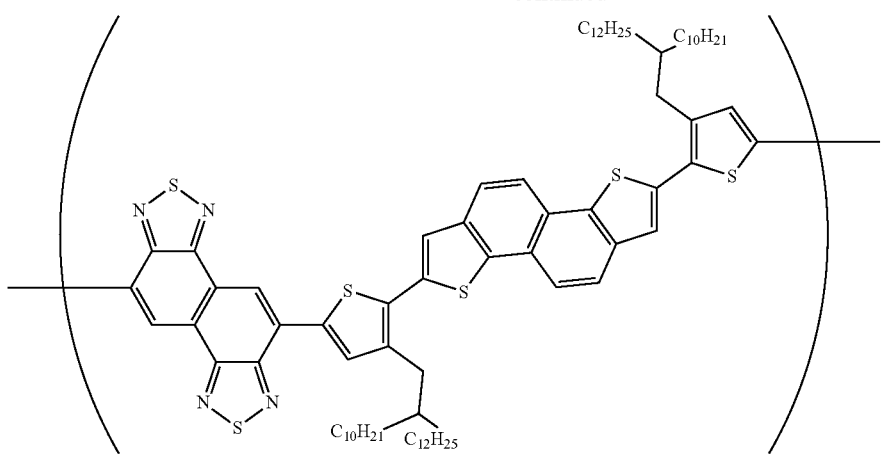
Specific Polymer Compound (2)
Mw = 77,000
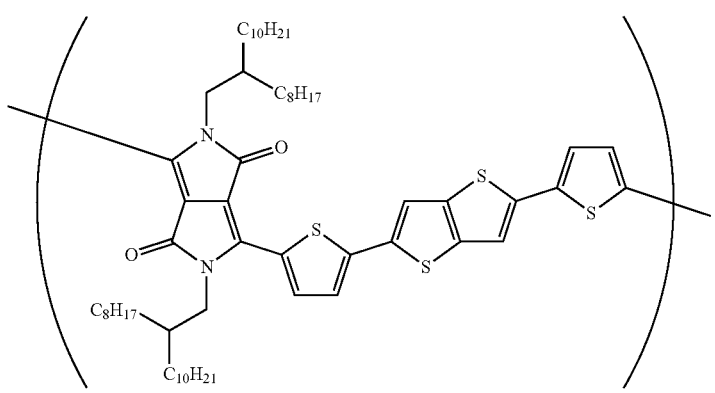
Specific Polymer Compound (3)
Mw = 89,000
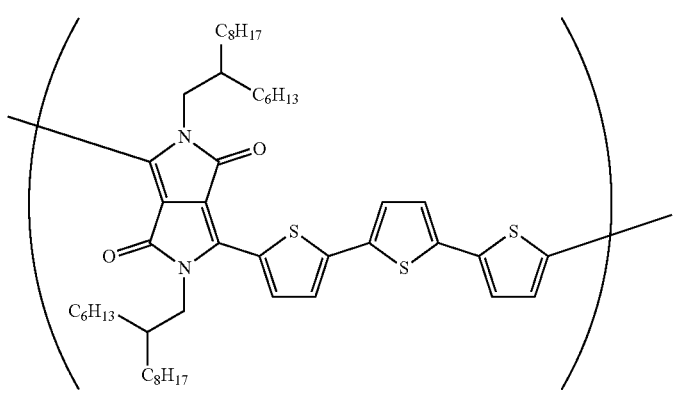
Specific Polymer Compound (4)
Mw = 78,000

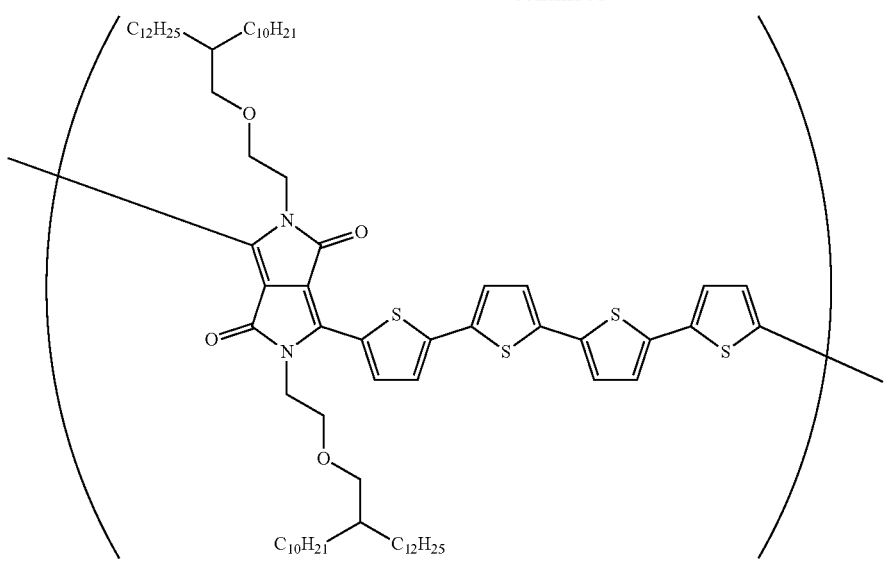
Specific Polymer Compound (5)
Mw = 75,000
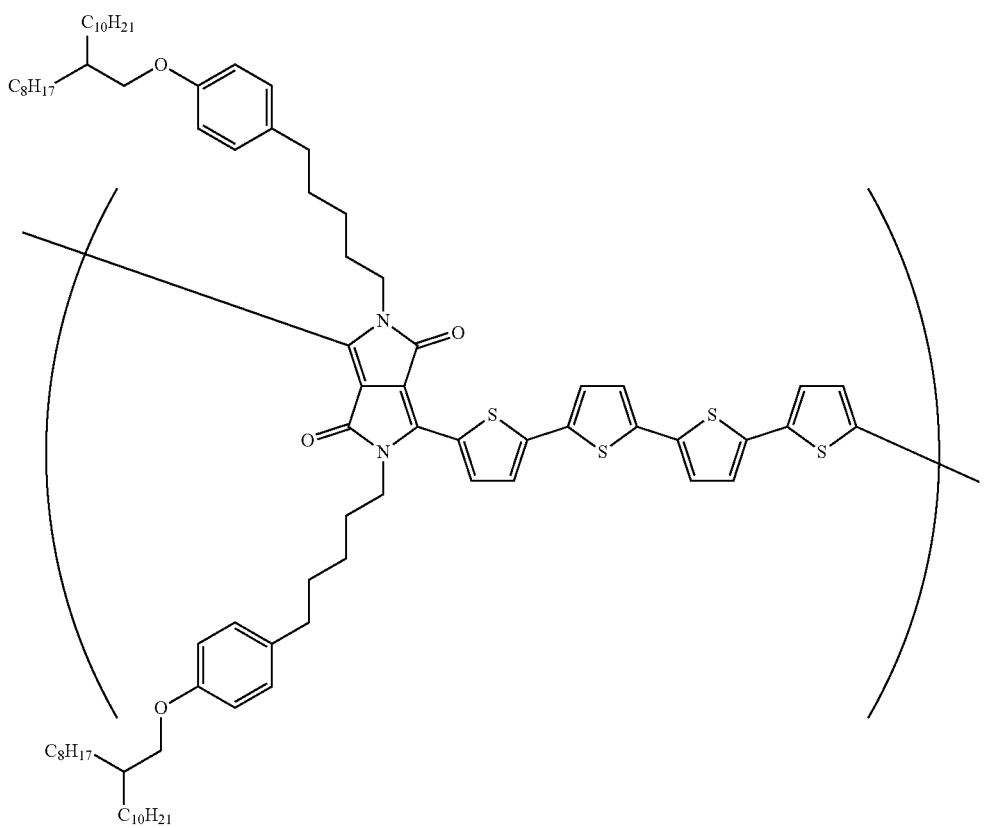
Specific Polymer Compound (6)
Mw = 50,000

-continued
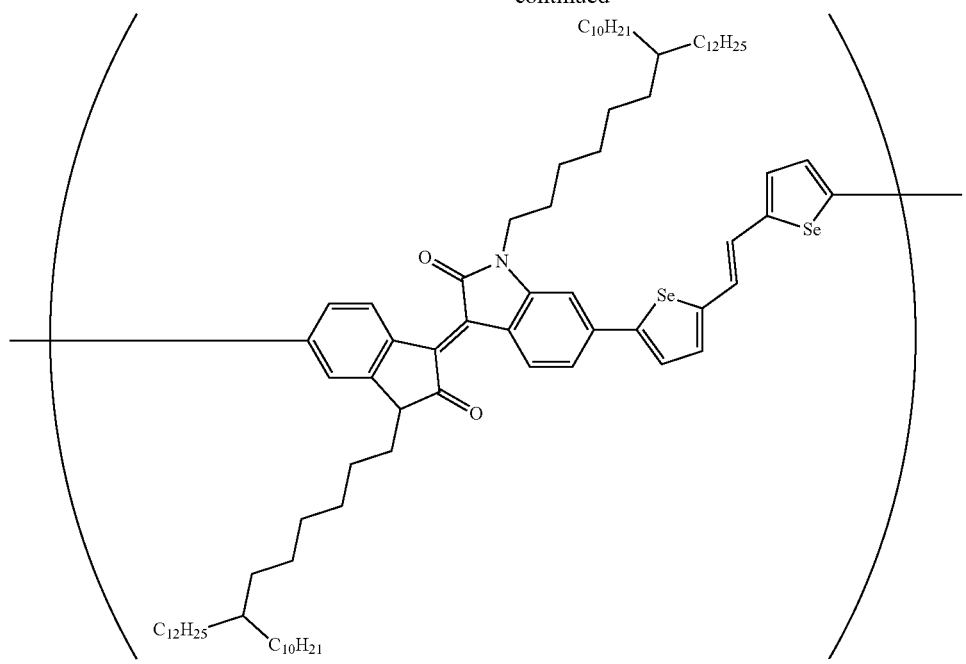
Specific Polymer Compound (7)
Mw = 98,000
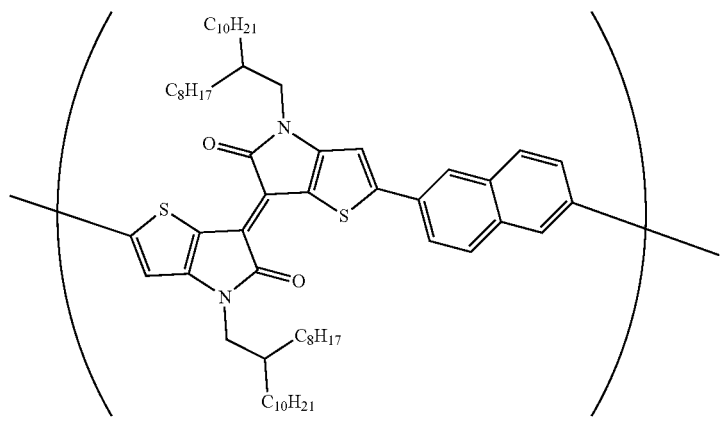
Specific Polymer Compound (8)
Mw = 70,000
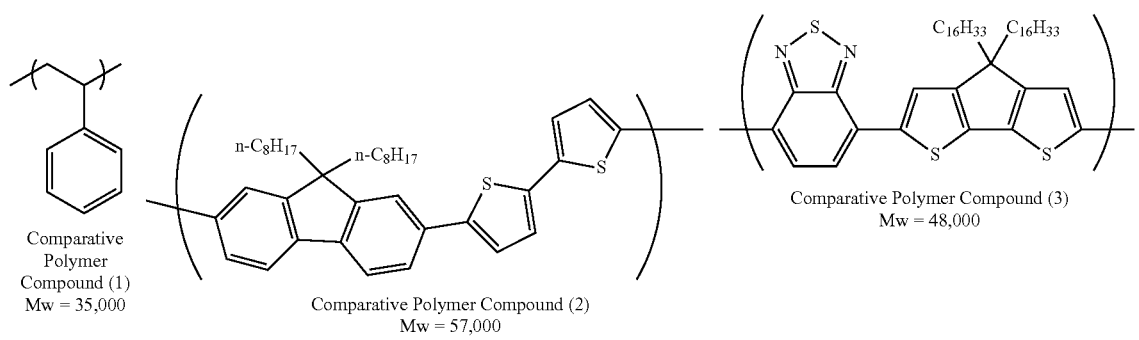
Comparative Polymer Compound (1)
Mw = 35,000
Comparative Polymer Compound (2)
Mw = 57,000
Comparative Polymer Compound (3)
Mw = 48,000

-continued

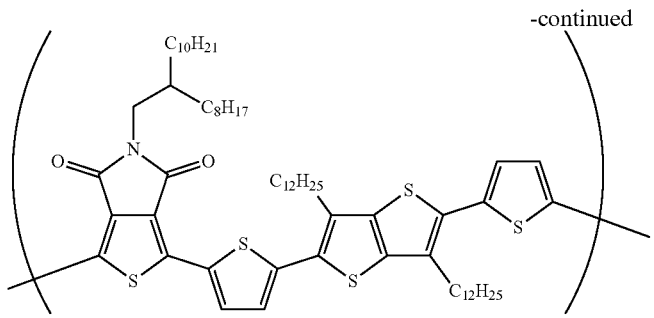

Comparative Polymer Compound (4)
Mw = 50,000

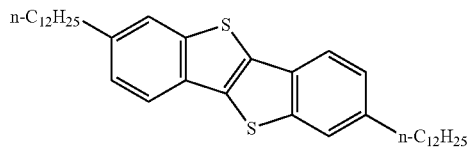

Specific Low Molecular Weight Compound (1)

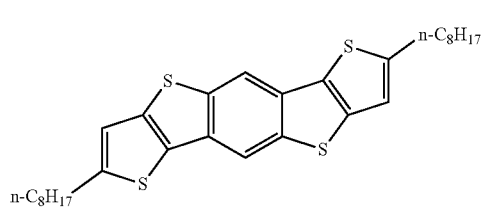

Specific Low Molecular Weight Compound (2)

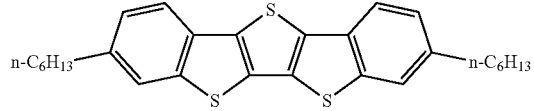

Specific Low Molecular Weight Compound (3)

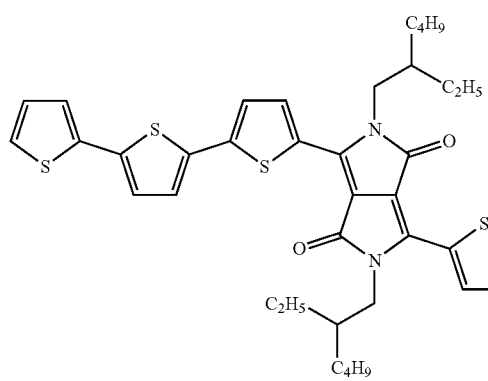

Comparative Low Molecular Weight Compound (1)

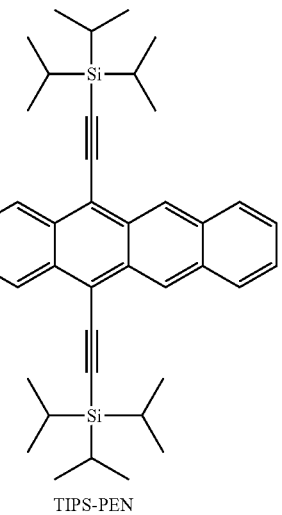

TIPS-PEN

<Manufacturing of Organic Thin Film Transistor (OTFT)>

The bottom gate-bottom contact type organic thin film transistor illustrated in FIG. 1 was manufactured. A dope silicon substrate (also functions as the gate electrode 20) having a thickness of 1 mm was used as the substrate 10, and the gate insulating film 30 was formed thereon.

The gate insulating film 30 was formed as below.

6.3 g of poly(4-vinylphenol) (manufactured by Nippon Soda Co., Ltd., trade name: VP-8000, Mn 11,000, dispersion degree 1.1) and 2.7 g of 2,2-bis(3,5-dihydroxymethyl-4-hydroxyphenyl) propane, as a crosslinking agent, were completely dissolved in 91 g of a mixed solvent of 1-butanol/ethanol=1/1 at room temperature. This solution was filtered with a membrane filter formed of polytetrafluoroethylene (PTFE) having φ 0.2 μm. 0.18 g of diphenyliodonium hexafluorophosphate salt as an acid catalyst was added to the obtained filtrate, the substrate 10 was coated with the solution, and the solution was dried to form a film. Thereafter, the film was heated to 100° C. to form a crosslinked structure, so as to form the gate insulating film 30 having a thickness of 0.7 μm.

Thereafter, as illustrated in FIG. 1, electrodes (gate width W=1 mm, gate length L=100 μm) formed of chromium/gold disposed in a comb shape as the source electrode 40 and the drain electrode 42 were formed by vacuum vapor deposition by using a mask.

Subsequently, spin coating was performed with each of the organic semiconductor compositions obtained by dissolving 4 mg of the polymer compound and 4 mg of the low molecular weight compound in 2 mL of chlorobenzene so as to have the combination of a first table below, a film was formed such that the source electrode and the drain electrode were covered, and an annealing treatment was performed at 175° C. for one hour in a nitrogen atmosphere, so as to manufacture an organic thin film transistor having the structure illustrated in FIG. 1. The sealing layer in FIG. 1 was not provided.

The thickness of the organic semiconductor layer was 20 nm to 50 nm.

<Performance Evaluation of OTFT>

With respect to the obtained OTFTs, the carrier mobility, the absolute value of the threshold voltage, the absolute value of the hysteresis, and the heat resistance were evaluated in the following method, so as to examine the performance of the OTFTs.

(Evaluation of Carrier Mobility)

The voltage of −40 V was applied between the source electrode and the drain electrode, the gate voltage was changed in the range of 40 V to −40 V, and the following equation indicating a drain current Id was used, so as to calculate the carrier mobility μ. The evaluation standard was as below.

$$Id=(w/2L)\mu Ci(Vg-Vth)^2$$

(in the equation, L refers to gate length, w refers to gate width, Ci refers to a capacity per unit area of an insulating layer, Vg refers to a gate voltage, and Vth refers to a threshold voltage)

"S": 0.4 cm$^2$/Vs or greater
"AA": 0.3 cm$^2$/Vs or greater and less than 0.4 cm$^2$/Vs
"A": 0.2 cm$^2$/Vs or greater and less than 0.3 cm$^2$/Vs
"B": Less than 0.2 cm$^2$/Vs (Evaluation of Threshold Voltage)

A voltage applied between the source electrode and the drain electrode was fixed to −40 V, Vg was changed from 40 V to −40 V, and a threshold voltage Vth+ was obtained, so as to obtain an absolute value of the threshold voltage. As an absolute value of this value was closer to 0, the threshold voltage was more excellent.

"S": 0 V or greater and less than 7.5 V
"A": 7.5 V or greater and less than 15 V
"B": 15 V or greater (Hysteresis)

A threshold voltage Vth− was obtained in a case where the voltage applied between the source electrode and the drain electrode was fixed to −40 V as above and Vg was changed from −40 V to 40 V, and an absolute value of the difference between Vth+ obtained in the evaluation of the threshold voltage and Vth− was used in an index of the hysteresis. As the absolute value became closer to 0, the hysteresis was more excellent.

"S": 0 V or greater and less than 3 V
"A": 3 V or greater and less than 7 V
"B": 7 V or greater (Heat Resistance Test)

The OTFT obtained in Manufacturing Example 1 was heated at 220° C. for one hour at a nitrogen atmosphere, and the carrier mobility was evaluated in the same method.

A value of the carrier mobility after the heat resistance test with respect to a value of the carrier mobility before the heat resistance test [100×(carrier mobility after heat resistance test)/(carrier mobility before heat resistance test)] (%) was obtained, and the evaluation of the carrier mobility in the heat resistance test was evaluated based on this value in the following standards. In the evaluation standard below, S or A was preferable, and S was more preferable.

"S": 75% or greater
"A": 25% or greater and less than 75%
"B": less than 25%

<Evaluation Results>

Results of the evaluation test are as presented in the first table.

TABLE 1

| First table | Polymer compound | | |
|---|---|---|---|
| | Type | Type of Acceptor (A) | Formulae (3) to (5) |
| Example 1 | Specific Polymer Compound (1) | (A-2) | — |
| Example 2 | Specific Polymer Compound (2) | (A-9) | — |
| Example 3 | Specific Polymer Compound (3) | (A-1) | Formula (3) |
| Example 4 | Specific Polymer Compound (4) | (A-1) | Formula (3) |
| Example 5 | Specific Polymer Compound (5) | (A-1) | Formula (3) |
| Example 6 | Specific Polymer Compound (6) | (A-1) | Formula (3) |
| Example 7 | Specific Polymer Compound (7) | (A-3) | Formula (4) |
| Example 8 | Specific Polymer Compound (8) | (A-4) | Formula (5) |
| Example 9 | Specific Polymer Compound (1) | (A-2) | — |
| Example 10 | Specific Polymer Compound (2) | (A-9) | — |
| Example 11 | Specific Polymer Compound (3) | (A-1) | Formula (3) |
| Example 12 | Specific Polymer Compound (4) | (A-1) | Formula (3) |
| Example 13 | Specific Polymer Compound (5) | (A-1) | Formula (3) |
| Example 14 | Specific Polymer Compound (6) | (A-1) | Formula (3) |
| Example 15 | Specific Polymer Compound (7) | (A-3) | Formula (4) |
| Example 16 | Specific Polymer Compound (8) | (A-4) | Formula (5) |
| Example 17 | Specific Polymer Compound (1) | (A-2) | — |
| Example 18 | Specific Polymer Compound (2) | (A-9) | — |
| Example 19 | Specific Polymer Compound (3) | (A-1) | Formula (3) |
| Example 20 | Specific Polymer Compound (4) | (A-1) | Formula (3) |
| Example 21 | Specific Polymer Compound (5) | (A-1) | Formula (3) |
| Example 22 | Specific Polymer Compound (6) | (A-1) | Formula (3) |
| Example 23 | Specific Polymer Compound (7) | (A-3) | Formula (4) |
| Example 24 | Specific Polymer Compound (8) | (A-4) | Formula (5) |
| Comparative Example 1 | Comparative Polymer Compound (1) | — | — |
| Comparative Example 2 | Comparative Polymer Compound (2) | — | — |
| Comparative Example 3 | Comparative Polymer Compound (3) | — | — |
| Comparative Example 4 | Comparative Polymer Compound (4) | — | — |
| Comparative Example 5 | Comparative Polymer Compound (3) | — | — |
| Comparative Example 6 | Specific Polymer Compound (3) | (A-1) | Formula (3) |
| Comparative Example 7 | Specific Polymer Compound (3) | (A-1) | Formula (3) |

| First table | Low Molecular Weight Compound Type |
|---|---|
| Example 1 | Specific Low Molecular Weight Compound (1) |
| Example 2 | Specific Low Molecular Weight Compound (1) |
| Example 3 | Specific Low Molecular Weight Compound (1) |

TABLE 1-continued

| | | |
|---|---|---|
| Example 4 | | Specific Low Molecular Weight Compound (1) |
| Example 5 | | Specific Low Molecular Weight Compound (1) |
| Example 6 | | Specific Low Molecular Weight Compound (1) |
| Example 7 | | Specific Low Molecular Weight Compound (1) |
| Example 8 | | Specific Low Molecular Weight Compound (1) |
| Example 9 | | Specific Low Molecular Weight Compound (2) |
| Example 10 | | Specific Low Molecular Weight Compound (2) |
| Example 11 | | Specific Low Molecular Weight Compound (2) |
| Example 12 | | Specific Low Molecular Weight Compound (2) |
| Example 13 | | Specific Low Molecular Weight Compound (2) |
| Example 14 | | Specific Low Molecular Weight Compound (2) |
| Example 15 | | Specific Low Molecular Weight Compound (2) |
| Example 16 | | Specific Low Molecular Weight Compound (2) |
| Example 17 | | Specific Low Molecular Weight Compound (3) |
| Example 18 | | Specific Low Molecular Weight Compound (3) |
| Example 19 | | Specific Low Molecular Weight Compound (3) |
| Example 20 | | Specific Low Molecular Weight Compound (3) |
| Example 21 | | Specific Low Molecular Weight Compound (3) |
| Example 22 | | Specific Low Molecular Weight Compound (3) |
| Example 23 | | Specific Low Molecular Weight Compound (3) |
| Example 24 | | Specific Low Molecular Weight Compound (3) |
| Comparative Example 1 | | Specific Low Molecular Weight Compound (2) |
| Comparative Example 2 | | Specific Low Molecular Weight Compound (2) |
| Comparative Example 3 | | Specific Low Molecular Weight Compound (2) |
| Comparative Example 4 | | Specific Low Molecular Weight Compound (2) |
| Comparative Example 5 | | Specific Low Molecular Weight Compound (3) |
| Comparative Example 6 | | Comparative Low Molecular Weight Compound |
| Comparative Example 7 | | TIPS-PEN |

| | Evaluation result | | | |
|---|---|---|---|---|
| First table | Mobility | Threshold | Hysteresis | Heat resistance |
| Example 1 | A | A | A | A |
| Example 2 | A | A | A | A |
| Example 3 | S | A | A | A |
| Example 4 | S | A | A | A |
| Example 5 | S | A | A | A |
| Example 6 | S | A | A | A |
| Example 7 | AA | A | A | A |
| Example 8 | AA | A | A | A |
| Example 9 | A | S | S | S |
| Example 10 | A | S | S | S |
| Example 11 | S | S | S | S |
| Example 12 | S | S | S | S |
| Example 13 | S | S | S | S |
| Example 14 | S | S | S | S |
| Example 15 | AA | S | S | S |
| Example 16 | AA | S | S | S |
| Example 17 | A | A | A | S |
| Example 18 | A | A | A | S |
| Example 19 | S | A | A | S |
| Example 20 | S | A | A | S |
| Example 21 | S | A | A | S |
| Example 22 | S | A | A | S |
| Example 23 | AA | A | A | S |
| Example 24 | AA | A | A | S |
| Comparative Example 1 | A | B | B | B |
| Comparative Example 2 | B | B | B | B |
| Comparative Example 3 | A | B | B | B |
| Comparative Example 4 | B | B | B | B |
| Comparative Example 5 | S | B | B | B |
| Comparative Example 6 | B | B | B | B |
| Comparative Example 7 | B | B | B | B |

As presented in the first table, it was exhibited that the OTFTs in the examples have excellent hysteresis characteristics while high carrier mobility was maintained. It was exhibited that the OTFTs of the examples also had excellent threshold voltages and excellent heat resistance.

From the comparison of Examples 1 to 8, it was exhibited that the OTFTs (Examples 3 to 8) manufactured by using the specific polymer compounds corresponding to Formulae (3) to (5) had better carrier mobility. Particularly, the OTFTs (Examples 3 to 6) manufactured by using the specific polymer compound corresponding to Formula (3) (more specifically, Formula (6)) had more excellent carrier mobility.

From the comparison of Examples 9 to 16 and the comparison of Examples 17 to 24, the same tendency as in the comparison of Example 1 to 8 was exhibited.

From the comparison of Examples 1 to 8, Examples 9 to 16, and Examples 17 to 24, it was exhibited that the OTFTs (Examples 9 to 16: Specific Low Molecular Weight Compound (2), and Examples 17 to 24: Specific Low Molecular Weight Compound (3)) manufactured by using the specific low molecular weight compound corresponding to Formula (2B) had more excellent heat resistance. With respect to A1, A2, A3, B1, and C1 of Formula (2B), in a case where a specific low molecular weight compound (Examples 9 to 16: Specific Low Molecular Weight Compound (2)) in which three or four rings were thiophene rings, and the linking number between thiophene rings is 2 is used, it was exhibited that the threshold voltage and the hysteresis became more excellent.

From the comparison of Examples 1 to 8, Examples 9 to 16, and Examples 17 to 24, it was exhibited that the OTFTs (Examples 9 to 16: Specific Low Molecular Weight Compound (2)) manufactured by using the specific low molecular weight compound having the partial structure represented by Formula (2A) had more excellent threshold voltage and more excellent hysteresis.

Meanwhile, since the OTFTs in the comparative examples were not manufactured by using the specific low molecular weight compound or the specific polymer compound, and thus it was not able to obtain the desired performance.

Examples 25 to 27

OTFTs were manufactured in the same manner as in Example 13 except for using Polymer Compound (5) and Low Molecular Weight Compound (2) in the amount presented in the second table and using the organic semiconductor composition dissolved in 2 mL of chlorobenzene (Examples 25 to 27), and the carrier mobility was calculated in the above method.

Each proportion ((carrier mobility in Examples 25 to 27)/(carrier mobility of Example 13)) of the carrier mobility of Examples 25 to 27 with respect to the carrier mobility of the OTFT of Example 13 was obtained.

Evaluation results are as presented in the second table.

TABLE 2

| Second table | Usage amount of Specific Polymer Compound (5) | Usage amount of Specific Low Molecular Weight Compound (2) | Proportion of mobility with respect to Example 13 |
|---|---|---|---|
| Example 25 | 4 mg | 2 mg | 1.2 |
| Example 26 | 4 mg | 1 mg | 1.3 |
| Example 27 | 4 mg | 0.25 mg | 1.5 |
| Example 28 | 4 mg | 0.1 mg | 1.1 |

As presented in the second table, in a case where the content of the specific low molecular weight compound was 50 parts by mass or less with respect to 100 parts by mass of the specific polymer compound (Examples 25 to 28), the mobility became more excellent.

With respect to the OTFTs of Examples 25 to 28, the evaluation relating to the threshold voltage, the hysteresis, and the heat resistance was performed, and results thereof were the same as in Example 13.

EXPLANATION OF REFERENCES

- 10: substrate
- 20: gate electrode
- 30: gate insulating film
- 40: source electrode
- 42: drain electrode
- 50: organic semiconductor film
- 60: sealing layer
- 100, 200: organic thin film transistor

What is claimed is:

1. An organic semiconductor composition comprising:

a compound X having a molecular weight of 2,000 or greater and having a repeating unit represented by Formula (1); and a compound Y represented by Formula (2B), $$\text{---}(D\text{-}A)\text{---} \quad (1)$$

A in Formula (1) is a group having at least one structure selected from the group consisting of structures represented by Formulae (A-1) to (A-9), as a partial structure, and D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure,

(A-1)

(A-2)

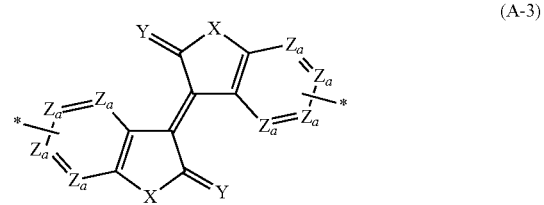

(A-3)

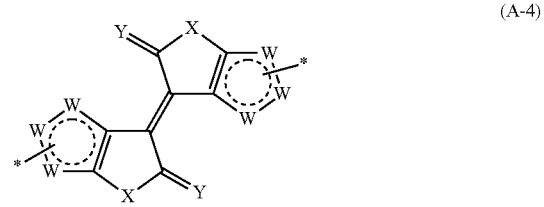

(A-4)

(A-5)

-continued

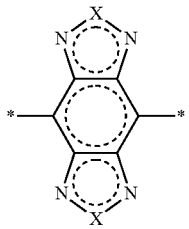
(A-6)

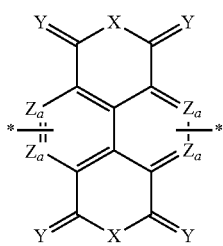
(A-7)

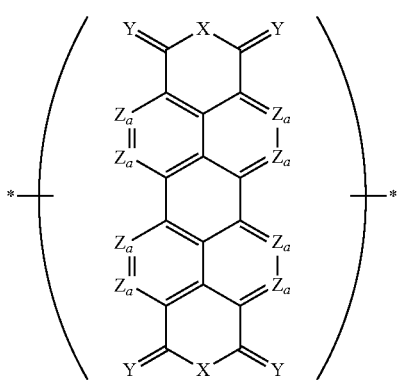
(A-8)

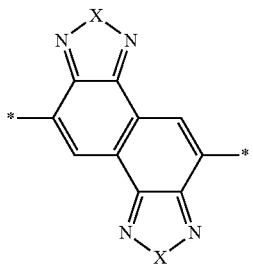
(A-9)

in Formulae (A-1) to (A-9), X's each independently represent an O atom, a S atom, a Se atom, or $NR^{A1}$, Y's each independently represent an O atom or a S atom, $Z_a$'s each independently represent $CR^{A2}$ or a N atom, W's each independently represent $C(R^{A2})_2$, $NR^{A1}$, a N atom, $CR^{A2}$, an O atom, a S atom, or a Se atom, $R^{A1}$'s each independently represent an alkyl group that may contain at least one of —O—, —S—, or —$NR^{A3}$—, a monovalent group represented by Formula (1-1), or a bonding site to another structure, and, when $R^{A1}$ is a monovalent group represented by Formula (1-1), * in Formula (1-1) represents a bonding position with N in $NR^{A1}$, $R^{A2}$'s each independently represent a hydrogen atom, a halogen atom, an alkyl group that may contain at least one of —O—, —S—, or —$NR^{A3}$—, or a bonding site to another structure, $R^{A3}$'s each independently represent a hydrogen atom or a substituent, and

*'s in (A-1) to (A-9) each independently represent a bonding site to another structure,

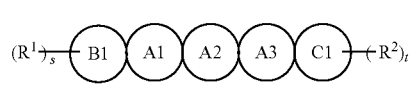
(1-1)

in Formula (1-1), Ar represents an aromatic heterocyclic group or an aromatic hydrocarbon group having 5 to 18 carbon atoms, $L_a$ represents an alkylene group having 1 to 20 carbon atoms that may include at least one of —O—, —S—, or —$NR^{1S}$—, $L_b$ represents an alkyl group having 1 to 100 carbon atoms that may include at least one of —O—, —S—, or —$NR^{2S}$—, $R^{1S}$ and $R^{2S}$ each independently represent a hydrogen atom or a substituent, l represents an integer of 1 to 5, and in a case where l is 2 or greater, a plurality of $L_b$'s may be identical to as or different from each other, and

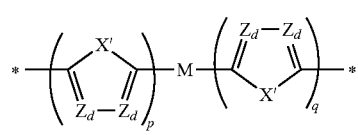
(2B)

in Formula (2B), A1 represents a thiophene ring, A2 represents a benzene ring, A3 represents a thiophene ring, B1 represents a thiophene ring, and C1 represents a thiophene ring, and adjacent rings are fused with each other, $R^1$ and $R^2$ each independently represent a saturated hydrocarbon group, and s and t each independently represent an integer of 1 to 3.

2. The organic semiconductor composition according to claim 1, wherein D in Formula (1) is a structure represented by Formula (D-1), $$*\left(\begin{array}{c}X''\\Z_d-Z_d\\Z_d-Z_d\end{array}\right)_p-M-\left(\begin{array}{c}Z_d-Z_d\\X''\end{array}\right)_q*$$
(D-1)

in Formula (D-1), X"s each independently represent an O atom, a S atom, a Se atom, or $NR^{D1}$, and $R^{D1}$'s each independently represent a monovalent organic group that may be the monovalent group represented by Formula (1-1), $Z_d$'s each independently represent a N atom or $CR^{D2}$, and $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may include at least one of —O—, —S—, or —$NR^{D3}$— or the monovalent group represented by Formula (1-1), and $R^{D3}$'s each independently represent a hydrogen atom or a substituent, p and q each independently represent an integer of 0 to 4, and in a case where p+q is 0, M includes a divalent aromatic heterocyclic group having at least one of a N atom, an O atom, a S atom, or a Se atom in a ring structure or a divalent aromatic hydrocarbon group consisting of a fused ring structure having two or more rings, as a partial structure, and

*'s each independently represent a bonding site to another structure.

3. The organic semiconductor composition according to claim 1,
wherein the repeating unit represented by Formula (1) is a repeating unit represented by any one of Formulae (3) to (5),

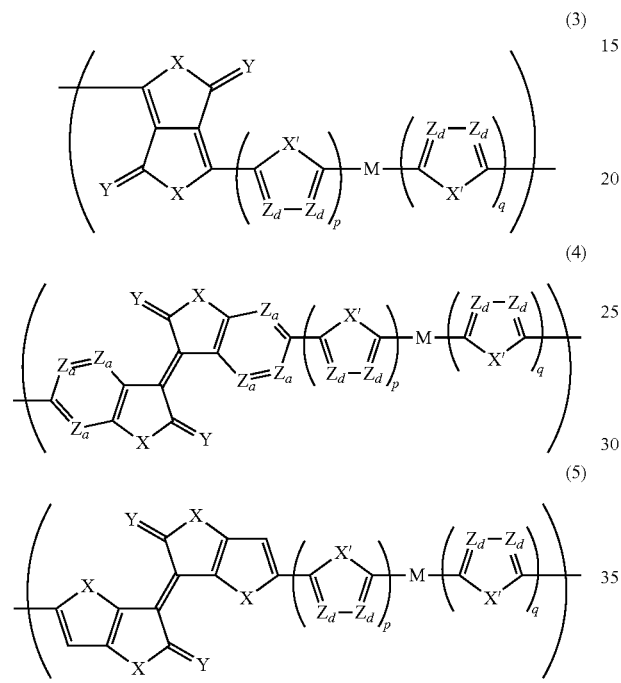

in Formulae (3) to (5), X's each independently represent an O atom, a S atom, a Se atom, or $NR^{41}$, $R^{41}$'s each independently represent an alkyl group that may contain at least one of —O—, —S—, or —$NR^{43}$—, the monovalent group represented by Formula (1-1), or a bonding site to another structure, Y's each independently represent an O atom or a S atom, $Z_a$'s each independently represent $CR^{42}$ or a N atom, and $R^{42}$'s each independently represent a hydrogen atom, a halogen atom, an alkyl group that may contain at least one of —O—, —S—, or —$NR^{43}$—, or a bonding site to another structure, $R^{43}$'s each independently represent a hydrogen atom or a substituent, X"'s each independently represent O, S, Se, or $NR^{D1}$, and $R^{D1}$'s each independently represent a monovalent organic group that may be the monovalent group represented by Formula (1-1), $Z_d$'s each independently represent N or $CR^{D2}$, and $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may include at least one of —O—, —S—, or —$NR^{D3}$— or the monovalent group represented by Formula (1-1), and $R^{D3}$'s each independently represent a hydrogen atom or a substituent, and p and q each independently represent an integer of 0 to 4, and in a case where p+q is 0, M includes a divalent aromatic heterocyclic group having at least one of a N atom, an O atom, a S atom, or a Se atom in a ring structure or a divalent aromatic hydrocarbon group consisting of a fused ring structure having two or more rings, as a partial structure.

4. The organic semiconductor composition according to claim 1,
wherein the repeating unit represented by Formula (1) is a repeating unit represented by Formula (6),

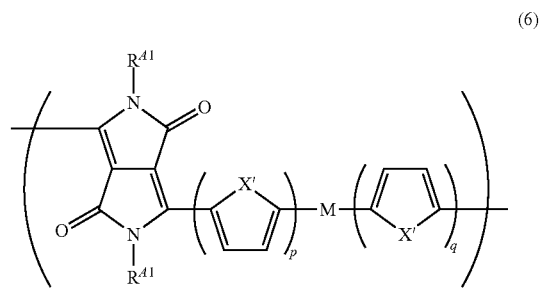

in Formula (6), $R^{41}$'s each independently represent an alkyl group that may contain at least one of —O—, —S—, or —$NR^{43}$—, the monovalent group represented by Formula (1-1), or a bonding site to another structure, and $R^{43}$'s each independently represent a hydrogen atom or a substituent, X"'s each independently represent O, S, Se, or $NR^{D1}$, and $R^{D1}$'s each independently represent a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may include at least one of —O—, —S—, or —$NR^{D3}$— or the monovalent group represented by Formula (1-1), and $R^{D3}$'s each independently represent a hydrogen atom or a substituent, and p and q each independently represent an integer of 0 to 4, and in a case where p+q is 0, M includes a divalent aromatic heterocyclic group having at least one of a N atom, an O atom, a S atom, or a Se atom in a ring structure or a divalent aromatic hydrocarbon group consisting of a fused ring structure having two or more rings, as a partial structure.

5. The organic semiconductor composition according to claim 1,
wherein the content of the compound Y is 100 parts by mass or less with respect to 100 parts by mass of the compound X.

6. An organic semiconductor film comprising the organic semiconductor composition according to claim 1.

7. An organic thin film transistor comprising:
the organic semiconductor film according to claim 6.

8. A method of manufacturing an organic thin film transistor, comprising:
a step of applying the organic semiconductor composition according to claim 1 on a substrate to form an organic semiconductor film.

\* \* \* \* \*